(12) United States Patent
Kunitake et al.

(10) Patent No.: US 12,142,693 B2
(45) Date of Patent: Nov. 12, 2024

(54) SEMICONDUCTOR DEVICE

(71) Applicant: Semiconductor Energy Laboratory Co., Ltd., Kanagawa-ken (JP)

(72) Inventors: Hitoshi Kunitake, Kanagawa (JP); Yuichi Yanagisawa, Kanagawa (JP); Shota Mizukami, Hokkai-do (JP); Kazuki Tsuda, Kanagawa (JP); Haruyuki Baba, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 419 days.

(21) Appl. No.: 17/642,346

(22) PCT Filed: Sep. 7, 2020

(86) PCT No.: PCT/IB2020/058299
§ 371 (c)(1),
(2) Date: Mar. 11, 2022

(87) PCT Pub. No.: WO2021/053450
PCT Pub. Date: Mar. 25, 2021

(65) Prior Publication Data
US 2022/0302312 A1  Sep. 22, 2022

(30) Foreign Application Priority Data
Sep. 20, 2019 (JP) .................. 2019-171946

(51) Int. Cl.
*H01L 29/786* (2006.01)
(52) U.S. Cl.
CPC .... *H01L 29/7869* (2013.01); *H01L 29/78618* (2013.01)
(58) Field of Classification Search
None
See application file for complete search history.

(56) References Cited

U.S. PATENT DOCUMENTS 8,158,975 B2  4/2012  Akimoto
8,313,980 B2  11/2012  Akimoto
(Continued)

FOREIGN PATENT DOCUMENTS

CN   101728433 A   6/2010
CN   107980178 A   5/2018
(Continued)

OTHER PUBLICATIONS

International Search Report (Application No. PCT/IB2020/058299) Dated Nov. 24, 2020.
(Continued)

*Primary Examiner* — Scott B Geyer
(74) *Attorney, Agent, or Firm* — Husch Blackwell LLP

(57) ABSTRACT

A semiconductor device that can be miniaturized or highly integrated is provided. The semiconductor device includes a first insulator; a first oxide over the first insulator; a second oxide over the first oxide; a first conductor, a second conductor, a third oxide, a fourth oxide, and a second insulator over the second oxide; a third insulator over the first conductor, the second conductor, the third oxide, and the fourth oxide; a fourth insulator over the second insulator; and a third conductor over the fourth insulator. The second insulator is positioned between the first conductor and the second conductor. The third oxide is positioned between the first conductor and the second insulator. The fourth oxide is positioned between the second conductor and the second insulator. The thickness of the third oxide between the first conductor and the second insulator is greater than or equal to 3 nm and less than or equal to 8 nm. The thickness of the fourth oxide between the second conductor and the second insulator is greater than or equal to 3 nm and less than or equal to 8 nm.

11 Claims, 30 Drawing Sheets

(56) References Cited

U.S. PATENT DOCUMENTS

| | | |
|---|---|---|
| 8,455,868 B2 | 6/2013 | Yamazaki et al. |
| 9,773,919 B2 | 9/2017 | Sasagawa et al. |
| 9,935,203 B2 | 4/2018 | Sasagawa et al. |
| 11,177,792 B2 | 11/2021 | Koyama |
| 2010/0090217 A1 | 4/2010 | Akimoto |
| 2013/0045568 A1 | 2/2013 | Akimoto |
| 2017/0062619 A1 | 3/2017 | Sasagawa et al. |

FOREIGN PATENT DOCUMENTS

| | | |
|---|---|---|
| JP | 2010-114432 A | 5/2010 |
| JP | 2011-151383 A | 8/2011 |
| JP | 2012-257187 A | 12/2012 |
| JP | 2017-045989 A | 3/2017 |
| KR | 2010-0040677 A | 4/2010 |
| KR | 2018-0042280 A | 4/2018 |
| TW | 201030981 | 8/2010 |
| TW | 201724515 | 7/2017 |
| WO | WO 2016/166635 A1 | 10/2016 |
| WO | WO 2017/033102 A1 | 3/2017 |
| WO | WO 2021/019334 A1 | 2/2021 |

OTHER PUBLICATIONS

Written Opinion (Application No. PCT/IB2020/058299) Dated Nov. 24, 2020.

FIG. 4A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 4B
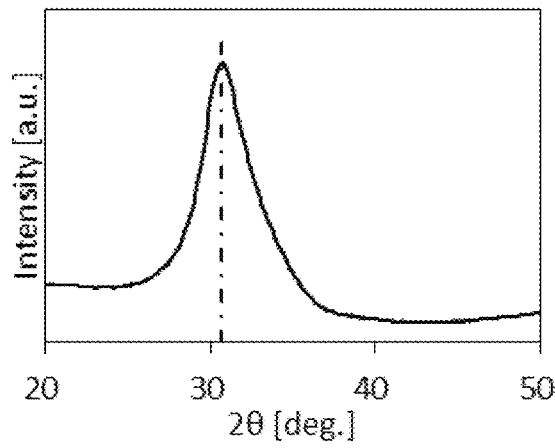
FIG. 4C
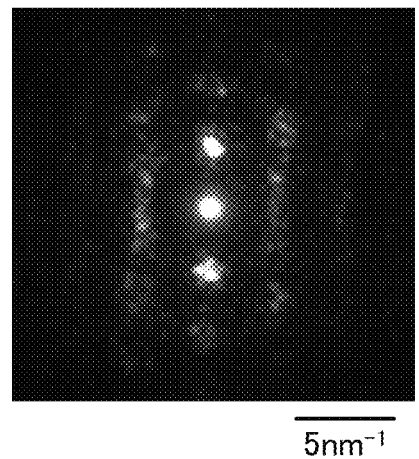

1471

1472

1473

1474

1475

1476

1477

1478

FIG. 29A
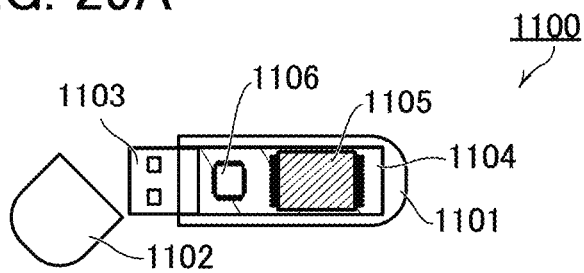
FIG. 29B  FIG. 29C
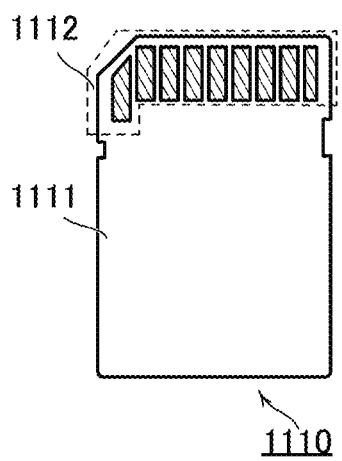 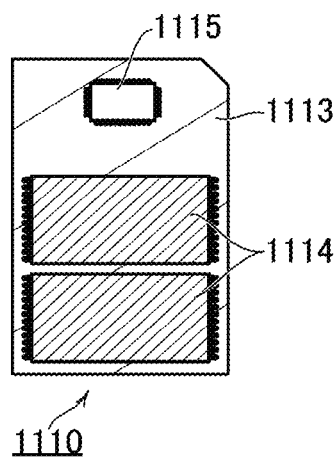
FIG. 29D  FIG. 29E
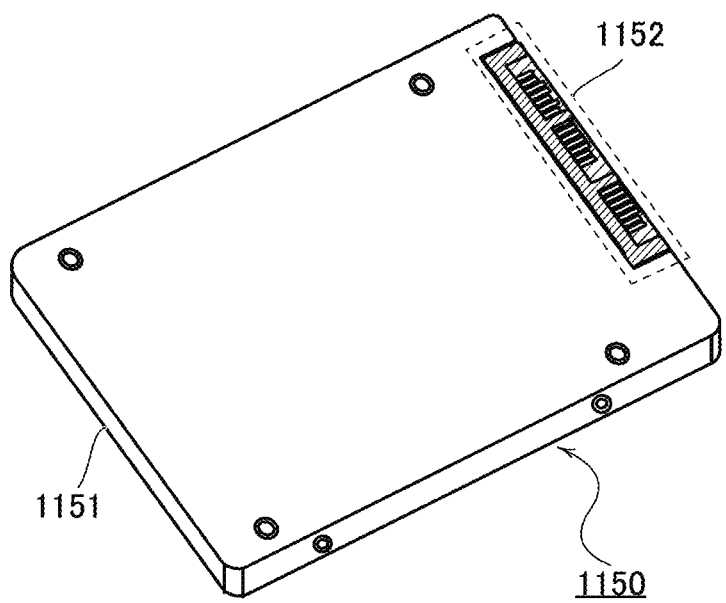 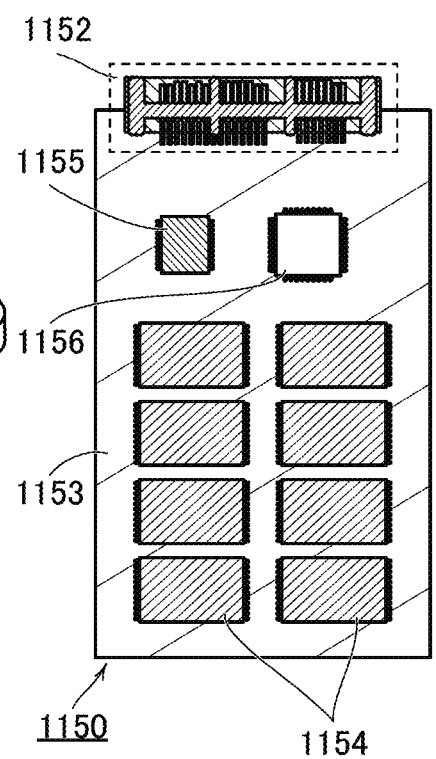

SEMICONDUCTOR DEVICE

This application is a 371 of international application PCT/IB2020/058299 filed on Sep. 7, 2020 which is incorporated herein by reference.

TECHNICAL FIELD

One embodiment of the present invention relates to a transistor, a semiconductor device, and an electronic appliances. Another embodiment of the present invention relates to a method for manufacturing a transistor and a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (e.g., a liquid crystal display device and a light-emitting display device), a projection device, a lighting device, an electro-optical device, a power storage device, a storage device, a semiconductor circuit, an imaging device, an electronic appliance, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and mainly used for an LSI, a CPU, or a memory. A CPU is an aggregation of semiconductor elements each provided with an electrode that is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic appliances.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, a storage device that can retain stored contents for a long time by utilizing a characteristic of a low leakage current of the transistor using an oxide semiconductor is disclosed, for example (see Patent Document 2).

In recent years, demand for an integrated circuit with higher density has risen with reductions in size and weight of electronic appliances. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

In view of the foregoing problem, an object of one embodiment of the present invention is to provide a semiconductor device with a small variation in transistor characteristics. Another object of one embodiment of the present invention is to provide a highly reliable semiconductor device. Another object of one embodiment of the present invention is to provide a semiconductor device with favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not need to achieve all these objects. Other objects will be apparent from and can be derived from the description of the specification, the drawings, the claims, and the like.

Means for Solving the Problems

One embodiment of the present invention is a semiconductor device that includes a first insulator; a first oxide over the first insulator; a second oxide over the first oxide; a first conductor, a second conductor, a third oxide, a fourth oxide, and a second insulator over the second oxide; a third insulator over the first conductor, the second conductor, the third oxide, and the fourth oxide; a fourth insulator over the second insulator; and a third conductor over the fourth insulator. The second insulator is positioned between the first conductor and the second conductor, the third oxide is positioned between the first conductor and the second insulator, and the fourth oxide is positioned between the second conductor and the second insulator. The second oxide includes a first region, a second region, a third region, a fourth region, and a fifth region. The first region includes a region in contact with the first conductor, the second region includes a region in contact with the third oxide, the third region includes a region overlapped by the third conductor, the fourth region includes a region in contact with the fourth oxide, and the fifth region includes a region in contact with the second conductor. The length of the second region between the first region and the third region is greater than or equal to 3 nm and less than or equal to 8 nm, the length of the fourth region between the third region and the fifth region is greater than or equal to 3 nm and less than or equal to 8 nm, and the length of the third region between the second region and the fourth region is greater than or equal to 5 nm and less than or equal to 40 nm. The carrier concentrations of the second region and the fourth region are each higher than the carrier concentration of the third region, and the carrier concentrations of the first region and the fifth region are respectively higher than the carrier concentrations of the second region and the fourth region.

Another embodiment of the present invention is a semiconductor device that includes a first insulator; a first oxide over the first insulator; a second oxide over the first oxide; a first conductor, a second conductor, a third oxide, a fourth oxide, and a second insulator over the second oxide; a third insulator over the first conductor, the second conductor, the third oxide, and the fourth oxide; a fourth insulator over the second insulator; and a third conductor over the fourth insulator. The second insulator is positioned between the first conductor and the second conductor, the third oxide is positioned between the first conductor and the second insulator, and the fourth oxide is positioned between the second conductor and the second insulator. The thickness of the third oxide between the first conductor and the second insulator is greater than or equal to 3 nm and less than or equal to 8 nm, the thickness of the fourth oxide between the second conductor and the second insulator is greater than or equal to 3 nm and less than or equal to 8 nm, and the length of a bottom surface of the third conductor in a region overlapping the second oxide is greater than or equal to 5 nm and less than or equal to 40 nm.

In the above semiconductor device, the first conductor and the second conductor each preferably contain tantalum, and the third oxide and the fourth oxide each preferably contain tantalum and oxygen.

In the above semiconductor device, the second insulator preferably contains silicon and oxygen, and the fourth insulator preferably contains hafnium and oxygen.

In the above semiconductor device, the second oxide preferably contains indium, an element M (M is any one or more of gallium, aluminum, yttrium, and tin), and zinc.

In the above semiconductor device, the first oxide and the second oxide are preferably patterned into an island shape.

Effect of the Invention

According to one embodiment of the present invention, a semiconductor device with a small variation in transistor characteristics can be provided. According to another embodiment of the present invention, a highly reliable semiconductor device can be provided. According to another embodiment of the present invention, a semiconductor device with favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

Note that the description of these effects does not preclude the existence of other effects. One embodiment of the present invention does not need to have all these effects. Other effects will be apparent from and can be derived from the description of the specification, the drawings, the claims, and the like.

BRIEF DESCRIPTION OF THE DRAWINGS

FIG. 4A is a diagram showing the classification of crystal structures of IGZO. FIG. 4B is a diagram showing an XRD spectrum of a CAAC-IGZO film. FIG. 4C is an image showing a nanobeam electron diffraction pattern of a CAAC-IGZO film.

FIG. 29A to FIG. 29E are schematic diagrams of storage devices of one embodiment of the present invention.

MODE FOR CARRYING OUT THE INVENTION

Figure 1A:
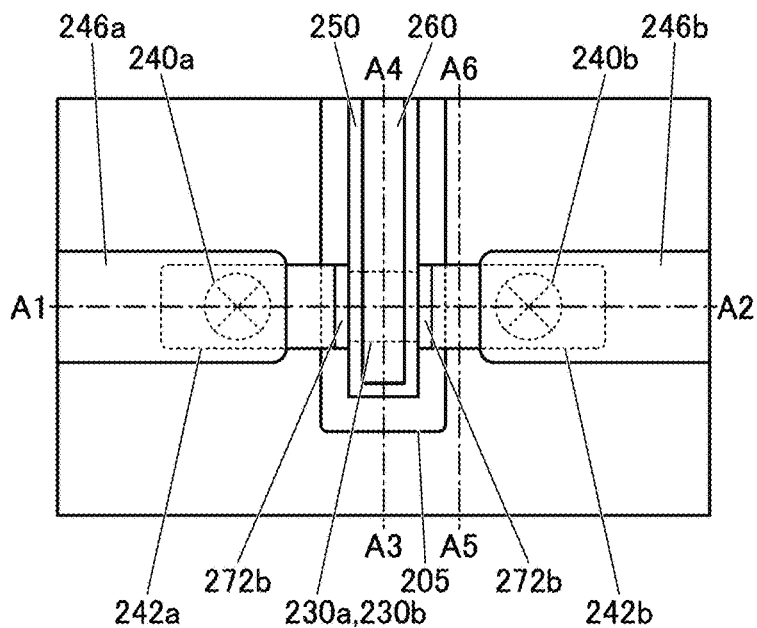
FIG. 1A is a top view of a semiconductor device of one embodiment of the present invention.

Hereinafter, embodiments will be described with reference to the drawings. Note that the embodiments can be implemented with many different modes and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not necessarily limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. In the drawings, the same portions or portions having similar functions are denoted by the same reference numerals in different drawings, and explanation thereof is not repeated in some cases. The same hatching pattern is used for portions having similar functions, and the portions are not denoted by specific reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in the drawings or the text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

A channel length refers to, for example, the distance between a source (a source region or a source electrode) and a drain (a drain region or a drain electrode) in a region where a semiconductor (or a portion where current flows in a semiconductor when a transistor is in an on state) and a gate electrode overlap each other, or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to the channel length direction in a region where a semiconductor (or a portion where current flows in a semiconductor when a transistor is in an on state) and a gate electrode overlap each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % is regarded as an impurity. When an impurity is contained, for example, the density of defect states in a semiconductor increases and the crystallinity decreases in some cases. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, in the case of an oxide semiconductor, oxygen vacancies (referred to as $V_O$ in some cases) are formed by the entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

In this embodiment, an example of a semiconductor device including a transistor 200 of one embodiment of the present invention and a method for manufacturing the semiconductor device will be described with reference to FIG. 1A to FIG. 16D.

<Structure Example of Semiconductor Device>

Figure 1C:
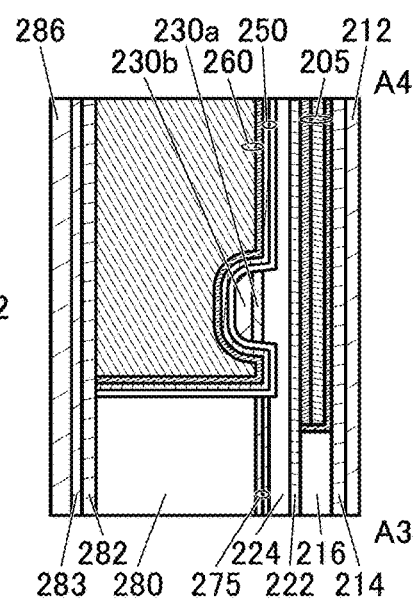
FIG. 1B to FIG. 1D are cross-sectional views of the semiconductor device of one embodiment of the present invention.
Figure 1B:
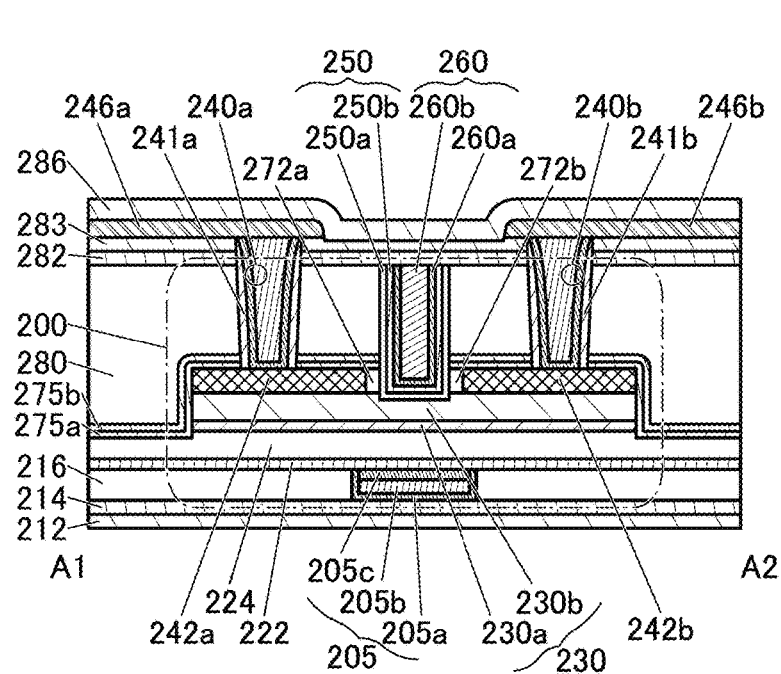
Figure 1D:
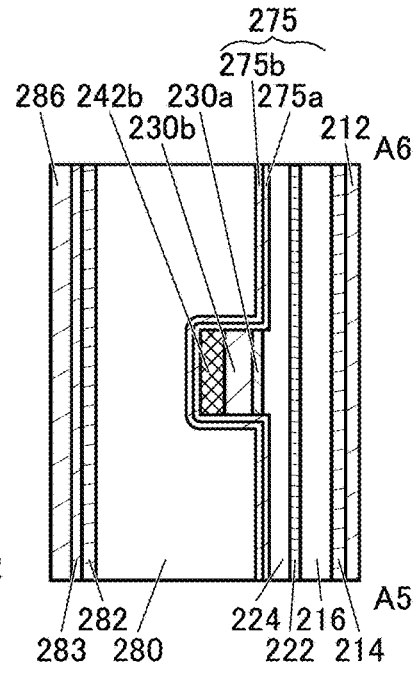

A structure of a semiconductor device including the transistor 200 is described with reference to FIG. 1A to FIG. 1D. FIG. 1A to FIG. 1D are a top view and cross-sectional views of the semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by dashed-dotted line A1-A2 in FIGS. 1A and 1s a cross-sectional view in the channel length direction of the transistor 200. FIG. 1C is a cross-sectional view of a portion indicated by dashed-dotted line A3-A4 in FIGS. 1A and 1s a cross-sectional view in the channel width direction of the transistor 200. FIG. 1D is a cross-sectional view of a portion indicated by dashed-dotted line A5-A6 in FIG. 1A. Note that for clarity of the drawing, some components are not illustrated in the top view of FIG. 1A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, and an insulator 283 over the insulator 282. The insulator 212, the insulator 214, the insulator 280, the insulator 282, and the insulator 283 function as interlayer films. The semiconductor device also includes a conductor 240a and a conductor 240b that are electrically connected to the transistor 200 and function as plugs. An insulator 241a is provided in contact with a side surface of the conductor 240a, and an insulator 241b is provided in contact with a side surface of the conductor 240b. A conductor 246a and a conductor 246b that are electrically connected to the conductor 240a and the conductor 240b, respectively, and function as wirings are provided over the insulator 283, the conductor 240a, and the conductor 240b. An insulator 286 is provided over the conductor 246a, the conductor 246b, and the insulator 283.

The insulator 241a is provided in contact with a side wall of an opening in the insulator 280, the insulator 282, the insulator 283, and the like; a first conductor of the conductor 240a is provided in contact with a side surface of the insulator 241a; and a second conductor of the conductor 240a is provided on the inner side thereof. The insulator 241b is provided in contact with a side wall of an opening in the insulator 280, the insulator 282, the insulator 283, and the like; a first conductor of the conductor 240b is provided in contact with a side surface of the insulator 241b; and a second conductor of the conductor 240b is provided on the inner side thereof. Here, top surfaces of the conductor 240a and the conductor 240b and a top surface of the insulator 283 in a region overlapped by the conductor 246a or the conductor 246b can be substantially level with each other. Note that although the transistor 200 has a structure in which the first conductor of the conductor 240a and the second conductor of the conductor 240a are stacked and the first conductor of the conductor 240b and the second conductor of the conductor 240b are stacked, the present invention is not limited thereto. For example, each of the conductor 240a and the conductor 240b may have a single-layer structure or a stacked-layer structure of three or more layers. In the case where a component has a stacked-layer structure, layers may be distinguished by ordinal numbers corresponding to the formation order.

[Transistor 200]

As illustrated in FIG. 1A to FIG. 1D, the transistor 200 includes an insulator 216 over the insulator 214; a conductor 205 (a conductor 205a, a conductor 205b, and a conductor 205c) provided to be embedded in the insulator 214 and/or the insulator 216; an insulator 222 over the insulator 216 and the conductor 205; an insulator 224 over the insulator 222; an oxide 230a over the insulator 224; an oxide 230b over the oxide 230a; a conductor 242a and a conductor 242b over the oxide 230b; an insulator 250 (an insulator 250a and an insulator 250b) over the oxide 230b; a conductor 260 (a conductor 260a and a conductor 260b) positioned over the insulator 250 and overlapping part of the oxide 230b; an oxide 272a positioned over the oxide 230b and between the conductor 242a and the insulator 250a; an oxide 272b positioned over the oxide 230b and between the conductor 242b and the insulator 250a; and an insulator 275 (an insulator 275a and an insulator 275b) provided over the insulator 224, the oxide 230a, the oxide 230b, the conductor 242a, the conductor 242b, the oxide 272a, and the oxide 272b. Here, as illustrated in FIG. 1B and FIG. 1C, a top surface of the conductor 260 is positioned to be substantially level with a top surface of the insulator 250 and a top surface of the insulator 280. The insulator 282 is in contact with each of the top surfaces of the conductor 260, the insulator 250, and the insulator 280.

Hereinafter, the oxide 230a and the oxide 230b might be collectively referred to as an oxide 230.

An opening reaching the oxide 230b is formed in the insulator 280 and the insulator 275. The insulator 250 and the conductor 260 are provided in the opening. In addition, in the channel length direction of the transistor 200, the conductor 260, the insulator 250, the oxide 272a, and the oxide 272b are provided between the conductor 242a and the conductor 242b. The insulator 250 includes a region in contact with a side surface of the conductor 260 and a region in contact with a bottom surface of the conductor 260. The oxide 272a includes a region in contact with a side surface of the conductor 242a, a region in contact with a side surface of the insulator 250a, and a region in contact with a top surface of the oxide 230b. The oxide 272b includes a region in contact with a side surface of the conductor 242b, a region in contact with a side surface of the insulator 250a, and a region in contact with a top surface of the oxide 230b.

The oxide 230 preferably includes the oxide 230a provided over the insulator 224 and the oxide 230b provided over the oxide 230a. When the oxide 230a is provided under the oxide 230b, impurities can be inhibited from diffusing into the oxide 230b from the components formed below the oxide 230a.

Although the oxide 230 in the transistor 200 has a structure in which two layers of the oxide 230a and the oxide 230b are stacked, the present invention is not limited thereto. For example, the oxide 230 may have a single-layer structure of the oxide 230b or a stacked-layer structure of three or more layers, or the oxide 230a and the oxide 230b may each have a stacked-layer structure.

The conductor 260 functions as a first gate (also referred to as a top gate) electrode, and the conductor 205 functions as a second gate (also referred to as a back gate) electrode. The insulator 222, the insulator 224, and the insulator 250 function as gate insulators. The conductor 242a functions as one of a source and a drain, and the conductor 242b functions as the other of the source and the drain. At least part of a region of the oxide 230 that is overlapped by the conductor 260 at least partly functions as a channel formation region.

Figure 2:
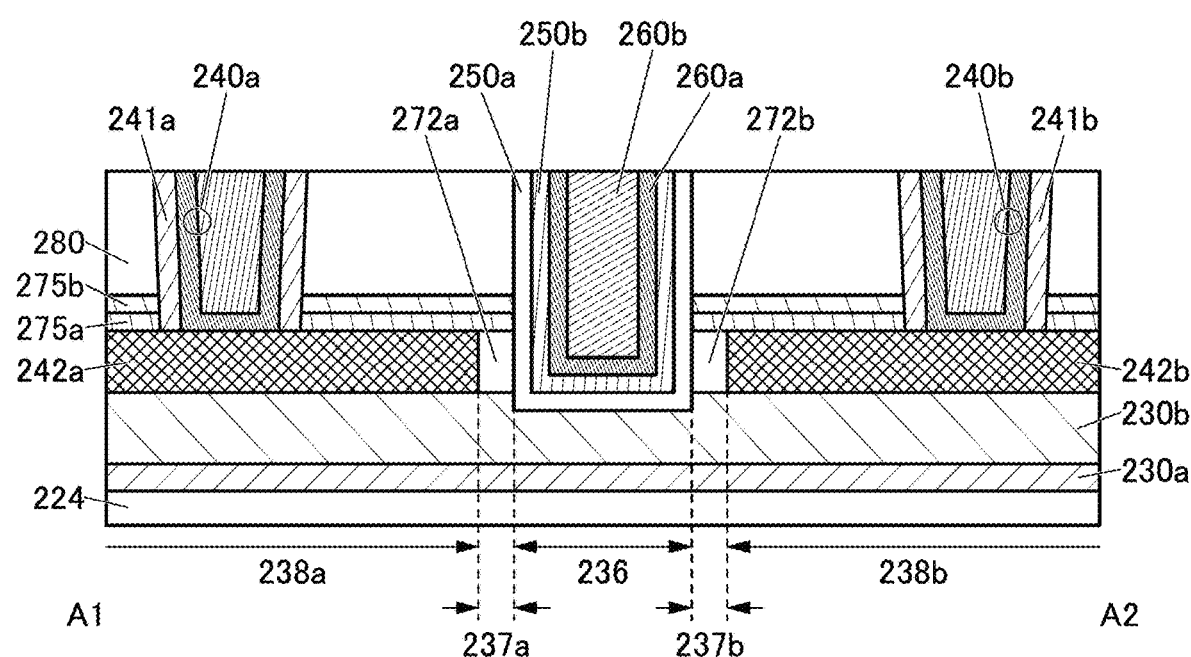
FIG. 2 is a cross-sectional view of a semiconductor device of one embodiment of the present invention.

FIG. 2 is an enlarged view of the vicinity of the channel formation region in FIG. 1B. As illustrated in FIG. 2, the oxide 230b includes a region 236 functioning as a channel formation region of the transistor 200 and a region 238a and a region 238b functioning as a source region and a drain region. At least part of the region 236 is overlapped by the conductor 260. In other words, the region 236 is provided in a region between the conductor 242a and the conductor 242b. The region 238a is overlapped by the conductor 242a and the region 238b is overlapped by the conductor 242b.

In the transistor 200, a metal oxide functioning as a semiconductor (hereinafter, also referred to as an oxide semiconductor) is preferably used as the oxide 230 (the oxide 230a and the oxide 230b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 230, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide, an In—Zn oxide, an indium oxide, or the like may be used as the oxide 230.

Here, the atomic ratio of In to the element M in the metal oxide used as the oxide 230b is preferably higher than the atomic ratio of In to the element M in the metal oxide used as the oxide 230a. The lower the atomic ratio of In to the element M is, the more likely the diffusion of impurities and oxygen is to be inhibited. Thus, when the oxide 230a is provided under the oxide 230b, impurities and oxygen can be inhibited from diffusing into the oxide 230b from the components formed below the oxide 230a.

The oxide 230b preferably has crystallinity. It is particularly preferable to use a CAAC-OS (c-axis aligned crystalline oxide semiconductor) as the oxide 230b.

The CAAC-OS is a metal oxide having a dense structure with high crystallinity and a small amount of impurities or defects (e.g., oxygen vacancies). In particular, after the formation of a metal oxide, heat treatment is performed at a temperature at which the metal oxide does not become a polycrystal (e.g., 400° C. or higher and 600° C. or lower), whereby a CAAC-OS having a dense structure with higher crystallinity can be obtained. As the density of the CAAC-OS is increased in such a manner, the diffusion of impurities or oxygen in the CAAC-OS can be further reduced.

A clear grain boundary is difficult to observe in the CAAC-OS; thus, it can be said that a reduction in electron mobility due to the grain boundary is unlikely to occur. Thus, a metal oxide including a CAAC-OS is physically stable. Therefore, the metal oxide including a CAAC-OS is resistant to heat and highly reliable.

A transistor using an oxide semiconductor is likely to have its electrical characteristics changed by impurities and oxygen vacancies in a channel formation region in the oxide semiconductor, which might affect the reliability. In some cases, hydrogen in the vicinity of an oxygen vacancy forms a defect that is an oxygen vacancy into which hydrogen enters (hereinafter sometimes referred to as $V_OH$), which generates an electron serving as a carrier. Therefore, when the channel formation region in the oxide semiconductor includes oxygen vacancies, the transistor is likely to have normally-on characteristics (characteristics with which, even when no voltage is applied to the gate electrode, the channel exists and current flows through the transistor). Therefore, impurities, oxygen vacancies, and $V_OH$ are preferably reduced as much as possible in the channel formation region in the oxide semiconductor. In other words, the carrier concentration is preferably reduced in the channel formation region in the oxide semiconductor, and the channel formation region is preferably i-type (intrinsic) or substantially i-type.

However, when the i-type or substantially i-type region extends to the source region or the drain region in the oxide semiconductor, the on-state current or field-effect mobility of the transistor 200 might be decreased, for example.

Hence, the region 236 functioning as the channel formation region in the oxide semiconductor is preferably i-type or substantially i-type with a low carrier concentration, whereas the region 238a and the region 238b functioning as the source region and the drain region are preferably n-type with a high carrier concentration.

Miniaturization of the transistor causes the distance between the source region and the drain region to be reduced, which might result in lowered source-drain withstand voltage of the transistor. In addition, the current density concentrates at the boundary between the region 236 and the region 238a or the region 238b, which might cause heat generation at the boundary between the channel and the source or the drain.

Thus, in one embodiment of the present invention, in the oxide 230b, a region 237a is preferably provided between the region 236 and the region 238a, and a region 237b is preferably provided between the region 236 and the region 238b.

The carrier concentration of the region 237a is preferably equal to or lower than that of the region 238a and equal to or higher than that of the region 236. The carrier concentration of the region 237b is preferably equal to or lower than that of the region 238b and equal to or higher than that of the region 236. In other words, the region 237a functions as an offset region between the region 236 and the region 238a, and the region 237b functions as an offset region between the region 236 and the region 238b.

Here, the gate length of a transistor is described. The gate length refers to the length of a gate electrode in a direction in which carriers move inside a channel formation region during operation of the transistor and to the width of a bottom surface of the gate electrode in a top view of the transistor. That is, the gate length of the transistor 200 in a cross-sectional view in the channel length direction is the width of the bottom surface of the conductor 260 in a region overlapping the oxide 230. In other words, the gate length corresponds to the width of the region 236. Note that in some cases, the gate electrode has a gently curved bottom surface or a tapered shape toward its bottom surface. The gate length in that case is sometimes larger than the width of the bottom surface of the gate electrode in the top view of the transistor.

Here, an effective channel length of a transistor is described. Note that the effective channel length refers to the distance between a source electrode and a drain electrode in a top view of the transistor. That is, the effective channel length of the transistor 200 in a cross-sectional view in the channel length direction is the distance between the conductor 242a and the conductor 242b. In other words, the effective channel length corresponds to the sum of the width of the region 237a, the width of the region 236, and the width of the region 237b. In the case where a side surface of the source electrode is inclined to a formation surface of the source electrode and a side surface of the drain electrode is inclined to a formation surface of the drain electrode, the effective channel length refers to the distance between a bottom portion of the side surface of the source electrode and a bottom portion of the side surface of the drain electrode in the top view of the transistor.

The region 237a and the region 237b are provided in the oxide 230b, whereby the effective channel length can be increased. Accordingly, the source-drain withstand voltage of the transistor can be improved, so that the transistor can be highly reliable. In addition, the current density at the boundary between the region 236 and the region 238a or the region 238b can be reduced and heat generation at the boundary between the channel and the source or the drain can be inhibited, so that the transistor and the semiconductor device can be highly reliable. Therefore, the transistor can have favorable electrical characteristics even when miniaturized.

In the cross-sectional view of the transistor 200 in the channel length direction, the width of each of the region 237a and the region 237b is typically greater than or equal to 1 nm and less than 10 nm, preferably greater than or equal to 3 nm and less than 8 nm. Note that the width of the region 237a in the cross-sectional view of the transistor 200 in the channel length direction can be rephrased as the length of the region 237a between the region 236 and the region 238a. Note also that the width of the region 237b in the cross-sectional view of the transistor 200 in the channel length direction can be rephrased as the length of the region 237b between the region 236 and the region 238b. In that case, even when the region 236 functioning as the channel formation region has a width of greater than or equal to 5 nm and less than or equal to 40 nm in the cross-sectional view of the transistor 200 in the channel length direction, favorable electrical characteristics can be obtained. Note that the width of the region 236 in the cross-sectional view of the transistor 200 in the channel length direction can be rephrased as the length of the region 236 between the region 237a and the region 237b.

The carrier concentration of the region 236 functioning as the channel formation region is preferably lower than $1 \times 10^{17}$ cm$^3$, further preferably lower than $1 \times 10^{16}$ cm$^{-3}$, still further preferably lower than $1 \times 10^{13}$ cm$^{-3}$, yet further preferably lower than $1 \times 10^{12}$ cm$^{-3}$. Note that the lower limit of the carrier concentration of the region 236 is not particularly limited and can be, for example, $1 \times 10^{-9}$ cm$^{-3}$.

The carrier concentrations of the region 238a and the region 238b functioning as the source region and the drain region are preferably higher than or equal to $1 \times 10^{17}$ cm$^3$ and lower than $1 \times 10^{21}$ cm$^3$, further preferably higher than or equal to $1 \times 10^{18}$ cm$^3$ and lower than $1 \times 10^{20}$ cm$^{-3}$.

Although depending on the carrier concentrations of the region 236, the region 238a, and the region 238b, the carrier concentrations of the region 237a and the region 237b are typically higher than or equal to $1 \times 10^{15}$ cm$^3$ and lower than or equal to $1 \times 10^{17}$ cm$^{-3}$, preferably higher than or equal to $5 \times 10^{15}$ cm$^{-3}$ and lower than or equal to $1 \times 10^{16}$ cm$^3$.

In order that the region 237a is provided in the oxide 230b, the oxide 272a is preferably provided between the conductor 242a and the insulator 250a. In that case, the region 237a includes a region in contact with the oxide 272a. Providing the oxide 272a enables oxygen contained in the insulator 280, the insulator 250a, and the like to be supplied to the region 237a through the oxide 272a. Thus, oxygen vacancies in the region 237a can be reduced and the carrier concentration of the region 237a can be reduced. The width of the oxide 272a in the cross-sectional view of the transistor in the channel length direction is preferably greater than or equal to 1 nm and less than 10 nm, further preferably greater than or equal to 3 nm and less than 8 nm. Note that the width of the oxide 272a in the cross-sectional view of the transistor in the channel length direction can be rephrased as the thickness of the oxide 272a between the conductor 242a and the insulator 250a.

Similarly, in order that the region 237b is provided in the oxide 230b, the oxide 272b is preferably provided between the conductor 242b and the insulator 250a. In that case, the region 237b includes a region in contact with the oxide 272b. Providing the oxide 272b enables oxygen contained in the insulator 280, the insulator 250a, and the like to be supplied to the region 237b through the oxide 272b. Thus, oxygen vacancies in the region 237b can be reduced and the carrier concentration of the region 237b can be reduced. The width of the oxide 272b in the cross-sectional view of the transistor in the channel length direction is preferably greater than or equal to 1 nm and less than 10 nm, further preferably greater than or equal to 3 nm and less than 8 nm. Note that the width of the oxide 272b in the cross-sectional view of the transistor in the channel length direction can be rephrased as the thickness of the oxide 272b between the conductor 242b and the insulator 250a.

By setting the widths of the oxide 272a and the oxide 272b as described above in the cross-sectional view of the transistor 200 in the channel length direction, favorable electrical characteristics can be obtained even when the gate length or the width of the region 236 is greater than or equal to 5 nm and less than or equal to 40 nm.

Side edges of the conductor 242a and the conductor 242b are sometimes oxidized to form the oxide 272a and the oxide 272b, respectively. Thus, the oxide 272a and the oxide 272b sometimes contain a metal contained in the conductor 242a and the conductor 242b, respectively. For example, in the case where a nitride containing tantalum is used as the conductor 242a and the conductor 242b, the oxide 272a and the oxide 272b each contain tantalum and oxygen.

The oxide 272a and the oxide 272b are also in contact with the insulator 250a. Thus, the oxide 272a and the oxide 272b sometimes contain an element contained in the insulator 250a in addition to the metal contained in the conductor 242a and the conductor 242b. For example, when silicon oxide, silicon oxynitride, or the like is used as the insulator 250a, the oxide 272a and the oxide 272b each contain tantalum, silicon, and oxygen in some cases.

The oxide 272a and the oxide 272b contains more oxygen than the conductor 242a and the conductor 242b, respectively and thus are presumed to have insulating properties. Thus, the oxide 272a and the oxide 272b can be referred to as a semi-insulator (SI) in some cases. The carrier concentrations of the region 237a and the region 237b are equal to or lower than those of the region 238a and the region 238b and equal to or higher than that of the region 236; thus, the region 237a and the region 237b can be referred to as SI or an SI region in some cases. When the region 236 is regarded as an I-type or substantially I-type region and the region 238a and the region 238b are regarded as an N-type or N$^+$-type region, the transistor 200 can be regarded as having an (N$^+$-SI-I-SI-N$^+$) structure.

Microwave treatment is preferably performed in an atmosphere containing oxygen in a state where the conductor 242a and the conductor 242b are provided over the oxide 230b. Here, the microwave treatment refers to, for example, treatment using an apparatus including a power source that generates high-density plasma with the use of a microwave.

The microwave treatment in an atmosphere containing oxygen can convert an oxygen gas into plasma using a microwave or a high-frequency wave such as RF and activate the oxygen plasma. At this time, the region 236, the region 237a, and the region 237b can be irradiated with the microwave or the high-frequency wave such as RF. The effect of the plasma, the microwave, and the like enables $V_OH$ in the region 236, the region 237a, and the region 237b to be divided, hydrogen to be removed from the region 236, the region 237a, and the region 237b, and oxygen vacancies to be filled with oxygen. In other words, the reaction "$V_OH \rightarrow H + V_O$" occurs in the region 236, the region 237a, and the region 237b, so that the hydrogen concentrations of the region 236, the region 237a, and the region 237b can be reduced. As a result, oxygen vacancies and $V_OH$ in the region 236, the region 237a, and the region 237b can be reduced to lower the carrier concentration.

In the microwave treatment in an atmosphere containing oxygen, the effect of the microwave, the high-frequency wave such as RF, the oxygen plasma, and the like is blocked by the conductor 242a and the conductor 242b and does not reach the region 238a and the region 238b. Furthermore, the effect of the oxygen plasma can be reduced by the insulator 275 and the insulator 280, which cover the oxide 230b, the conductor 242a, and the conductor 242b. This prevents a reduction of V$_O$H and supply of an excess amount of oxygen in the region 238a and the region 238b during the microwave treatment, so that the carrier concentration can be prevented from being lowered.

In the microwave treatment in an atmosphere containing oxygen, the effects of the microwave, the high-frequency wave such as RF, the oxygen plasma, and the like can be reduced by the oxide 272a, the oxide 272b, the insulator 275, and the insulator 280. Accordingly, the effects on the region 237a and the region 237b are weaker than those on the region 236 and stronger than that on the region 238a and the region 238b. Thus, the carrier concentrations of the region 237a and the region 237b due to the microwave treatment are lower than those of the region 238a and the region 238b and are not as low as that of the region 236.

In the above manner, oxygen vacancies and V$_O$H can be selectively removed from the region 236 in the oxide semiconductor, whereby the region 236 can be an i-type or substantially i-type region. The region 238a and the region 238b that function as the source region and the drain region can be inhibited from being supplied with an excess amount of oxygen, whereby the regions can remain n-type. Furthermore, the carrier concentrations of the region 237a and the region 237b can be equal to or lower than those of the region 238a and the region 238b and equal to or higher than that of the region 236. As a result, a change in the electrical characteristics of the transistor 200 can be inhibited, so that a variation in the electrical characteristics of the transistors 200 in the substrate plane can be inhibited.

As described above, according to one embodiment of the disclosed invention, a problem due to miniaturization can be resolved; as a result, the size of the transistor can be sufficiently reduced. By sufficiently reducing the size of the transistor, the area of a semiconductor device including the transistor is reduced, and the number of semiconductor devices obtained from one substrate is increased accordingly. Thus, manufacturing costs of the semiconductor device can be reduced. Since the semiconductor device is downsized, a semiconductor device with an equivalent size and improved functions can be obtained. Thus, miniaturization of a transistor including an oxide semiconductor can be achieved according to one embodiment of the disclosed invention, and various effects accompanied by the miniaturization can be obtained.

Note that although FIG. 2 illustrates an example in which the region 236, the region 237a, the region 237b, the region 238a, and the region 238b are formed in the oxide 230b, the present invention is not limited thereto. For example, the above regions may be formed not only in the oxide 230b but also in the oxide 230a.

Figure 3:
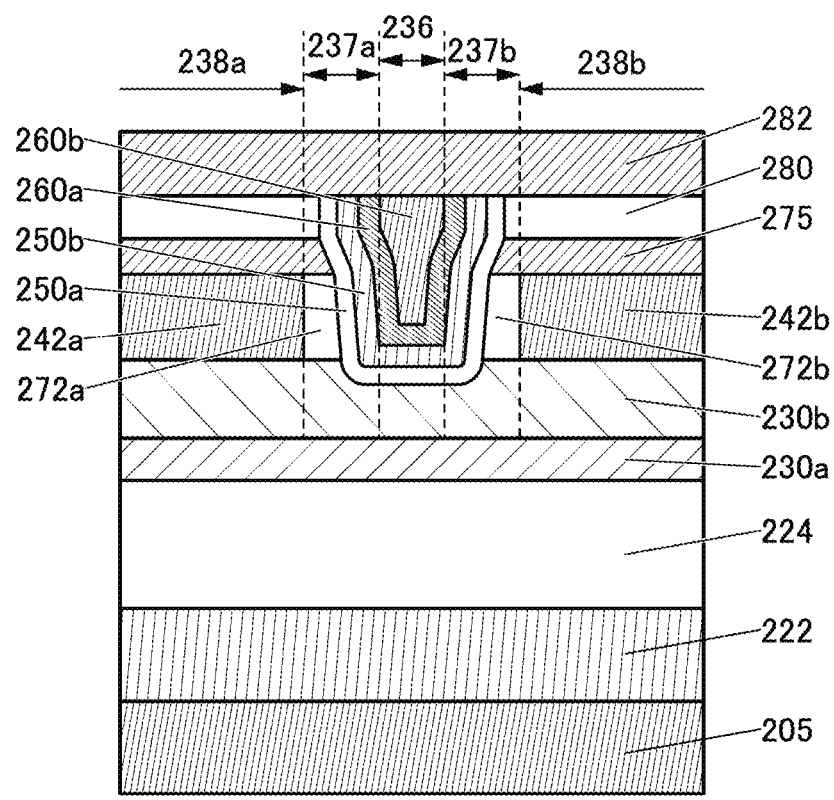
FIG. 3 is a cross-sectional view of a semiconductor device of one embodiment of the present invention.

Although the width of the region 236 is equal to the width of the insulator 250a in FIG. 2, this embodiment is not limited thereto. The width of the region 236 is smaller than the width of the insulator 250a in some cases, and the width of the region 236 is larger than the width of the insulator 250a in other cases. For example, as illustrated in FIG. 3, the width of the region 236 may be equal to the width of the bottom surface of the conductor 260.

In FIG. 2, the width of the region 237a is equal to the width of the oxide 272a. Note that this embodiment is not limited thereto. For example, the width of the region 237a might be smaller than the width of the oxide 272a or might be larger than the width of the oxide 272a. In the case where the region 237a has a region overlapped by the conductor 242a, the region 237a might include a region overlapped by the conductor 260. For example, as illustrated in FIG. 3, the width of the region 237a might be equal to the distance between the conductor 260 and the side surface of the conductor 242a facing the conductor 260. Note that the same can be applied to the width of the region 237b.

In the oxide 230, the boundaries between the regions are difficult to detect clearly in some cases. The concentrations of a metal element and impurity elements such as hydrogen and nitrogen, which are detected in each region, may be not only gradually changed between the regions, but also continuously changed in each region. That is, the region closer to the channel formation region preferably has a lower concentration of a metal element and impurity elements such as hydrogen and nitrogen.

The above structure enables a semiconductor device with a small variation in transistor characteristics to be provided. A highly reliable semiconductor device can be provided. A semiconductor device having favorable electrical characteristics can be provided. A semiconductor device that can be miniaturized or highly integrated can be provided.

In FIG. 1B and the like, a side surface of an opening in which the conductor 260 and the like are embedded is substantially perpendicular to the formation surface of the oxide 230b including a groove portion of the oxide 230b; however, this embodiment is not limited thereto. For example, the opening may have a U shape with a bottom portion having a gentle curve, as shown in FIG. 3. For example, the side surface of the opening may be inclined to the formation surface of the oxide 230b.

As illustrated in FIG. 1C, a curved surface may be provided between a side surface of the oxide 230b and a top surface of the oxide 230b in the cross-sectional view in the channel width direction of the transistor 200. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in the region overlapped by the conductor 242a or the conductor 242b or less than half of the length of the region not having the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230b with the insulator 250 and the conductor 260.

The oxide 230 preferably has a stacked-layer structure of a plurality of oxide layers with different chemical compositions. Specifically, the atomic ratio of the element M to a metal element that is a main component in the metal oxide used as the oxide 230a is preferably greater than the atomic ratio of the element M to a metal element that is a main component in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

The oxide 230b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can inhibit oxygen extraction from the oxide 230b even when heat treatment is performed; thus, the transistor 200 is stable with respect to high temperatures in the manufacturing process (i.e., thermal budget).

Here, the conduction band minimum gradually changes at a junction portion of the oxide 230a and the oxide 230b. In other words, the conduction band minimum at the junction portion of the oxide 230a and the oxide 230b continuously changes or is continuously connected. To achieve this, the density of defect states in a mixed layer formed at the interface between the oxide 230a and the oxide 230b is preferably decreased.

Specifically, when the oxide 230a and the oxide 230b contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, or indium oxide may be used as the oxide 230a.

Specifically, as the oxide 230a, a metal oxide with a composition In:M:Zn=1:3:4 [atomic ratio] or a composition in the neighborhood thereof, or In:M:Zn=1:1:0.5 [atomic ratio] or a composition in the neighborhood thereof is used. As the oxide 230b, a metal oxide with a composition of In:M:Zn=1:1:1 [atomic ratio] or a composition in the neighborhood thereof, or In:M:Zn=4:2:3 [atomic ratio] or a composition in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

In the transistor 200, at least part of the oxide 230 over the insulator 224 functions as a channel formation region. Note that in an SOI (Silicon On Insulator) structure, at least part of a silicon film over an insulating film functions as a channel formation region. Thus, the SOI structure can be regarded as a Semiconductor On Insulator structure in a broad sense. Thus, the transistor 200 can be regarded as having an SOI structure.

The oxide 230 over the insulator 224 is formed in an island shape. Thus, a plurality of transistors 200 can be provided over the same substrate. Therefore, one embodiment of the present invention enables an integrated structure to be formed.

At least one of the insulator 212, the insulator 214, the insulator 275, the insulator 282, the insulator 283, and the insulator 286 preferably functions as a barrier insulating film that inhibits the diffusion of impurities such as water and hydrogen into the transistor 200 from the substrate side or a portion above the transistor 200. Thus, it is preferable to use, for at least one of the insulator 212, the insulator 214, the insulator 275, the insulator 282, the insulator 283, and the insulator 286, an insulating material that has a function of inhibiting the diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms (an insulating material through which the impurities are less likely to pass). Alternatively, it is preferable to use an insulating material that has a function of inhibiting the diffusion of oxygen (e.g., at least one of an oxygen atom, an oxygen molecule, and the like) (an insulating material through which the oxygen is less likely to pass).

Note that in this specification, a barrier insulating film refers to an insulating film that has a barrier property. A barrier property in this specification means a function of inhibiting the diffusion of a targeted substance (also referred to as low permeability). Alternatively, a barrier property in this specification means a function of trapping and fixing (also referred to as gettering) a targeted substance.

As the insulator 212, the insulator 214, the insulator 275, the insulator 282, the insulator 283, and the insulator 286, an insulator that has a function of inhibiting the diffusion of oxygen and impurities such as water and hydrogen is preferably used; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used as the insulator 212, the insulator 283, and the insulator 286. For example, aluminum oxide or magnesium oxide, which has an excellent function of trapping and fixing hydrogen, is preferably used as the insulator 214, the insulator 275, and the insulator 282. Accordingly, impurities such as water and hydrogen can be inhibited from diffusing into the transistor 200 side from the substrate side through the insulator 212 and the insulator 214. Alternatively, impurities such as water and hydrogen can be inhibited from diffusing into the transistor 200 side from an interlayer insulating film and the like provided outside the insulator 286. Alternatively, oxygen contained in the insulator 224 and the like can be inhibited from diffusing into the substrate side through the insulator 212 and the insulator 214. Alternatively, oxygen contained in the insulator 280 and the like can be inhibited from diffusing into the components above the transistor 200 through the insulator 282 and the like. In this manner, the transistor 200 is preferably surrounded by the insulator 212, the insulator 214, the insulator 275, the insulator 282, the insulator 283, and the insulator 286 that have a function of inhibiting the diffusion of oxygen and impurities such as water and hydrogen.

Here, an oxide with an amorphous structure is preferably used as the insulator 212, the insulator 214, the insulator 275, the insulator 282, the insulator 283, and the insulator 286. For example, a metal oxide such as $AlO_x$ (x is a given number greater than 0) or $MgO_y$ (y is a given number greater than 0) is preferably used. In such a metal oxide with an amorphous structure, oxygen atoms have dangling bonds, and the metal oxide has a property of trapping or fixing hydrogen with the dangling bonds in some cases. When such a metal oxide with an amorphous structure is used as the component of the transistor 200 or provided around the transistor 200, hydrogen contained in the transistor 200 or hydrogen around the transistor 200 can be trapped or fixed. In particular, hydrogen contained in the channel formation region of the transistor 200 is preferably trapped or fixed. When the metal oxide with an amorphous structure is used as the component of the transistor 200 or provided around the transistor 200, the transistor 200 and the semiconductor device with favorable characteristics and high reliability can be manufactured.

Although the insulator 212, the insulator 214, the insulator 275, the insulator 282, the insulator 283, and the insulator 286 preferably have an amorphous structure, they may partly include a region with a polycrystalline structure. Alternatively, the insulator 212, the insulator 214, the insulator 275, the insulator 282, the insulator 283, and the insulator 286 may have a multilayer structure in which a layer with an amorphous structure and a layer with a polycrystalline structure are stacked. For example, a stacked-layer structure in which a layer with a polycrystalline structure is formed over a layer with an amorphous structure may be employed.

The insulator 212, the insulator 214, the insulator 275, the insulator 282, the insulator 283, and the insulator 286 can be formed by, for example, a sputtering method. Since a sputtering method does not need to use hydrogen as a deposition gas, the hydrogen concentrations of the insulator 212, the insulator 214, the insulator 275, the insulator 282, the insulator 283, and the insulator 286 can be reduced. The deposition method is not limited to a sputtering method; a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 212, the insulator 283, and the insulator 286 are preferably low in some cases. For example, by setting the resistivities of the insulator 212, the insulator 283, and the insulator 286 to approximately $1 \times 10^{13}$ Ωkm, the insulator 212, the insulator 283, and the insulator 286 can sometimes reduce charge up of the conductor 205, the conductor 242a, the conductor 242b, the conductor 260, the conductor 246a, or the conductor 246b in treatment using plasma or the like in the manufacturing process of a semiconductor device. The resistivities of the insulator 212, the insulator 283, and the insulator 286 are preferably higher than or equal to $1 \times 10^{10}$ Ωcm and lower than or equal to $1 \times 10^{15}$ Ωcm.

The insulator 216 and the insulator 280 preferably have a lower permittivity than the insulator 214. When a material with a low permittivity is used for an interlayer film, parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate as the insulator 216 and the insulator 280. In particular, silicon oxide and silicon oxynitride, which are thermally stable, are preferable. Materials such as silicon oxide, silicon oxynitride, and porous silicon oxide, in each of which a region containing oxygen released by heating can be easily formed, are particularly preferable.

The conductor 205 is provided to be overlapped by the oxide 230 and the conductor 260. Here, the conductor 205 is preferably provided to be embedded in an opening formed in the insulator 214 and/or the insulator 216.

The conductor 205 includes the conductor 205a, the conductor 205b, and the conductor 205c. The conductor 205a is provided in contact with a bottom surface and a side wall of the opening. The conductor 205b is provided so as to be embedded in a recessed portion formed in the conductor 205a. Here, the level of a top surface of the conductor 205b is lower than the levels of a top surface of the conductor 205a and a top surface of the insulator 216. The conductor 205c is provided in contact with the top surface of the conductor 205b and a side surface of the conductor 205a. Here, a top surface of the conductor 205c is substantially level with the top surface of the conductor 205a and the top surface of the insulator 216. That is, the conductor 205b is surrounded by the conductor 205a and the conductor 205c.

Here, it is preferable to use, for the conductor 205a and the conductor 205c, a conductive material that has a function of inhibiting the diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, it is preferable to use a conductive material that has a function of inhibiting the diffusion of oxygen (e.g., at least one of an oxygen atom, an oxygen molecule, and the like).

When a conductive material that has a function of inhibiting the diffusion of hydrogen is used for the conductor 205a and the conductor 205c, impurities such as hydrogen contained in the conductor 205b can be prevented from diffusing into the oxide 230 through the insulator 224 and the like. When a conductive material that has a function of inhibiting the diffusion of oxygen is used for the conductor 205a and the conductor 205c, a reduction in conductivity of the conductor 205b due to oxidation can be inhibited. As the conductive material that has a function of inhibiting the diffusion of oxygen, for example, titanium, titanium nitride, tantalum, tantalum nitride, ruthenium, or ruthenium oxide is preferably used. Thus, a single layer or a stacked layer of the above conductive material is used as the conductor 205a and the conductor 205c. For example, titanium nitride can be used as the conductor 205a and the conductor 205c.

The conductor 205b is preferably formed using a conductive material containing tungsten, copper, or aluminum as its main component. For example, tungsten can be used as the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased and the off-state current can be reduced. Thus, a drain current at the time when a potential applied to the conductor 260 is 0 V can be lower in the case where a negative potential is applied to the conductor 205 than in the case where the negative potential is not applied thereto.

The electric resistivity of the conductor 205 is designed in consideration of the potential applied to the conductor 205, and the thickness of the conductor 205 is determined in accordance with the electric resistivity. The thickness of the insulator 216 is substantially the same as that of the conductor 205. The thicknesses of the conductor 205 and the insulator 216 are preferably reduced in the allowable range of the design of the conductor 205. By reducing the thickness of the insulator 216, the absolute amount of impurities such as hydrogen contained in the insulator 216 can be reduced, so that the diffusion of the impurities into the oxide 230 can be inhibited.

As illustrated in FIG. 1A, the conductor 205 is preferably provided to be larger than a region of the oxide 230 that is not overlapped by the conductor 242a and the conductor 242b. As illustrated in FIG. 1C, it is particularly preferable that the conductor 205 extend to a region beyond end portions of the oxide 230a and the oxide 230b that intersect with the channel width direction. That is, the conductor 205 and the conductor 260 preferably overlap each other with the insulators therebetween beyond a side surface of the oxide 230 in the channel width direction. With this structure, the channel formation region of the oxide 230 can be electrically surrounded by an electric field of the conductor 260 functioning as a first gate electrode and an electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, a transistor with the S-channel structure refers to a transistor with a structure in which a channel formation region is electrically surrounded by electric fields of one of a pair of gate electrodes and the other thereof. The S-channel structure disclosed in this specification and the like is different from a Fin-type structure and a planar structure. With the use of the s-channel structure, a transistor with high resistance to a short-channel effect, i.e., a transistor in which a short-channel effect is less likely to occur, can be obtained.

As illustrated in FIG. 1C, the conductor 205 is extended to function as a wiring as well. However, without limitation thereto, a structure in which a conductor functioning as a wiring is provided below the conductor 205 may be employed. In addition, the conductor 205 is not necessarily provided in each transistor. For example, the conductor 205 may be shared by a plurality of transistors.

Although the conductor 205 in the transistor 200 has a structure in which the conductor 205a, the conductor 205b, and the conductor 205c are stacked, the present invention is not limited thereto. For example, the conductor 205 may have a single-layer structure or a stacked-layer structure of two layers or four or more layers.

The insulator 222 and the insulator 224 function as a gate insulator.

It is preferable that the insulator 222 have a function of inhibiting the diffusion of hydrogen (e.g., at least one of a hydrogen atom, a hydrogen molecule, and the like). In addition, it is preferable that the insulator 222 have a function of inhibiting the diffusion of oxygen (e.g., at least one of an oxygen atom, an oxygen molecule, and the like). For example, the insulator 222 preferably has a function of further inhibiting the diffusion of one or both of hydrogen and oxygen as compared to the insulator 224.

As the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit the diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material, such as aluminum oxide, hafnium oxide, tantalum oxide, zirconium oxide, lead zirconate titanate (PZT), strontium titanate (Sr-TiO$_3$), or (Ba,Sr)TiO$_3$ (BST), may be used for the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is preferable that the insulator 224 in contact with the oxide 230 contain excess oxygen (release oxygen by heating). For example, silicon oxide or silicon oxynitride can be used as appropriate for the insulator 224. When an insulator containing oxygen is provided in contact with the oxide 230, oxygen vacancies in the oxide 230 can be reduced and the reliability of the transistor 200 can be improved.

Specifically, an oxide material from which some oxygen is released by heating, namely, an insulating material including an excess-oxygen region is preferably used for the insulator 224. An oxide film from which oxygen is released by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 550° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O$+O→null." Furthermore, hydrogen remaining in the oxide 230 reacts with supplied oxygen, so that the hydrogen can be removed as H$_2$O (dehydration can be caused). This can inhibit recombination of hydrogen remaining in the oxide 230 with oxygen vacancies and formation of $V_O$H.

Note that the insulator 222 and the insulator 224 may have a stacked-layer structure of two or more layers. In such cases, without limitation to a stacked-layer structure formed of the same material, a stacked-layer structure formed of different materials may be employed. The insulator 224 may be formed in an island shape to be overlapped by the oxide 230a. In that case, the insulator 275 is in contact with a side surface of the insulator 224 and a top surface of the insulator 222.

The conductor 242a and the conductor 242b are preferably provided in contact with a top surface of the oxide 230b. Each of the conductor 242a and the conductor 242b functions as a source electrode or a drain electrode of the transistor 200.

As the conductor 242a and the conductor 242b, for example, a nitride containing tantalum, a nitride containing titanium, a nitride containing molybdenum, a nitride containing tungsten, a nitride containing tantalum and aluminum, or a nitride containing titanium and aluminum is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that hydrogen contained in the oxide 230b or the like diffuses into the conductor 242a or 242b in some cases. In particular, when a nitride containing tantalum is used as the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

It is preferable that no curved surface be formed between the side surface of the conductor 242a and a top surface of the conductor 242a and between the side surface of the conductor 242b and a top surface of the conductor 242b. The conductor 242a and the conductor 242b without the curved surface can have a large cross-sectional area in the channel width direction as illustrated in FIG. 1D. Accordingly, the conductivity of the conductor 242a and the conductor 242b is increased, so that the on-state current of the transistor 200 can be increased.

The insulator 275 is provided to cover the insulator 224, the oxide 230a, the oxide 230b, the conductor 242a, and the conductor 242b, and an opening is formed in a region where the insulator 250 and the conductor 260 are provided. In the insulator 275, the insulator 275a is preferably provided in contact with a top surface of the insulator 224, a side surface of the oxide 230a, a side surface of the oxide 230b, the side and top surfaces of the conductor 242a, and the side and top surfaces of the conductor 242b, and the insulator 275b is preferably provided over the insulator 275a.

Although the insulator 275 in the transistor 200 has a structure in which two layers of the insulator 275a and the insulator 275b are stacked, the present invention is not limited thereto. For example, a single layer or a stacked-layer structure of three or more layers may be provided, or the insulator 275a and the insulator 275b may each have a stacked-layer structure.

The insulator 275 preferably functions as a barrier insulating film that inhibits the passage of oxygen. In addition, the insulator 275 preferably functions as a barrier insulating film that inhibits the diffusion of impurities such as water and hydrogen into the insulator 224 from a portion above the insulator 224 and preferably has a function of trapping impurities such as hydrogen. In that case, as the insulator 275, an insulator such as a metal oxide having an amorphous structure, e.g., aluminum oxide or magnesium oxide, is preferable. As the insulator 275, for example, a single layer or a stacked layer of an insulator such as aluminum oxide and silicon nitride is used. In the case where aluminum oxide and silicon nitride are stacked as the insulator 275, the aluminum oxide is preferably provided as the insulator 275a and the silicon nitride is preferably provided as the insulator 275b.

In the case where aluminum oxide is used as at least part of the insulator 275, the aluminum oxide is preferably aluminum oxide having an amorphous structure or aluminum oxide with an amorphous structure. A metal oxide having an amorphous structure, in particular, aluminum oxide having an amorphous structure and aluminum oxide with an amorphous structure can trap or fix hydrogen in the vicinity thereof in some cases, so that the transistor 200 and the semiconductor device with favorable characteristics and high reliability can be manufactured.

The insulator 275 that has a function of trapping impurities such as hydrogen is provided in contact with the insulator 280 or the insulator 224 in a region between the insulator 212 and the insulator 283, whereby impurities such as hydrogen contained in the insulator 280 or the insulator 224 can be trapped and the amount of hydrogen in the region can be kept constant. In that case, aluminum oxide or the like is preferably used as the insulator 275.

The insulator 250 (the insulator 250a and the insulator 250b) functions as a gate insulator. The insulator 250a is provided in contact with a top surface of the oxide 230b, and the insulator 250b is provided over the insulator 250a. As the insulator 250, for example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

The concentration of impurities such as water and hydrogen in the insulator 250 is preferably lowered as in the insulator 224. The thickness of the insulator 250 is preferably greater than or equal to 1 nm and less than or equal to 20 nm.

It is preferable that the insulator 250a be formed using an insulator from which oxygen is released by heating and the insulator 250b be formed using an insulator that has a function of inhibiting the diffusion of oxygen. Such a structure can inhibit the diffusion of oxygen contained in the insulator 250a into the conductor 260. That is, a reduction in the amount of oxygen supplied to the oxide 230 can be inhibited. In addition, oxidation of the conductor 260 due to oxygen contained in the insulator 250a can be inhibited. For example, the insulator 250a can be formed using the above-described material that can be used for the insulator 250, and the insulator 250b can be formed using a material similar to that for the insulator 222.

In the case where silicon oxide, silicon oxynitride, or the like is used for the insulator 250a, the insulator 250b may be formed using an insulating material that is a high-k material having a high permittivity. The gate insulator having a stacked-layer structure of the insulator 250a and the insulator 250b can be thermally stable and can have a high permittivity. Thus, a gate potential that is applied during the operation of the transistor can be lowered while the physical thickness of the gate insulator is maintained. Furthermore, the equivalent oxide thickness (EOT) of the insulator functioning as the gate insulator can be reduced.

Specifically, as the insulator 250b, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used. For example, a stacked-layer structure including silicon oxide and hafnium oxide over the silicon oxide can be used for the insulator 250.

When the insulator 250 has a stacked-layer structure of the two layers, the distance between the conductor 260 and the oxide 230 is kept by the physical thickness of the insulator 250; hence, a leakage current between the conductor 260 and the oxide 230 can be reduced. Moreover, the physical distance between the conductor 260 and the oxide 230 and the intensity of electric field applied to the oxide 230 from the conductor 260 can be easily adjusted as appropriate.

Although the insulator 250 has a stacked-layer structure of two layers in FIG. 1B and FIG. 1C, the insulator 250 may have a single layer or a stacked-layer structure of three or more layers.

A metal oxide may be provided between the insulator 250 and the conductor 260. The metal oxide preferably inhibits the diffusion of oxygen from the insulator 250 into the conductor 260. By providing the metal oxide that inhibits the diffusion of oxygen, the diffusion of oxygen from the insulator 250 into the conductor 260 is inhibited. That is, a reduction in the amount of oxygen supplied to the oxide 230 can be inhibited. Moreover, oxidation of the conductor 260 due to oxygen in the insulator 250 can be inhibited.

The metal oxide may have a function of part of the first gate electrode. For example, a metal oxide that can be used as the oxide 230 can be used as the metal oxide. In that case, when the conductor 260a is formed by a sputtering method, the metal oxide can have a reduced electric resistance to be a conductor. Such a conductor can be referred to as an OC (Oxide Conductor) electrode. With the metal oxide, the on-state current of the transistor 200 can be increased without a reduction in the influence of the electric field from the conductor 260.

The conductor 260 functions as the first gate electrode of the transistor 200. The conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 1B and FIG. 1C, the top surface of the conductor 260 is substantially level with the top surface of the insulator 250. Although the conductor 260 has a two-layer structure of the conductor 260a and the conductor 260b in FIG. 1B and FIG. 1C, the conductor 260 may have a single-layer structure or a stacked-layer structure of three or more layers.

It is preferable to use, for the conductor 260a, a conductive material that has a function of inhibiting the diffusion of impurities such as hydrogen atoms, hydrogen molecules, water molecules, nitrogen atoms, nitrogen molecules, nitrogen oxide molecules, and copper atoms. Alternatively, it is preferable to use a conductive material that has a function of inhibiting the diffusion of oxygen (e.g., at least one of an oxygen atom, an oxygen molecule, and the like).

When the conductor 260a has a function of inhibiting the diffusion of oxygen, the conductivity of the conductor 260b can be inhibited from being lowered because of oxidation due to oxygen contained in the insulator 250. For the conductive material that has a function of inhibiting the diffusion of oxygen, for example, titanium, titanium nitride, tantalum, tantalum nitride, ruthenium, or ruthenium oxide is preferably used.

The conductor 260 also functions as a wiring and thus is preferably formed using a conductor with high conductivity. For example, a conductive material containing tungsten, copper, or aluminum as its main component can be used for the conductor 260b. The conductor 260b may have a stacked-layer structure; for example, a stacked-layer structure of titanium or titanium nitride and the above conductive material may be employed.

In the transistor 200, the conductor 260 is formed in a self-aligned manner to fill the opening formed in the insulator 280 and the like. The formation of the conductor 260 in this manner allows the conductor 260 to be positioned surely in a region between the conductor 242a and the conductor 242b without alignment.

As illustrated in FIG. 1C, in the channel width direction of the transistor 200, the level of a bottom surface of the conductor 260 in a region where the conductor 260 and the oxide 230b do not overlap each other is preferably lower than the level of a bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When a bottom surface of the insulator 222 is a reference, the difference between the level of the bottom surface of the conductor 260 in a region where the oxide 230a and the oxide 230b are not overlapped by the conductor 260 and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and an opening is formed in a region where the insulator 250 and the conductor 260 are provided. The top surface of the insulator 280 may be planarized.

Like the insulator 224, the insulator 280 preferably includes an excess-oxygen region or excess oxygen. The concentration of impurities such as water and hydrogen in the insulator 280 is preferably reduced. For example, an oxide containing silicon such as silicon oxide or silicon oxynitride is used as appropriate as the insulator 280. When an insulator containing excess oxygen is provided in contact with the oxide 230, oxygen vacancies in the oxide 230 can be reduced and the reliability of the transistor 200 can be improved. The insulator 280 may have a stacked-layer structure of the above materials, for example, a stacked-layer structure of silicon oxide deposited by a sputtering method and silicon oxynitride deposited thereover by a CVD method. Furthermore, silicon nitride may be stacked thereover.

The insulator 282 preferably functions as a barrier insulating film that inhibits the diffusion of impurities such as water and hydrogen into the insulator 280 from a portion above the insulator 280 and has a function of trapping impurities such as oxygen. The insulator 282 preferably functions as a barrier insulating film that inhibits the passage of oxygen. As the insulator 282, an insulator such as a metal oxide having an amorphous structure, e.g., aluminum oxide, is used. The insulator 282, which has a function of trapping impurities such as hydrogen, is provided in contact with the insulator 280 in a region sandwiched between the insulator 212 and the insulator 283, whereby impurities such as hydrogen contained in the insulator 280 and the like can be trapped and the amount of hydrogen in the region can be kept constant. Aluminum oxide having an amorphous structure or aluminum oxide with an amorphous structure is particularly preferably used as the insulator 282, in which case hydrogen can be trapped or fixed more effectively in some cases. Accordingly, the transistor 200 and the semiconductor device with favorable characteristics and high reliability can be manufactured.

The insulator 283 functions as a barrier insulating film that inhibits impurities such as water and hydrogen from diffusing into the insulator 280 from a portion above the insulator 280. The insulator 283 is provided over the insulator 282. A nitride containing silicon such as silicon nitride or silicon nitride oxide is preferably used as the insulator 283. For example, silicon nitride deposited by a sputtering method is used as the insulator 283. When the insulator 283 is formed by a sputtering method, a high-density silicon nitride film where a void or the like is unlikely to be formed can be obtained. As the insulator 283, silicon nitride deposited by a CVD method may be stacked over silicon nitride deposited by a sputtering method.

For the conductor 240a and the conductor 240b, a conductive material containing tungsten, copper, or aluminum as its main component is preferably used. The conductor 240a and the conductor 240b may each have a stacked-layer structure.

In the case where the conductor 240a and the conductor 240b each have a stacked-layer structure, a conductive material having a function of inhibiting the passage of impurities such as water and hydrogen is preferably used for a conductor in contact with the insulator 283, the insulator 282, the insulator 280, and the insulator 275. For example, tantalum, tantalum nitride, titanium, titanium nitride, ruthenium, ruthenium oxide, or the like is preferably used. The conductive material having a function of inhibiting the passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

As the insulator 241a and the insulator 241b, for example, an insulator such as silicon nitride, aluminum oxide, or silicon nitride oxide may be used. Since the insulator 241a and the insulator 241b are provided in contact with the insulator 283, the insulator 282, and the insulator 275, impurities such as water and hydrogen contained in the insulator 280 and the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

The conductor 246a and the conductor 246b that function as wirings may be provided in contact with a top surface of the conductor 240a and a top surface of the conductor 240b. For the conductor 246a and the conductor 246b, a conductive material containing tungsten, copper, or aluminum as its main component is preferably used. The conductor may have a stacked-layer structure and may be a stack of titanium or titanium nitride and the above conductive material, for example. Note that the conductor may be formed to be embedded in an opening provided in an insulator.

The insulator 286 is provided over the conductor 246a, the conductor 246b, and the insulator 283. Thus, a top surface of the conductor 246a, a side surface of the conductor 246a, a top surface of the conductor 246b, and a side surface of the conductor 246b are in contact with the insulator 286, and a bottom surface of the conductor 246a and a bottom surface of the conductor 246b are in contact with the insulator 283. In other words, the conductor 246a and the conductor 246b can be surrounded by the insulator 283 and the insulator 286. Such a structure can inhibit the passage of oxygen from the outside and prevent the oxidation of the conductor 246a and the conductor 246b. Furthermore, the above structure is preferably employed, in which case impurities such as water and hydrogen can be prevented from diffusing from the conductor 246a and the conductor 246b to the outside.

<Constituent Materials of Semiconductor Device>

Constituent materials that can be used for the semiconductor device will be described below.

<<Substrate>>

As the substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of the insulator include an oxide, a nitride, an oxynitride, a nitride oxide, a metal oxide, a metal oxynitride, and a metal nitride oxide, each of which has an insulating property.

With miniaturization and high integration of transistors, for example, a problem such as leakage current may arise because of a thinner gate insulator. When a high-k material is used for the insulator functioning as a gate insulator, the voltage during the operation of the transistor can be lowered while the physical thickness of the gate insulator is maintained. By contrast, when a material with a low permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded with an insulator having a function of inhibiting the passage of oxygen and impurities such as hydrogen, the electrical characteristics of the transistor can be stable. As the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

As the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as a semiconductor (oxide semiconductor) is preferably used. A metal oxide that can be used as the oxide 230 of the present invention will be described below.

At least indium or zinc is preferably contained in the metal oxide. In particular, indium and zinc are preferably contained. In addition to them, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

<Classification of Crystal Structure>

First, the classification of the crystal structures of an oxide semiconductor is explained with reference to FIG. 4A. FIG. 4A is a diagram showing the classification of crystal structures of an oxide semiconductor, typically IGZO (metal oxide containing In, Ga, and Zn).

As shown in FIG. 4A, an oxide semiconductor is roughly classified into "Amorphous," "Crystalline," and "Crystal." The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 4A are in an intermediate state between "Amorphous" and "Crystal," and belong to a new crystalline phase. That is, these structures are completely different from "Amorphous," which is energetically unstable, and "Crystal."

Note that a crystal structure of a film or a substrate can be evaluated with an X-ray diffraction (XRD) spectrum. FIG. 4B shows an XRD spectrum, which is obtained by grazing-incidence XRD (GIXD) measurement, of a CAAC-IGZO film classified into "Crystalline." Note that the GIXD method is also referred to as a thin film method or a Seemann-Bohlin method. The XRD spectrum that is shown in FIG. 4B and obtained by GIXD measurement is hereinafter simply referred to as an XRD spectrum. The CAAC-IGZO film in FIG. 4B has a composition in the neighborhood of In:Ga:Zn=4:2:3 [atomic ratio]. The CAAC-IGZO film in FIG. 4B has a thickness of 500 nm.

In FIG. 4B, the horizontal axis represents 2θ [deg.], and the vertical axis represents intensity [a.u.]. As shown in FIG. 4B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 4B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 4C shows a diffraction pattern of the CAAC-IGZO film. FIG. 4C shows a diffraction pattern obtained with the NBED method in which an electron beam is incident in the direction parallel to the substrate. The composition of the CAAC-IGZO film in FIG. 4C is In:Ga:Zn=4:2:3 [atomic ratio] or the neighborhood thereof. In the nanobeam electron diffraction method, electron diffraction is performed with a probe diameter of 1 nm.

As shown in FIG. 4C, a plurality of spots indicating c-axis alignment are observed in the diffraction pattern of the CAAC-IGZO film.

<<Structure of Oxide Semiconductor>>

Oxide semiconductors might be classified in a manner different from the one in FIG. 4A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. The entry of impurities, formation of defects, or the like might decrease the crystallinity of an oxide semiconductor, which means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and highly reliable. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., 50 nm or larger). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor will be described.

When the above oxide semiconductor is used for a transistor, the transistor can have high field-effect mobility. In addition, the transistor can have high reliability.

An oxide semiconductor with a low carrier concentration is preferably used for a channel formation region of the transistor. For example, the carrier concentration of a channel formation region of an oxide semiconductor is lower than or equal to $1\times10^{17}$ cm$^{-3}$, preferably lower than or equal to $1\times10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor with a high density of trap states has unstable electrical characteristics in some cases.

Accordingly, in order to obtain stable electrical characteristics of the transistor, reducing the impurity concentration in the oxide semiconductor is effective. In order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurities>

Here, the influence of impurities in the oxide semiconductor is described.

When silicon or carbon, which is a Group 14 element, is contained in an oxide semiconductor, defect states are formed in the oxide semiconductor. Thus, the concentration of silicon or carbon in a channel formation region of the oxide semiconductor and the concentration of silicon or carbon in the vicinity of an interface with the channel formation region of the oxide semiconductor (the concentration measured by secondary ion mass spectrometry (SIMS)) are lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal is likely to have normally-on characteristics. Thus, the concentration of an alkali metal or an alkaline earth metal in the channel formation region of the oxide semiconductor, which is measured by SIMS, is lower than or equal to $1 \times 10^{18}$ atoms/cm$^3$, preferably lower than or equal to $2 \times 10^{16}$ atoms/cm$^3$.

An oxide semiconductor containing nitrogen easily becomes n-type by generation of electrons serving as carriers and an increase in carrier concentration. As a result, a transistor including, as a semiconductor, an oxide semiconductor that contains nitrogen is likely to have normally-on characteristics. When nitrogen is contained in the oxide semiconductor, a trap state is sometimes formed. This might make the electrical characteristics of the transistor unstable. Thus, the concentration of nitrogen in the channel formation region of the oxide semiconductor, which is measured by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus forms an oxygen vacancy in some cases. The entry of hydrogen into the oxygen vacancy generates an electron serving as a carrier in some cases. Furthermore, in some cases, bonding of some hydrogen to oxygen bonded to a metal atom causes generation of an electron serving as a carrier. Thus, a transistor including an oxide semiconductor that contains hydrogen is likely to have normally-on characteristics. For this reason, hydrogen in the channel formation region of the oxide semiconductor is preferably reduced as much as possible. Specifically, the hydrogen concentration in the channel formation region of the oxide semiconductor, which is measured by SIMS, is lower than $1 \times 10^{20}$ atoms/cm$^3$, preferably lower than $5 \times 10^{19}$ atoms/cm$^3$, further preferably lower than $1 \times 10^{19}$ atoms/cm$^3$, still further preferably lower than $5 \times 10^{18}$ atoms/cm$^3$, yet still further preferably lower than $1 \times 10^{18}$ atoms/cm$^3$.

When an oxide semiconductor with sufficiently reduced impurities is used for a channel formation region of a transistor, the transistor can have stable electrical characteristics.

<<Other Semiconductor Materials>>

Semiconductor materials that can be used for the oxide 230 are not limited to the above metal oxides. A semiconductor material having a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 230, for example. Specific examples of chalcogenide of transition metals that can be used as the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Method for Manufacturing Semiconductor Device>

Next, a method for manufacturing a semiconductor device of one embodiment of the present invention, which is illustrated in FIG. 1A to FIG. 1D, will be described with reference to FIG. 5A to FIG. 13D.

FIG. 5A, FIG. 6A, FIG. 7A, FIG. 8A, FIG. 9A, FIG. 10A, FIG. 11A, FIG. 12A, and FIG. 13A are top views. FIG. 5B, FIG. 6B, FIG. 7B, FIG. 8B, FIG. 9B, FIG. 10B, FIG. 11B, FIG. 12B, and FIG. 13B are cross-sectional views of portions indicated by the dashed-dotted line A1-A2 in FIG. 5A, FIG. 6A, FIG. 7A, FIG. 8A, FIG. 9A, FIG. 10A, FIG. 11A, FIG. 12A, and FIG. 13A, respectively, and are also cross-sectional views in the channel length direction of the transistor 200. FIG. 5C, FIG. 6C, FIG. 7C, FIG. 8C, FIG. 9C, FIG. 10C, FIG. 11C, FIG. 12C, and FIG. 13C are cross-sectional views of portions indicated by the dashed-dotted line A3-A4 in FIG. 5A, FIG. 6A, FIG. 7A, FIG. 8A, FIG. 9A, FIG. 10A, FIG. 11A, FIG. 12A, and FIG. 13A, respectively, and are also cross-sectional views in the channel width direction of the transistor 200. FIG. 5D, FIG. 6D, FIG. 7D, FIG. 8D, FIG. 9D, FIG. 10D, FIG. 11D, FIG. 12D, and FIG. 13D are cross-sectional views of portions indicated by the dashed-dotted line A5-A6 in FIG. 5A, FIG. 6A, FIG. 7A, FIG. 8A, FIG. 9A, FIG. 10A, FIG. 11A, FIG. 12A, and FIG. 13A, respectively. Note that for clarity of the drawing, some components are not illustrated in the top views of FIG. 5A, FIG. 6A, FIG. 7A, FIG. 8A, FIG. 9A, FIG. 10A, FIG. 11A, FIG. 12A, and FIG. 13A.

In the following steps, an insulating material for forming an insulator, a conductive material for forming a conductor, and a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used for a sputtering power supply, a DC sputtering method in which a DC power source is used, and a pulsed DC sputtering method in which a voltage is applied to an electrode while being changed in a pulsed manner. The RF sputtering method is mainly used in the case where an insulating film is formed, and the DC sputtering method is mainly used in the case where a metal conductive film is formed. The pulsed DC sputtering method is mainly used in the case where a compound such as an oxide, a nitride, or a carbide is deposited by a reactive sputtering method.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

The plasma CVD method enables a high-quality film to be obtained at a relatively low temperature. The thermal CVD method does not use plasma and thus causes less plasma damage to an object. For example, a wiring, an electrode, an element (e.g., a transistor or a capacitor), or the like included in a semiconductor device might be charged up by receiving charges from plasma. In that case, accumulated charges might break the wiring, the electrode, the element, or the like included in the semiconductor device. By contrast, when the thermal CVD method not using plasma is employed, such plasma damage is not caused and the yield of the semiconductor device can be increased. Furthermore, a film with few defects can be obtained by the thermal CVD method because plasma damage during deposition is not caused.

As the ALD method, a thermal ALD method, in which a precursor and a reactant react with each other only by thermal energy, a PEALD (plasma enhanced ALD) method, in which a plasma-enhanced reactant is used, or the like can be used.

The ALD method, which enables one atomic layer to be formed at a time using self-regulating characteristics of atoms, has advantages such as deposition of an extremely thin film, deposition on a component with a high aspect ratio, deposition of a film with few defects such as pinholes, deposition with excellent coverage, and low-temperature deposition. The use of plasma in the PEALD (plasma enhanced ALD) method is sometimes preferable because deposition at a lower temperature is possible. Note that a precursor used in the ALD method sometimes contains impurities such as carbon. Thus, a film formed by the ALD method may contain impurities such as carbon in a larger amount than a film formed by another deposition method. Note that impurities can be quantified by X-ray photoelectron spectroscopy (XPS).

Unlike in a deposition method in which particles ejected from a target or the like are deposited, a film is formed by reaction at a surface of an object in a CVD method and an ALD method. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening with a high aspect ratio, for example. Meanwhile, the ALD method has a relatively low deposition rate, and thus is preferably used in combination with another deposition method with a high deposition rate, such as the CVD method, in some cases.

The CVD method and the ALD method enable the composition of a film that is to be obtained to be controlled with the flow rate ratio of the source gases. For example, by the CVD method and the ALD method, a film with a certain composition can be formed depending on the flow rate ratio of the source gases. Moreover, for example, by the CVD method and the ALD method, a film whose composition is continuously changed can be formed by changing the flow rate ratio of the source gases during the deposition. In the case where a film is formed while changing the flow rate ratio of the source gases, as compared to the case where a film is formed using a plurality of deposition chambers, the time taken for the deposition can be shortened because the time taken for transfer and pressure adjustment is not required. Thus, the productivity of the semiconductor device can be increased in some cases.

Figure 5A:
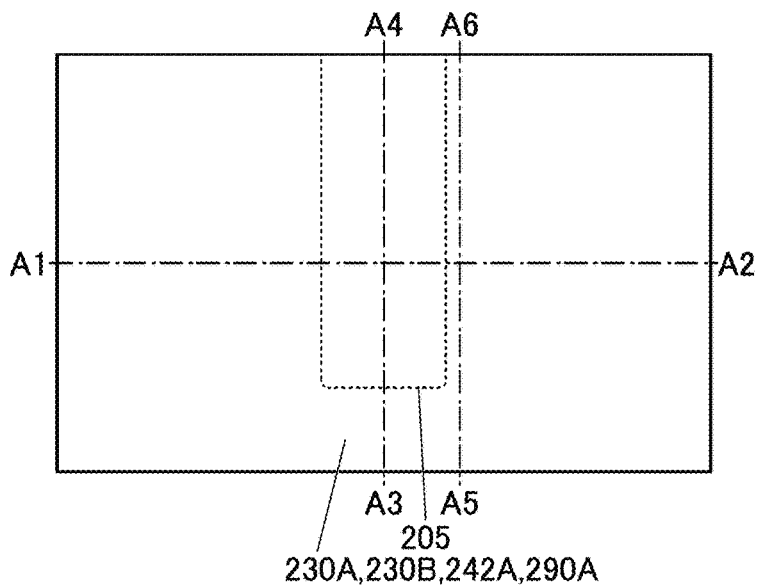
FIG. 5A is a top view illustrating a method for manufacturing a semiconductor device of one embodiment of the present invention.
Figure 5C:
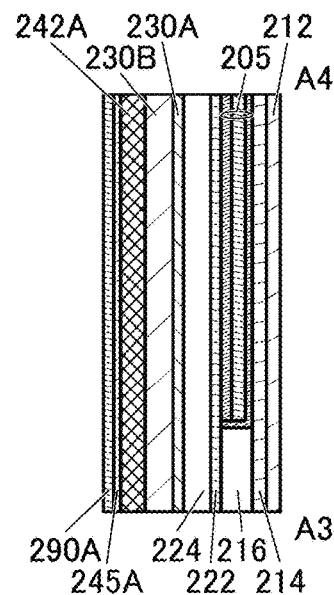
FIG. 5B to FIG. 5D are cross-sectional views illustrating a method for manufacturing a semiconductor device of one embodiment of the present invention.
Figure 5B:
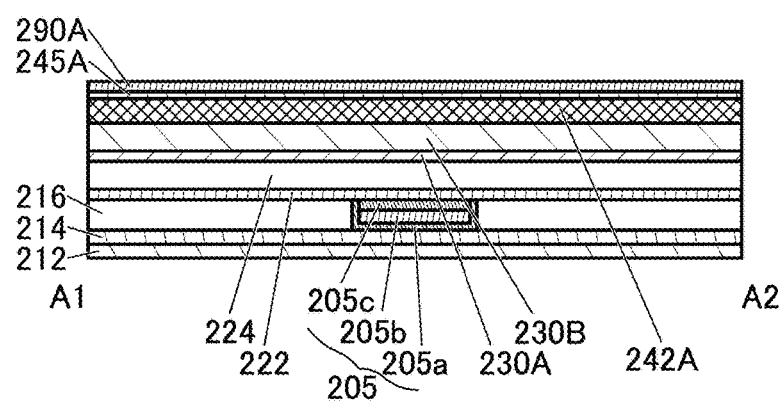
Figure 5D:
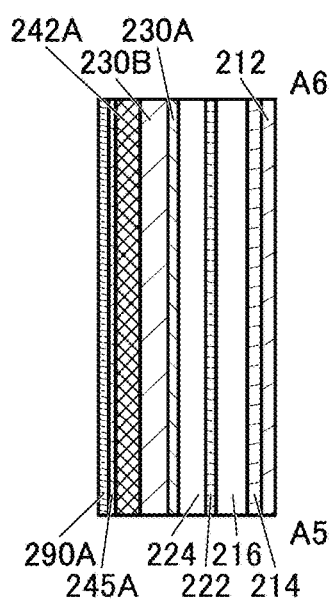

First, a substrate (not illustrated) is prepared, and the insulator 212 is formed over the substrate (see FIG. 5B to FIG. 5D). The insulator 212 is preferably formed by a sputtering method. Since hydrogen is not used as a deposition gas in the sputtering method, the concentration of hydrogen in the insulator 212 can be reduced. Formation of the insulator 212 is not limited to a sputtering method, and a CVD method, an MBE method, a PLD method, an ALD method, or the like may be employed as appropriate.

In this embodiment, as the insulator 212, silicon nitride is deposited by a pulsed DC sputtering method using a silicon target in an atmosphere containing a nitrogen gas. The use of the pulsed DC sputtering can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are unlikely to pass, such as silicon nitride, can inhibit the diffusion of impurities such as water and hydrogen contained in a layer below the insulator 212. When an insulator through which copper is unlikely to pass, such as silicon nitride, is used as the insulator 212, even in the case where a metal that is likely to diffuse, such as copper, is used as a conductor in a layer (not illustrated) below the insulator 212, the diffusion of the metal into an upper portion through the insulator 212 can be inhibited.

Then, the insulator 214 is formed over the insulator 212 (see FIG. 5B to FIG. 5D). The insulator 214 is preferably formed by a sputtering method. Since hydrogen is not used as a deposition gas in the sputtering method, the concentration of hydrogen in the insulator 214 can be reduced. The deposition method of the insulator 214 is not limited to a sputtering method; a CVD method, an MBE method, a PLD method, an ALD method, or the like may be employed as appropriate.

In this embodiment, as the insulator 214, aluminum oxide is deposited by a pulsed DC sputtering method using an aluminum target in an atmosphere containing an oxygen gas. The use of the pulsed DC sputtering can achieve more uniform film thickness and improve the sputtering rate and film quality.

A metal oxide, such as aluminum oxide, having high hydrogen-trapping and hydrogen-fixing capabilities and an amorphous structure is preferably used as the insulator 214. In that case, hydrogen contained in the insulator 216 and the like is trapped or fixed, and thus can be prevented from diffusing into the oxide 230. In particular, aluminum oxide having an amorphous structure or aluminum oxide with an amorphous structure is preferably used as the insulator 214, in which case hydrogen can be trapped or fixed more effectively. Accordingly, the transistor 200 and the semiconductor device with favorable characteristics and high reliability can be manufactured.

Next, the insulator 216 is formed over the insulator 214. The insulator 216 is preferably formed by a sputtering method. Since hydrogen is not used as a deposition gas in the sputtering method, the concentration of hydrogen in the insulator 216 can be reduced. The deposition method of the insulator 216 is not limited to a sputtering method; a CVD method, an MBE method, a PLD method, an ALD method, or the like may be employed as appropriate.

In this embodiment, as the insulator 216, silicon oxide is deposited by a pulsed DC sputtering method using a silicon target in an atmosphere containing an oxygen gas. The use of the pulsed DC sputtering can achieve more uniform film thickness and improve the sputtering rate and film quality.

The insulator 212, the insulator 214, and the insulator 216 are preferably formed successively without being exposed to the air. For example, a multi-chamber deposition apparatus is used. As a result, the amount of hydrogen in the formed insulator 212, insulator 214, and insulator 216 can be reduced, and furthermore, the entry of hydrogen in the films in intervals between deposition steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, dry etching is preferable for microfabrication. It is preferable to select, as the insulator 214, an insulator that functions as an etching stopper film used in forming a groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is formed. The conductive film preferably includes a conductor that has a function of inhibiting the passage of oxygen. For example, tantalum nitride, tungsten nitride, or titanium nitride can be used. Alternatively, a stacked-layer film of the conductor that has a function of inhibiting the passage of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, as the conductive film to be the conductor 205a, a titanium nitride film is formed by a CVD method. When such a metal nitride is used for a layer under the conductor 205b, oxidation of the conductor 205b by the insulator 216 or the like can be inhibited. Furthermore, even when a metal that is likely to diffuse, such as copper, is used as the conductor 205b, the metal can be prevented from diffusing from the conductor 205a to the outside.

Next, a conductive film to be the conductor 205b is formed. As the conductive film, tantalum, tungsten, titanium, molybdenum, aluminum, copper, or a molybdenum-tungsten alloy, or the like can be used. The conductive film can be formed by a plating method, a sputtering method, a CVD method, an MBE method, a PLD method, an ALD method, or the like. In this embodiment, a tungsten film is formed as the conductive film.

Then, CMP treatment is performed to remove parts of the conductive film to be the conductor 205a and the conductive film to be the conductor 205b, so that the insulator 216 is exposed. As a result, the conductor 205a and the conductor 205b remain only in the opening portion. Note that the insulator 216 is partly removed by the CMP treatment in some cases.

Then, an upper portion of the conductor 205b is removed by etching. This makes the level of the top surface of the conductor 205b lower than the levels of the top surface of the conductor 205a and the top surface of the insulator 216. Dry etching or wet etching can be used for the etching of the conductor 205b; however, dry etching is preferable for microfabrication.

Then, a conductive film to be the conductor 205c is formed over the insulator 216, the conductor 205a, and the conductor 205b. The conductive film preferably includes a conductor that has a function of inhibiting the passage of oxygen like the conductor 205a.

In this embodiment, a titanium nitride film is formed as the conductive film to be the conductor 205c. When such a metal nitride is used for a layer over the conductor 205b, oxidation of the conductor 205b by the insulator 222 or the like can be inhibited. Furthermore, even when a metal that is likely to diffuse, such as copper, is used as the conductor 205b, the metal can be prevented from diffusing from the conductor 205c to the outside.

Next, CMP treatment is performed to remove part of the conductive film to be the conductor 205c, so that the insulator 216 is exposed. As a result, the conductor 205a, the conductor 205b, and the conductor 205c remain only in the opening portion. Thus, the conductor 205 whose top surface is flat can be formed (see FIG. 5A to FIG. 5D). Furthermore, the conductor 205b is surrounded by the conductor 205a and the conductor 205c. Thus, impurities such as hydrogen can be prevented from diffusing from the conductor 205b to the outside of the conductor 205a and the conductor 205c, and the conductor 205b can be prevented from being oxidized by the entry of oxygen from the outside of the conductor 205a and the conductor 205c. Note that the insulator 216 is partly removed by the CMP treatment in some cases.

Next, the insulator 222 is formed over the insulator 216 and the conductor 205. An insulator containing an oxide of one or both of aluminum and hafnium is preferably formed as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be formed by a sputtering method, a CVD method, an MBE method, a PLD method, an ALD method, or the like. In this embodiment, as the insulator 222, hafnium oxide is deposited by an ALD method.

After that, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is approximately 20%. The heat treatment may be performed under reduced pressure.

Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent the entry of moisture or the like into the insulator 222 and the like as much as possible.

In this embodiment, as the heat treatment, treatment at 400° C. for one hour is performed with a flow rate ratio of a nitrogen gas and an oxygen gas of 4 slm:1 slm after the deposition of the insulator 222. By the heat treatment, impurities such as water and hydrogen contained in the insulator 222 can be removed, for example. In the case where an oxide containing hafnium is used as the insulator 222, the insulator 222 is partly crystallized by the heat treatment in some cases. The heat treatment can also be performed after the deposition of the insulator 224, for example.

Next, the insulator 224 is formed over the insulator 222. The insulator 224 can be formed by a sputtering method, a CVD method, an MBE method, a PLD method, an ALD method, or the like. In this embodiment, as the insulator 224, silicon oxide is deposited by a PECVD method.

Here, in order to form an excess-oxygen region in the insulator 224, plasma treatment with oxygen may be performed under reduced pressure. The plasma treatment with oxygen is preferably performed with an apparatus including a power source for generating high-density plasma using microwaves, for example. Alternatively, a power source for applying an RF (radio frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment with an inert gas is performed with the apparatus, plasma treatment with oxygen may be performed in order to compensate for released oxygen. Note that impurities such as water and hydrogen contained in the insulator 224 can be removed by selecting the conditions of the plasma treatment as appropriate. In that case, the heat treatment does not need to be performed.

Here, CMP treatment may be performed on the insulator 224. The CMP treatment can planarize and smooth a surface of the insulator 224. Planarizing and smoothing the surface of the insulator 224 can prevent deterioration in the coverage with an oxide deposited later and a decrease in the yield of the semiconductor device in some cases. Although the thickness of the insulator 224 is reduced by the CMP treatment, the thickness can be adjusted when the insulator 224 is formed.

After aluminum oxide is deposited over the insulator 224 by, for example, a sputtering method, the aluminum oxide may be subjected to CMP treatment until the insulator 224 is reached. When the CMP treatment is performed on the aluminum oxide positioned over the insulator 224, the endpoint of the CMP treatment can be easily detected. Although part of the insulator 224 is polished by the CMP treatment and the thickness of the insulator 224 is reduced in some cases, the thickness can be adjusted when the insulator 224 is formed. Moreover, it is preferable to deposit aluminum oxide over the insulator 224 by a sputtering method, in which case oxygen can be added to the insulator 224.

Next, an oxide film 230A and an oxide film 230B are formed in this order over the insulator 224 (see FIG. 5A to FIG. 5D). Note that it is preferable to form the oxide film 230A and the oxide film 230B successively without being exposed to the air. For example, a multi-chamber deposition apparatus is used. By the formation without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be formed by a sputtering method, a CVD method, an MBE method, a PLD method, an ALD method, or the like.

For example, in the case where the oxide film 230A and the oxide film 230B are formed by a sputtering method, oxygen or a mixed gas of oxygen and a rare gas is used as a sputtering gas. Increasing the proportion of oxygen contained in the sputtering gas can increase the amount of excess oxygen in the formed oxide films. In the case where the oxide films are formed by a sputtering method, a target of the above In-M-Zn oxide or the like can be used.

In particular, when the oxide film 230A is formed, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the formation is performed while the substrate is heated, the crystallinity of the oxide film can be improved.

In this embodiment, the oxide film 230A is formed by a sputtering method using an oxide target with In:Ga:Zn=1:3:4 [atomic ratio]. The oxide film 230B is formed by a sputtering method using an oxide target with In:Ga:Zn=4:2:4.1 [atomic ratio]. Note that the oxide films are preferably formed to have characteristics required for the oxide 230a and the oxide 230b by selecting the deposition conditions and the atomic ratios as appropriate.

Next, heat treatment is preferably performed. The heat treatment is performed in a temperature range where the oxide film 230A and the oxide film 230B do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent the entry of moisture or the like into the oxide film 230A, the oxide film 230B, and the like as much as possible.

In this embodiment, the heat treatment is performed in such a manner that treatment is performed at 400° C. in a nitrogen atmosphere for one hour and then another treatment is successively performed at 400° C. in an oxygen atmosphere for one hour. Through the heat treatment, impurities such as water and hydrogen in the oxide film 230A and the oxide film 230B can be removed, for example.

Next, a conductive film 242A is formed over the oxide film 230B (see FIG. 5A to FIG. 5D). The conductive film 242A can be formed by a sputtering method, a CVD method, an MBE method, a PLD method, an ALD method, or the like. For example, as the conductive film 242A, a tantalum nitride film is formed by a sputtering method. Note that heat treatment may be performed before the formation of the conductive film 242A. This heat treatment may be performed under reduced pressure, and the conductive film 242A may be successively formed without exposure to the air. The treatment enables removal of moisture and hydrogen adsorbed onto the surface of the oxide film 230B and the like, and further enables reductions in the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

Next, an insulating film 245A is formed over the conductive film 242A (see FIG. 5A to FIG. 5D). The insulating film 245A can be formed by a sputtering method, a CVD method, an MBE method, a PLD method, an ALD method, or the like. As the insulating film 245A, an insulating film having a function of inhibiting the passage of oxygen is preferably used. For example, an aluminum oxide film or a silicon nitride film is formed as the insulating film 245A.

Next, a conductive film 290A is formed over the insulating film 245A (see FIG. 5A to FIG. 5D). The conductive film 290A can be formed by a sputtering method, a CVD method, an MBE method, a PLD method, an ALD method, or the like. For example, a tungsten film is formed as the conductive film 290A.

Next, the conductive film 290A and the insulating film 245A are processed into an island shape to form a conductive layer 290B and an insulating layer 245B (see FIG. 6(A) to FIG. 6(D)). The conductive layer 290B and the insulating layer 245B each function as a hard mask.

Next, the oxide film 230A, the oxide film 230B, and the conductive film 242A are processed into an island shape by a lithography method to form the oxide 230a, the oxide 230b, and a conductive layer 242B (see FIG. 6A to FIG. 6D). A dry etching method or a wet etching method can be employed for the processing. Processing by a dry etching method is suitable for microfabrication. The oxide film 230A, the oxide film 230B, and the conductive film 242A may be processed under different conditions. Note that in this step, the thickness of the insulator 224 in a region not overlapped by the oxide 230a is reduced in some cases. In this step, the insulator 224 may be processed into an island shape so as to be overlapped by the oxide 230a.

Note that in the lithography method, first, a resist is exposed to light through a mask. Next, a region exposed to light is removed or left using a developer, so that a resist mask is formed. Then, etching treatment is performed with the resist mask, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used under the resist mask. In the case of using a hard mask, a hard mask with a desired shape can be formed in the following manner: an insulating film or a conductive film to be a hard mask material is formed over the conductive film 242A, a resist mask is formed thereover, and then the hard mask material is etched. The etching of the conductive film 242A and the like may be performed after or without removal of the resist mask. In the latter case, the resist mask sometimes disappears during the etching. The hard mask may be removed by etching after the etching of the conductive film 242A and the like. Meanwhile, the hard mask is not necessarily removed when the hard mask material does not affect subsequent steps or can be utilized in the subsequent steps. In this embodiment, the insulating layer 245B and the conductive layer 290B are used as hard masks. Meanwhile, when the insulating layer 245B functions well as a hard mask, the conductive layer 290B is not necessarily provided. In that case, the conductive film 290A does not need to be formed. In the case where the insulating layer 245B is used as a hard mask without providing the conductive layer 290B, the thickness of the insulating layer 245B is preferably adjusted as appropriate so that the insulating layer 245B is prevented from being eliminated during etching of the conductive film 242A and the like.

Figure 6A:
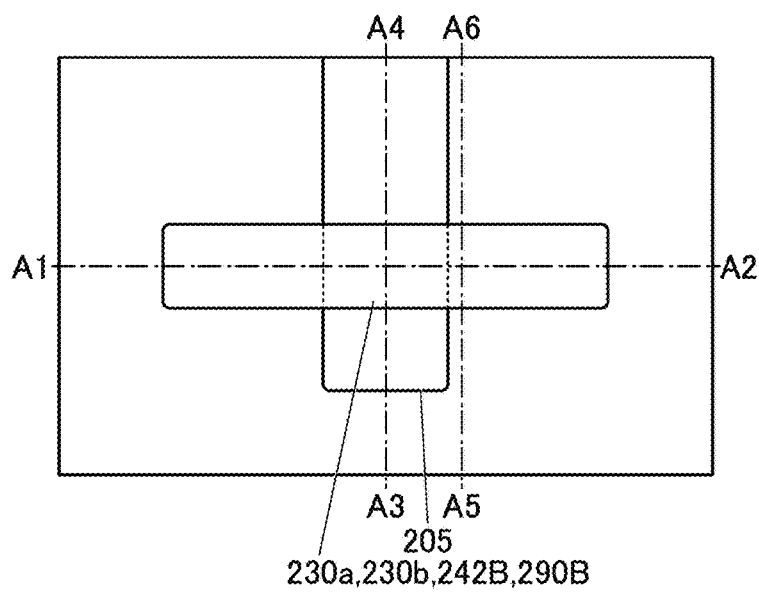
FIG. 6A is a top view illustrating a method for manufacturing a semiconductor device of one embodiment of the present invention.
Figure 6C:
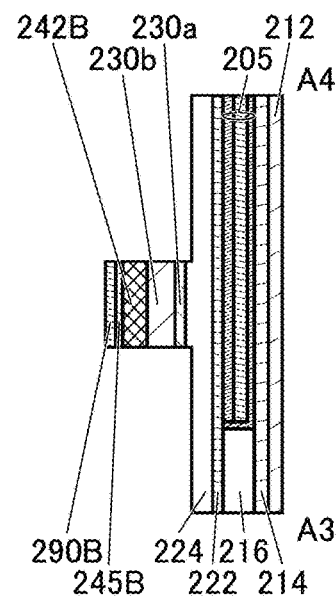
FIG. 6B to FIG. 6D are cross-sectional views illustrating a method for manufacturing a semiconductor device of one embodiment of the present invention.
Figure 6B:
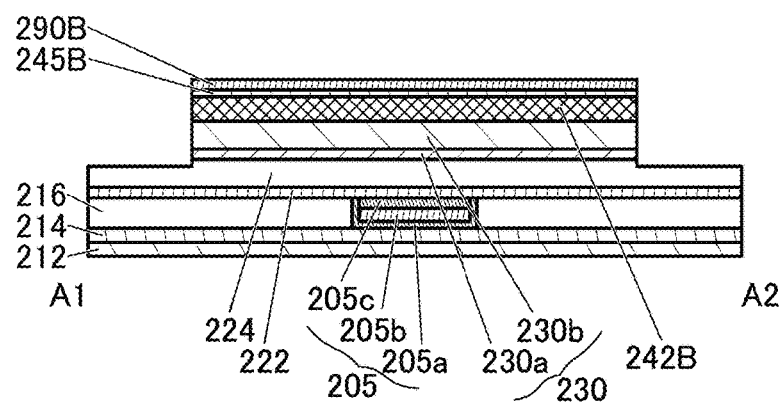
Figure 6D:
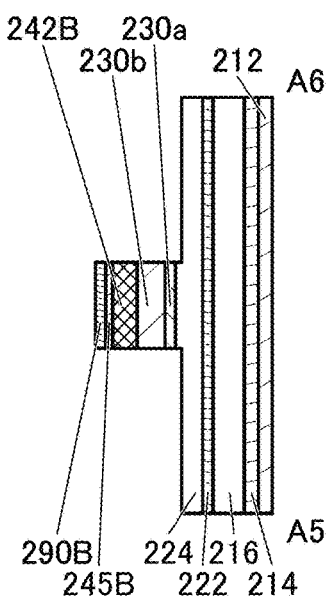

Here, the insulating layer 245B and the conductive layer 290B function as masks for the conductive layer 242B; thus, as illustrated in FIG. 6B to FIG. 6D, the conductive layer 242B does not have a curved surface between the side surface and the top surface. Thus, end portions at the intersections of the side surfaces and the top surfaces of the conductor 242a and the conductor 242b illustrated in FIG. 1B and FIG. 1D are angular. The cross-sectional area of the conductor 242a and the conductor 242b is larger in the case where the end portion at the intersection of the side surface and the top surface of the conductor 242a and the end portion at the intersection of the side surface and the top surface of the conductor 242b are angular than in the case where the end portions are rounded. Accordingly, the resistance of the conductor 242a and the conductor 242b is reduced, so that the on-state current of the transistor 200 can be increased.

The oxide 230a, the oxide 230b, and the conductive layer 242B are formed so as to at least partly overlap the conductor 205. It is preferable that the side surfaces of the oxide 230a, the oxide 230b, and the conductive layer 242B be substantially perpendicular to a top surface of the insulator 222. When the side surfaces of the oxide 230a, the oxide 230b, and the conductive layer 242B are substantially perpendicular to the top surface of the insulator 222, a plurality of transistors 200 can be provided in a smaller area and at a higher density. Alternatively, a structure may be employed in which the angle formed by the side surfaces of the oxide 230a, the oxide 230b, and the conductive layer 242B and the top surface of the insulator 222 is an acute angle. In that case, the angle formed by the side surfaces of the oxide 230a, the oxide 230b, and the conductive layer 242B and the top surface of the insulator 222 is preferably greater than or equal to 60° and less than 70°. Such a shape can improve the coverage with the insulator 275 and the like in the subsequent steps, so that defects such as voids can be reduced.

A by-product generated in the etching process is sometimes formed in a layered manner on the top surface of the insulator 224 and the side surfaces of the oxide 230a, the oxide 230b, and the conductive layer 242B. When the insulator 275 is formed in the state where the layered by-product is formed over the insulator 224, the layered by-product might block supply of oxygen to the insulator 224. Hence, the layered by-product formed in contact with the top surface of the insulator 224 is preferably removed.

In the case where the insulating layer 245B or the conductive layer 290B remain in the etching process, the remaining insulating layer 245B or conductive layer 290B is removed. The insulating layer 245B may remain.

Next, the insulator 275a and the insulator 275b are sequentially formed over the insulator 224 and the conductive layer 242B. (See FIG. 7B to FIG. 7D). The insulator 275a and the insulator 275b can be formed by a sputtering method, a CVD method, an MBE method, a PLD method, an ALD method, or the like. Note that the insulator 275a and the insulator 275b may be formed by the same method or different methods. For example, the insulator 275 may be formed in such a manner that the insulator 275a is formed by a sputtering method in an atmosphere containing oxygen and then the insulator 275b is formed by an ALD method. The ALD method is a deposition method achieving good coverage, and thus can prevent generation of disconnection due to unevenness of the first layer.

Furthermore, the above-described materials can be used for the insulator 275a and the insulator 275b, and the same material or different materials may be used for the insulator 275a and the insulator 275b. For example, a stacked-layer structure of silicon oxide, silicon oxynitride, silicon nitride oxide, or silicon nitride and an insulator having a function of inhibiting the passage of oxygen and impurities such as hydrogen may be employed. As the insulator having a function of inhibiting the passage of oxygen and impurities such as hydrogen, an insulator containing an oxide of one or both of aluminum and hafnium can be used, for example.

In this embodiment, aluminum oxide is deposited as the insulator 275a by a sputtering method and another aluminum oxide is deposited as the insulator 275b by an ALD method. When the insulator 275a is formed by a sputtering method, oxygen can be added to the insulator 224.

Next, an insulating film to be the insulator 280 is formed over the insulator 275. The insulating film can be formed by a sputtering method, a CVD method, an MBE method, a PLD method, an ALD method, or the like. For example, a silicon oxide film is formed by a sputtering method as the insulating film. When the insulating film is formed by a sputtering method in an atmosphere containing oxygen, the insulator 280 containing excess oxygen can be formed. Since hydrogen is not used as a deposition gas in the sputtering method, the concentration of hydrogen in the insulator 280 can be reduced. Note that heat treatment may be performed before the insulating film is formed. The heat treatment may be performed under reduced pressure, and the insulating film may be successively formed without exposure to the air. The treatment can remove moisture and hydrogen adsorbed onto a surface of the insulator 275 and the like, and further can reduce the moisture concentration and the hydrogen concentration of the oxide 230a, the oxide 230b, and the insulator 224. The heat treatment can be performed under the above heat treatment conditions.

Figure 7A:
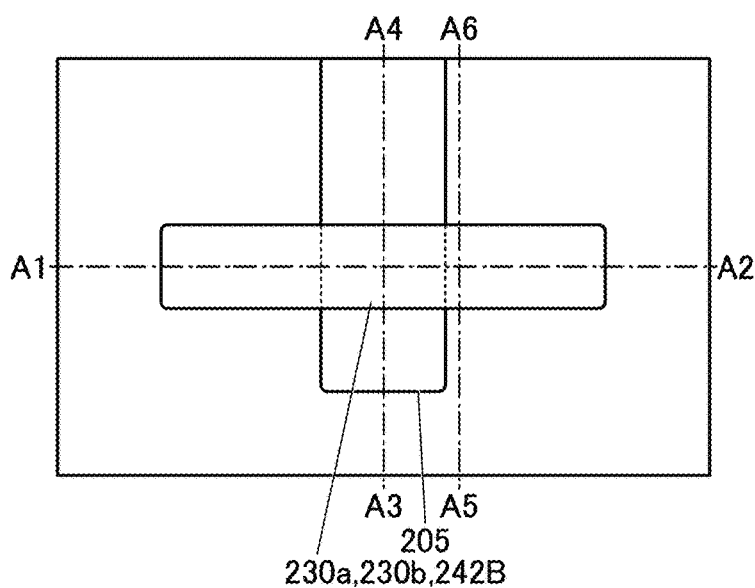
FIG. 7A is a top view illustrating a method for manufacturing a semiconductor device of one embodiment of the present invention.
Figure 7C:
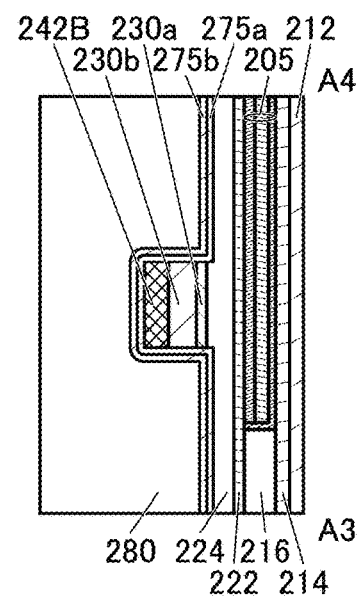
FIG. 7B to FIG. 7D are cross-sectional views illustrating a method for manufacturing a semiconductor device of one embodiment of the present invention.
Figure 7B:
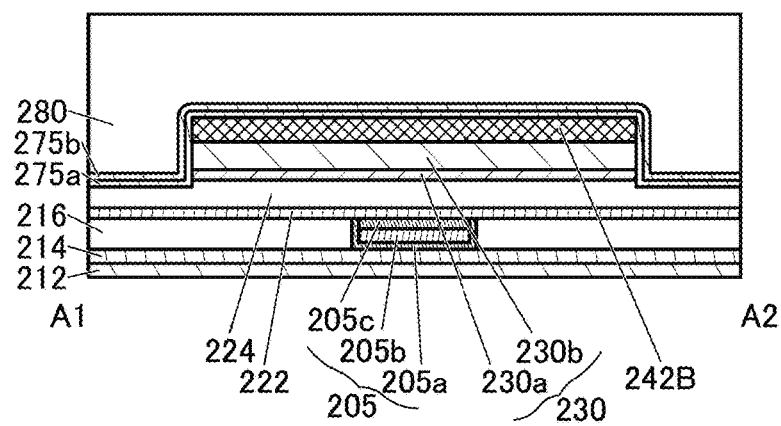
Figure 7D:
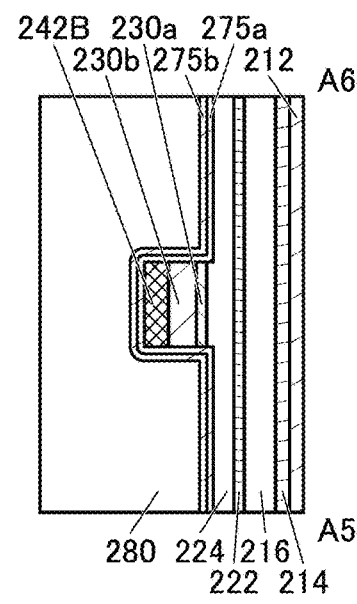
Figure 8A:
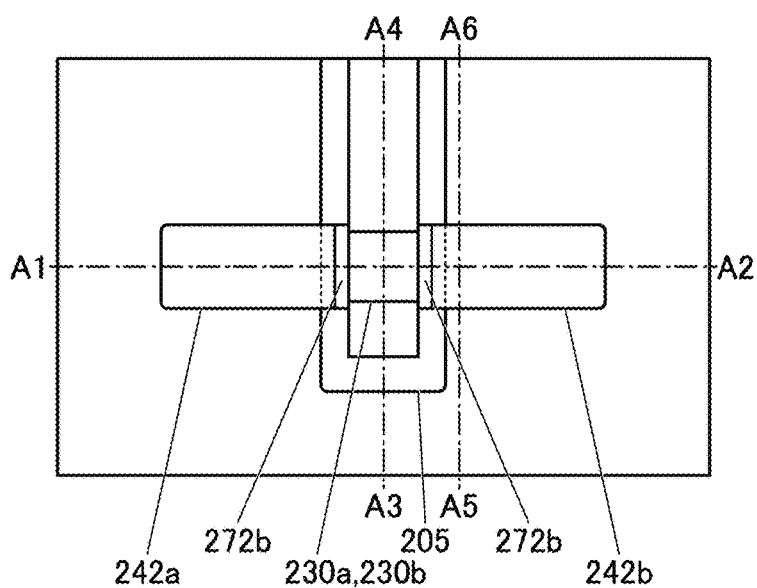
FIG. 8A is a top view illustrating a method for manufacturing a semiconductor device of one embodiment of the present invention.
Figure 8C:
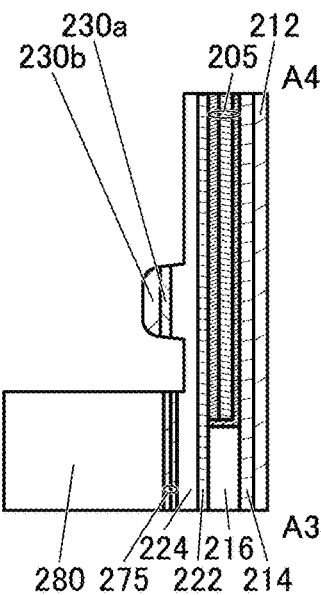
FIG. 8B to FIG. 8D are cross-sectional views illustrating a method for manufacturing a semiconductor device of one embodiment of the present invention.
Figure 8B:
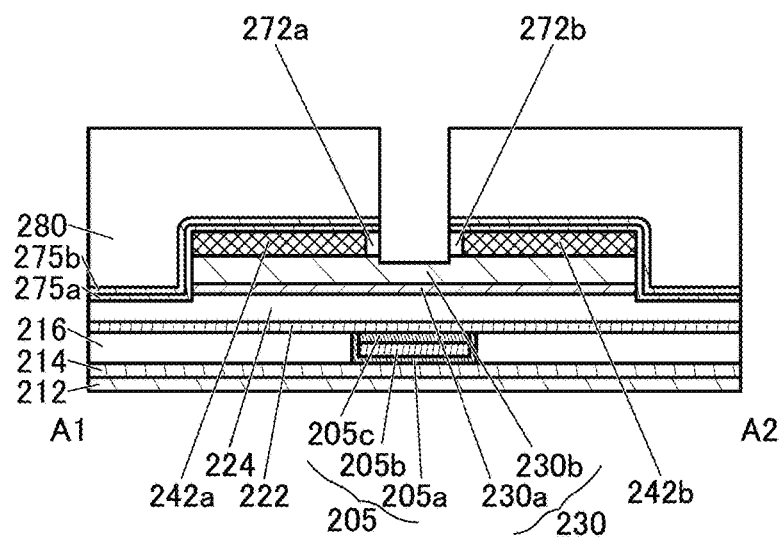
Figure 8D:
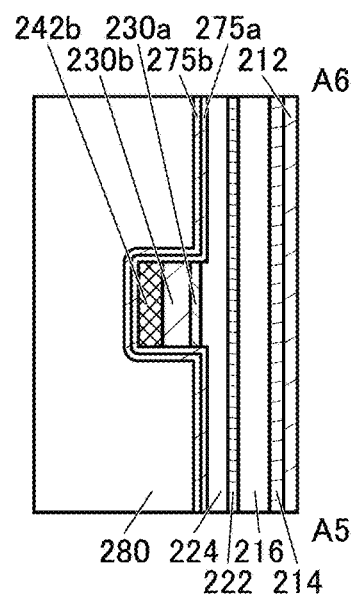

Next, the insulating film to be the insulator 280 is subjected to CMP treatment, so that the insulator 280 with a flat top surface is formed (see FIG. 7B to FIG. 7D). Note that, for example, silicon nitride may be deposited over the insulator 280 by a sputtering method and CMP treatment may be performed on the silicon nitride until the insulator 280 is reached.

Then, part of the insulator 280, part of the insulator 275, and part of the conductive layer 242B are processed to form an opening reaching the oxide 230b. The opening is preferably formed to overlap the conductor 205. The formation of the opening leads to formation of the conductor 242a and the conductor 242b (see FIG. 8A to FIG. 8D).

The part of the insulator 280, the part of the insulator 275, and the part of the conductive layer 242B can be processed by a dry etching method or a wet etching method. Processing by a dry etching method is suitable for microfabrication. Alternatively, the part of the insulator 280, the part of the insulator 275, and the part of the conductive layer 242B may be processed under different conditions. For example, the part of the insulator 280 may be processed by a dry etching method, the part of the insulator 275 may be processed by a wet etching method, and the part of the conductive layer 242B may be processed by a dry etching method.

In the formation of the opening, the oxide 272a is sometimes formed by oxidation of the side edge of the conductor 242a, and the oxide 272b is sometimes formed by oxidation of the side edge of the conductor 242b (see FIG. 8A to FIG. 8D). The width of the oxide 272a and the oxide 272b in the channel length direction is changed depending on the processing conditions of the opening formation.

A dry etching apparatus used for forming the conductor 242a and the conductor 242b has a function of eliminating static electricity accumulated on a substrate during etching. Specifically, plasma treatment is performed with power lower than that in the formation of the conductor 242a and the conductor 242b after the etching treatment for forming the conductor 242a and the conductor 242b is completed, whereby static electricity accumulated on the substrate is eliminated. This plasma treatment is referred to as static neutralization plasma treatment. For example, in the case where nitrogen is used in the static neutralization plasma treatment, the width of the oxide 272a and the oxide 272b in the channel length direction tends to be smaller than that in the case where oxygen is used in the static neutralization plasma treatment.

An upper portion of the oxide 230b is sometimes removed when the opening is formed. When part of the oxide 230b is removed, a groove portion is sometimes formed in the oxide 230b.

A dry etching method and a wet etching method have different anisotropic properties. When the part of the insulator 280, the part of the insulator 275, and the part of the conductive layer 242B are processed under different conditions, in the opening, the angle formed by the side surfaces of the insulator 280, the conductor 242a or the conductor 242b, and the oxide 230b and a bottom surface of the insulator 224 is different from the angle formed by a side surface of the insulator 275 and the bottom surface of the insulator 224 in some cases, as illustrated in FIG. 3.

Here, it is preferable to remove impurities that have been attached onto the surfaces of the oxide 230a, the oxide 230b, and the like or diffused into the oxide 230a, the oxide 230b, and the like. It is also preferable to remove a damaged region that is formed on the surface of the oxide 230b by the dry etching. The impurities result from components contained in the insulator 280, the insulator 275, and the conductive layer 242B; components contained in a member of an apparatus used to form the opening; and components contained in a gas or a liquid used for etching, for example. Examples of the impurities include aluminum, silicon, tantalum, fluorine, and chlorine.

In particular, impurities such as aluminum and silicon hinder the oxide 230b from becoming a CAAC-OS. It is thus preferable to reduce or remove impurity elements such as aluminum and silicon, which block the oxide from becoming a CAAC-OS. For example, the concentration of aluminum atoms in the oxide 230b and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an a-like OS is referred to as a non-CAAC region in some cases. In the non-CAAC region, the density of the crystal structure is reduced to increase $V_OH$; thus, the transistor is likely to be normally on. Hence, the non-CAAC region in the oxide 230b is preferably reduced or removed.

By contrast, the oxide 230b preferably has a layered CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of a lower edge portion of the conductor 242a (conductor 242b) preferably has a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the above impurities and the like, cleaning treatment is performed. Examples of the cleaning method include wet cleaning using a cleaning solution and the like, plasma treatment using plasma, and cleaning by heat treatment, and any of these cleanings may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution are adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed. The cleaning treatment can remove impurities that have been attached onto the surfaces of the oxide 230a, the oxide 230b, and the like or diffused into the oxide 230a, the oxide 230b, and the like. Furthermore, the crystallinity of the oxide 230b can be improved.

By the processing such as dry etching or the cleaning treatment, the thickness of the insulator 224 in a region that is overlapped by the opening and is not overlapped by the oxide 230b may become smaller than the thickness of the insulator 224 in a region that is overlapped by the oxide 230b.

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce oxygen vacancies. Moreover, such heat treatment can improve the crystallinity of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

Next, an insulating film 250A is formed (see FIG. 9A to FIG. 9D). Heat treatment may be performed before the insulating film 250A is formed. It is preferable that the heat treatment be performed under reduced pressure and the oxide film 250A be formed successively without exposure to the air. Alternatively, the heat treatment may be performed in an atmosphere containing oxygen. Such treatment can remove moisture and hydrogen adsorbed onto the surface of the oxide 230b or the like and can also reduce the moisture concentration and the hydrogen concentration of the oxide 230a and the oxide 230b. The heat treatment is preferably performed at a temperature higher than or equal to 100° C. and lower than or equal to 400° C.

The insulating film 250A can be formed by a sputtering method, a CVD method, an MBE method, a PLD method, an ALD method, or the like. The insulating film 250A is preferably formed by a deposition method using a gas in which hydrogen atoms are reduced or removed. This can reduce the hydrogen concentration of the insulating film 250A. The hydrogen concentration is preferably reduced because the insulating film 250A becomes the insulator 250 that is in contact with the oxide 230b in a later step.

Note that when the insulating film 250A is formed, the width of the oxide 272a and the oxide 272b in the channel length direction might be increased. Note that in the case where the oxide 272a and the oxide 272b are not formed before the insulating film 250A is formed, the oxide 272a might be formed due to oxidation of the side edge of the conductor 242a and the oxide 272b might be formed due to oxidation of the side edge of the conductor 242b in the formation of the insulating film 250A.

Next, microwave treatment is performed in an atmosphere containing oxygen (see FIG. 9A to FIG. 9D). Here, arrows indicated by dotted lines in FIG. 9B to FIG. 9D indicate a microwave, a high-frequency wave such as RF, oxygen plasma, oxygen radicals, or the like. For microwave treatment, a microwave treatment apparatus including a power source for generating high-density plasma using a microwave is preferably used, for example. The microwave treatment apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the oxide 230b. The microwave treatment is preferably performed under reduced pressure, and the pressure is set to be 60 Pa or higher, preferably 133 Pa or higher, further preferably 200 Pa or higher, and still further preferably 400 Pa or higher. Furthermore, the oxygen flow rate ratio ($O_2/(O_2+Ar)$) is lower than or equal to 50%, preferably higher than or equal to 10% and lower than or equal to 30%. The treatment temperature is lower than or equal to 750° C., preferably lower than or equal to 500° C., and is approximately 400° C., for example. After the oxygen plasma treatment, heat treatment may be successively performed without exposure to the air.

Figure 9A:
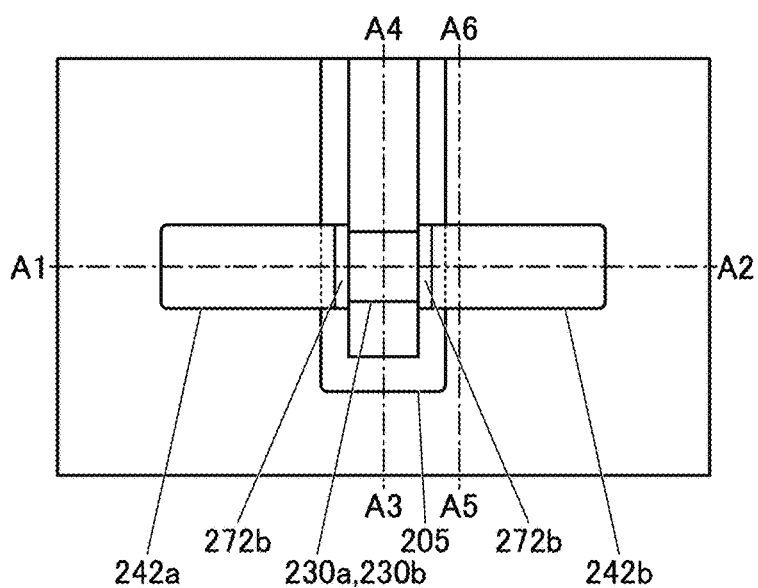
FIG. 9A is a top view illustrating a method for manufacturing a semiconductor device of one embodiment of the present invention.
Figure 9C:
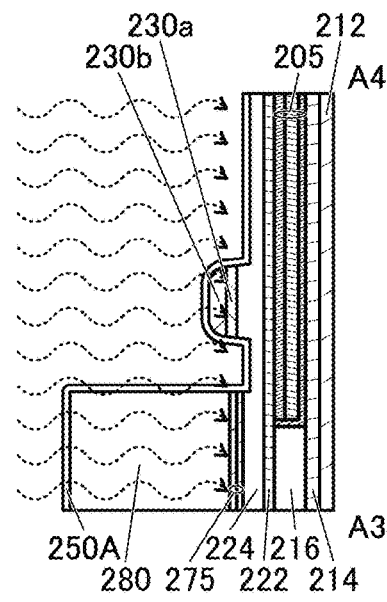
FIG. 9B to FIG. 9D are cross-sectional views illustrating a method for manufacturing a semiconductor device of one embodiment of the present invention.
Figure 9B:
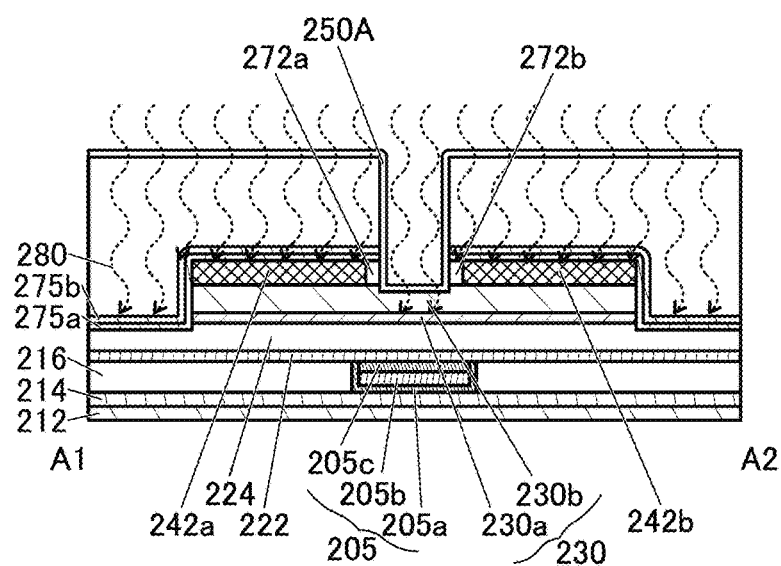
Figure 9D:
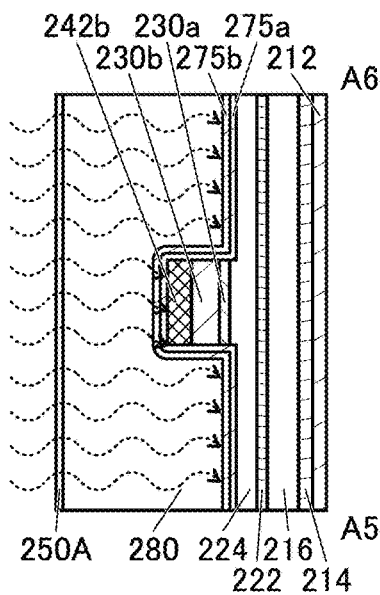

As illustrated in FIG. 9B to FIG. 9D, the microwave treatment in an atmosphere containing oxygen can convert an oxygen gas into plasma using a microwave or a high-frequency wave such as RF and apply the oxygen plasma to a region of the oxide 230b that is between the conductor 242a and the conductor 242b. At this time, the region 236, the region 237a, and the region 237b can be irradiated with the microwave or the high-frequency wave such as RF. In other words, the microwave, the high-frequency wave such as RF, the oxygen plasma, or the like can be applied to the region 236, the region 237a, and the region 237b. The effect of the plasma, the microwave, or the like enables $V_OH$ in the region 236, the region 237a, and the region 237b to be cut and hydrogen to be removed from the region 236, the region 237a, and the region 237b. That is, the reaction "$V_OH \rightarrow H+ V_O$" occurs in the region 236, the region 237a, and the region 237b, so that the hydrogen concentration of the region 236, the region 237a, and the region 237b can be reduced. As a result, oxygen vacancies and $V_OH$ in the region 236, the region 237a, and the region 237b can be reduced to lower the carrier concentration. In addition, oxygen radicals generated by the oxygen plasma or oxygen contained in the insulator 250 is supplied to oxygen vacancies formed in the region 236, the region 237a, and the region 237b, thereby further reducing oxygen vacancies in the region 236, the region 237a, and the region 237b to lower the carrier concentration.

By contrast, the conductor 242a and the conductor 242b are provided over the region 238a and the region 238b illustrated in FIG. 2. As illustrated in FIG. 9B to FIG. 9D, the effects of the microwave, the high-frequency wave such as RF, the oxygen plasma, and the like are blocked by the conductor 242a and the conductor 242b, and thus does not reach the region 238a and the region 238b. Hence, a reduction in $V_OH$ and supply of an excess amount of oxygen due to the microwave treatment do not occur in the region 238a and the region 238b, preventing a decrease in carrier concentration.

In the microwave treatment in an atmosphere containing oxygen, the effects of the microwave, the high-frequency wave such as RF, the oxygen plasma, and the like can be reduced by the oxide 272a, the oxide 272b, the insulator 275, and the insulator 280. Accordingly, the effects on the region 237a and the region 237b are weaker than those on the region 236 and stronger than those on the region 238a and the region 238b. Thus, the carrier concentrations of the region 237a and the region 237b due to the microwave treatment are lower than those of the region 238a and the region 238b and are not as low as that of the region 236.

In the above manner, oxygen vacancies and $V_OH$ can be selectively removed from the region 236 in the oxide semiconductor, whereby the region 236 can be an i-type or substantially i-type region. The region 238a and the region 238b functioning as the source region and the drain region can be inhibited from being supplied with an excess amount of oxygen, whereby the regions can remain n-type. Furthermore, the carrier concentrations of the region 237a and the region 237b can be equal to or lower than those of the region 238a and the region 238b and equal to or higher than that of the region 236. As a result, a change in the electrical characteristics of the transistor 200 can be inhibited, so that a variation in the electrical characteristics of the transistors 200 in the substrate plane can be inhibited.

After the microwave treatment, heat treatment may be performed with the reduced pressure being maintained. Such treatment enables hydrogen in the insulating film 250A, the oxide 230b, and the oxide 230a to be removed efficiently. Part of hydrogen is gettered by the conductor 242a and the conductor 242b in some cases. Alternatively, it is possible to repeat the step of performing microwave treatment and the step of performing heat treatment with the reduced pressure being maintained after the microwave treatment. The repetition of the heat treatment enables hydrogen in the insulating film 250A, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, thereby inhibiting the diffusion of hydrogen, water, impurities, and the like. Accordingly, hydrogen, water, impurities, and the like can be inhibited from diffusing into the oxide 230b, the oxide 230a, and the like through the insulator 250 in a later step such as formation of a conductive film to be the conductor 260 or later treatment such as heat treatment.

Note that when the microwave treatment is performed, the width in the channel length direction of the oxide 272a and the oxide 272b might be increased. Note that in the case where the oxide 272a and the oxide 272b are not formed before the, the oxide 272a might be formed due to oxidation of the side edge of the conductor 242a and the oxide 272b might be formed due to oxidation of the side edge of the conductor 242b in the microwave treatment.

Although the microwave treatment is performed after the insulating film 250A is formed in the step illustrated in FIG. 9A to FIG. 9D, the present invention is not limited thereto. For example, the microwave treatment may be performed before the insulating film 250A is formed or the microwave treatment may be performed both before and after the insulating film 250A is formed.

Figure 10A:
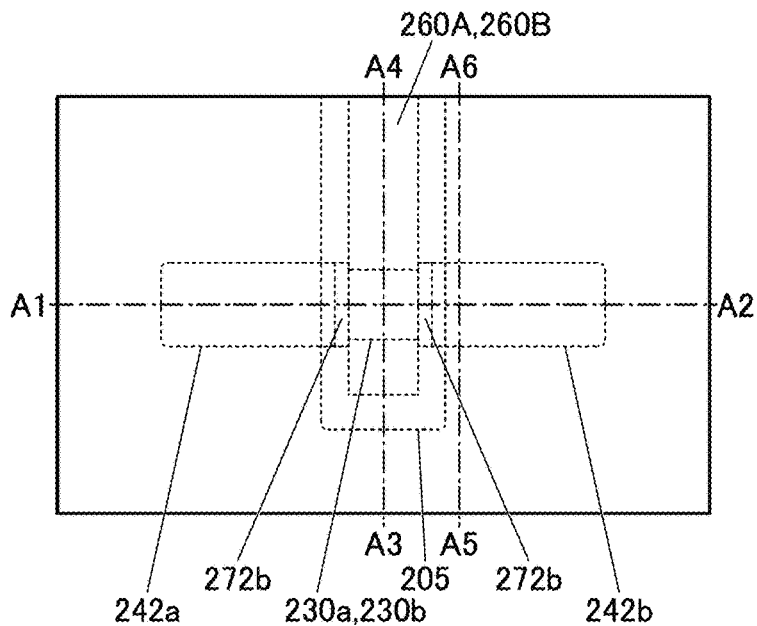
FIG. 10A is a top view illustrating a method for manufacturing a semiconductor device of one embodiment of the present invention.
Figure 10C:
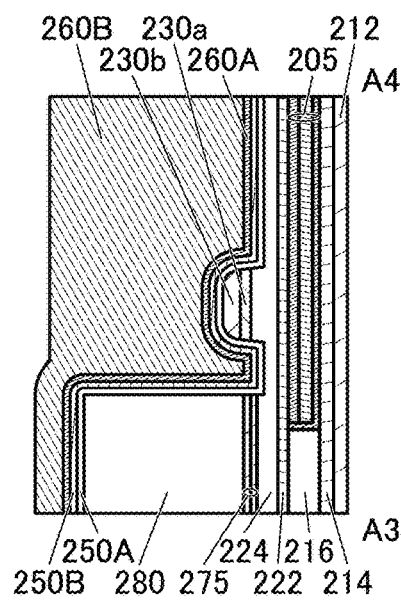
FIG. 10B to FIG. 10D are cross-sectional views illustrating a method for manufacturing a semiconductor device of one embodiment of the present invention.
Figure 10B:
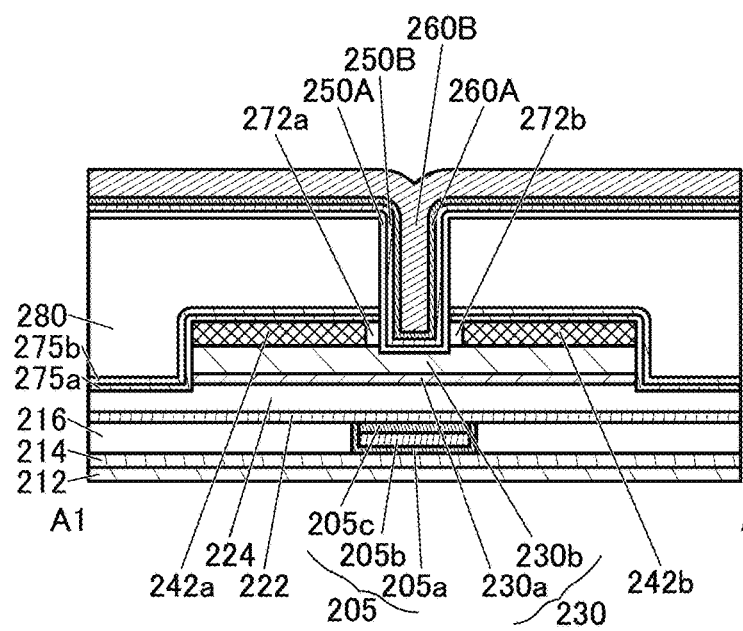
Figure 10D:
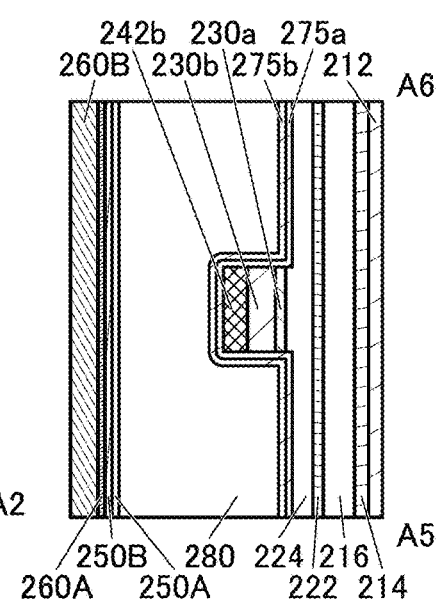
Figure 11A:
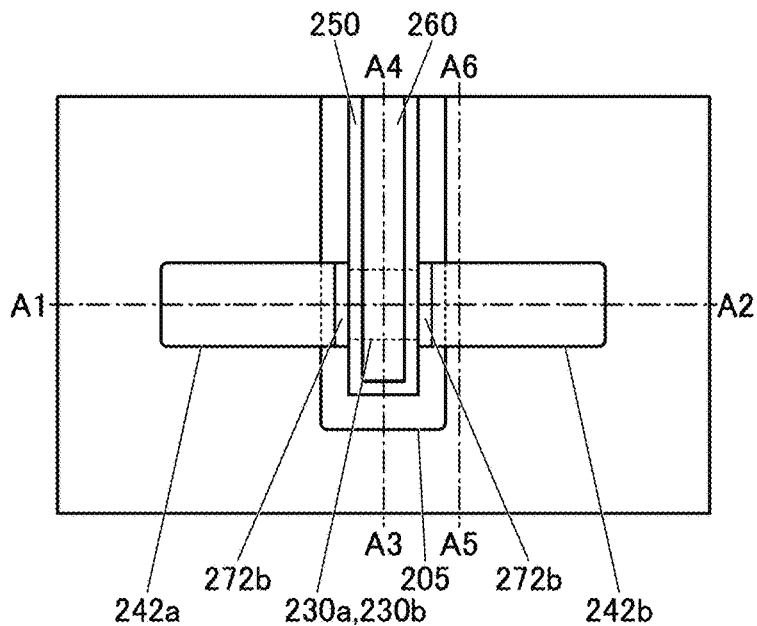
FIG. 11A is a top view illustrating a method for manufacturing a semiconductor device of one embodiment of the present invention.
Figure 11C:
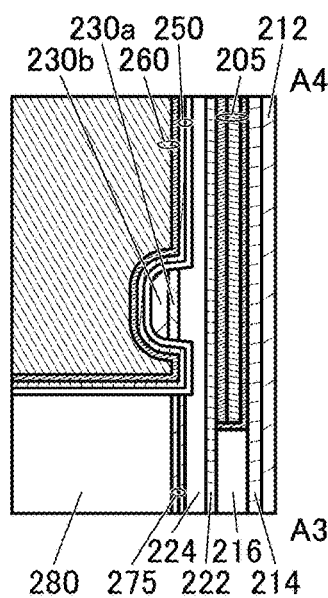
FIG. 11B to FIG. 11D are cross-sectional views illustrating a method for manufacturing a semiconductor device of one embodiment of the present invention.
Figure 11B:
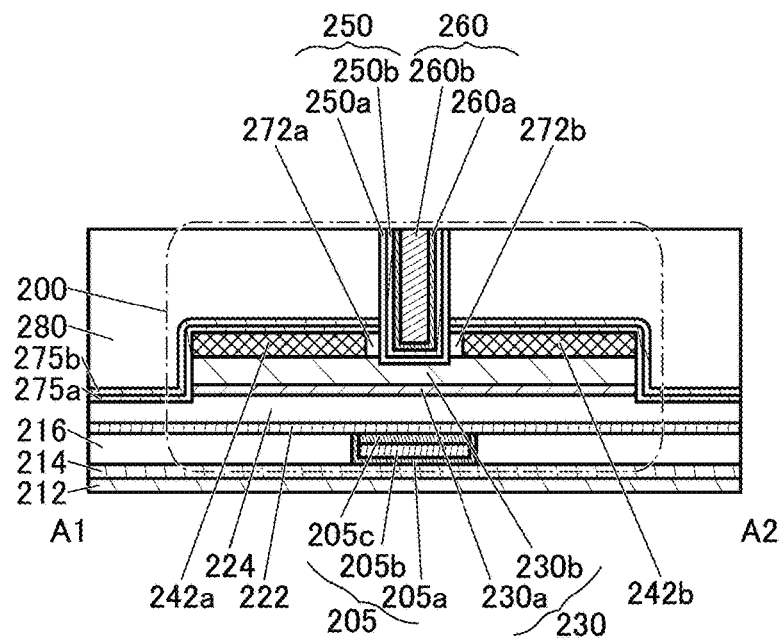
Figure 11D:
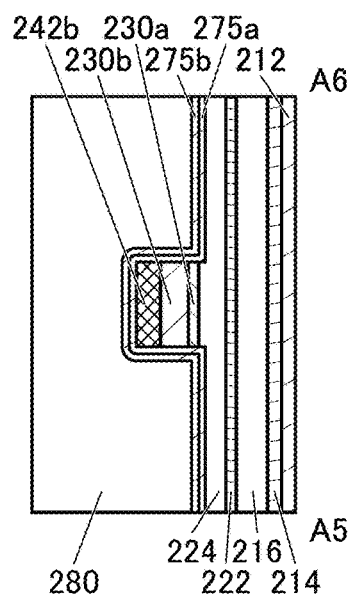
Figure 12A:
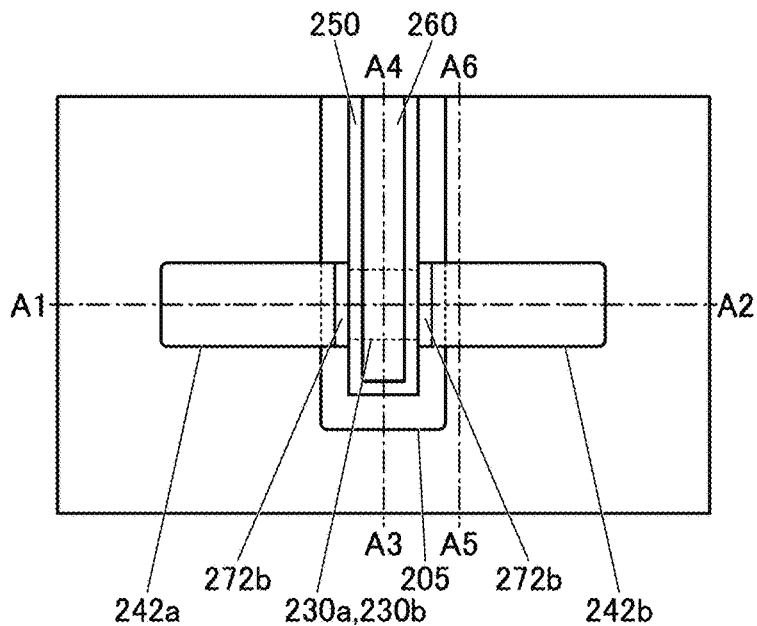
FIG. 12A is a top view illustrating a method for manufacturing a semiconductor device of one embodiment of the present invention.
Figure 12C:
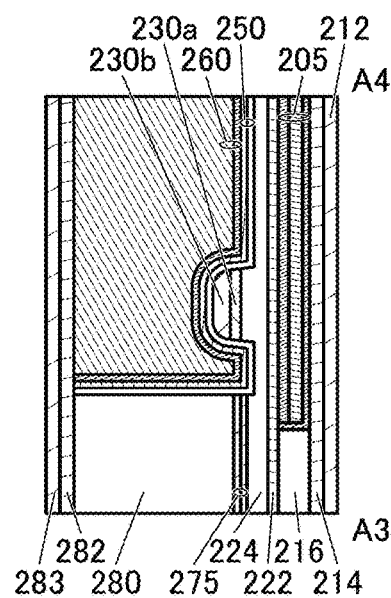
FIG. 12B to FIG. 12D are cross-sectional views illustrating a method for manufacturing a semiconductor device of one embodiment of the present invention.
Figure 12B:
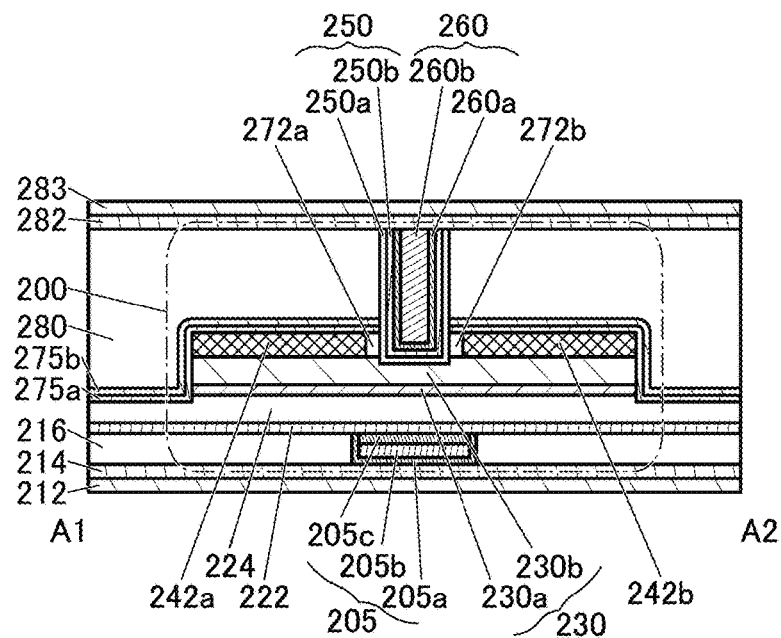
Figure 12D:
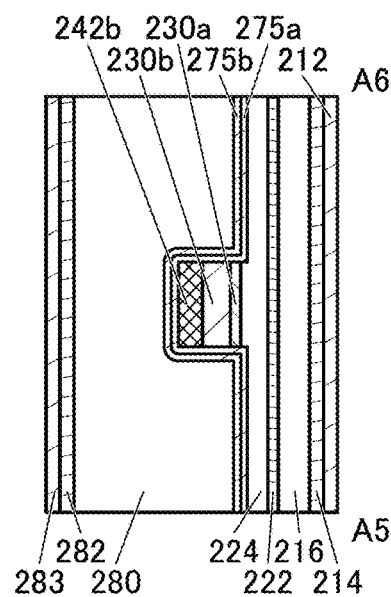

Next, an insulating film 250B is formed (see FIG. 10B to FIG. 10D). Heat treatment may be performed before the insulating film 250B is formed. It is preferable that the heat treatment be performed under reduced pressure and the oxide film 250B be formed successively without exposure to the air. Alternatively, the heat treatment may be performed in an atmosphere containing oxygen. Such treatment can remove moisture and hydrogen adsorbed onto the surface of the insulating film 250A or the like and can also reduce the moisture concentration and the hydrogen concentration of the oxide 230a, the oxide 230b, and the insulating film 250A. The heat treatment is preferably performed at a temperature higher than or equal to 100° C. and lower than or equal to 400° C.

The insulating film 250B can be formed by a sputtering method, a CVD method, an MBE method, a PLD method, an ALD method, or the like. The insulating film 250B is preferably formed using an insulator having a function of inhibiting the diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, the insulating film 250B can be provided using a material similar to that for the insulator 222.

Specifically, as the insulating film 250B, a metal oxide containing one kind or two or more kinds selected from hafnium, aluminum, gallium, yttrium, zirconium, tungsten, titanium, tantalum, nickel, germanium, magnesium, and the like or a metal oxide that can be used as the oxide 230 can be used. In particular, an insulator containing an oxide of one or both of aluminum and hafnium is preferably used.

In this embodiment, a hafnium oxide film is formed as the insulating film 250B by a thermal ALD method. Note that microwave treatment may be performed, silicon oxide may be deposited as the insulating film 250A by a PEALD method, and hafnium oxide may be deposited as the insulating film 250B by a thermal ALD method. Here, the microwave treatment, the deposition of silicon oxide by a PEALD method, and the deposition of hafnium oxide by a thermal ALD method are preferably performed successively without exposure to the air. For example, a multi-chamber treatment apparatus is used. Treatment with a plasma-excited reactant (oxidizer) in a PEALD apparatus may be substituted for the microwave treatment. Here, an oxygen gas may be used as the reactant (oxidizer).

Next, heat treatment may be performed under conditions similar to those of the above heat treatment. In this embodiment, treatment at 400° C. for one hour is performed with a flow rate ratio of a nitrogen gas to an oxygen gas of 4 slm: 1 slm. The heat treatment can reduce the moisture concentration and the hydrogen concentration of the insulator 250 and the insulator 280.

Note that through the foregoing steps, the oxide 272a is formed on the side surface of the conductor 242a and the oxide 272b is formed on the side surface of the conductor 242b.

Next, a conductive film 260A and a conductive film 260B are formed in this order (see FIG. 10A to FIG. 10D). The conductive film 260A and the conductive film 260B can be formed by a sputtering method, a CVD method, an MBE method, a PLD method, an ALD method, or the like. In this embodiment, the conductive film 260A and the conductive film 260B are formed by a CVD method.

Then, the insulating film 250A, the insulating film 250B, the conductive film 260A, and the conductive film 260B are polished by CMP treatment until the insulator 280 is exposed, whereby the insulator 250 (the insulator 250a and the insulator 250b) and the conductor 260 (the conductor 260a and the conductor 260b) are formed (see FIG. 11A to FIG. 11D). Accordingly, the insulator 250 is positioned to cover the inner wall (the side wall and the bottom surface) of the opening reaching the oxide 230b and the groove portion of the oxide 230b. The conductor 260 is provided to fill the opening and the groove portion with the insulator 250 therebetween.

Next, heat treatment may be performed under conditions similar to those of the above heat treatment. In this embodiment, treatment is performed at 400° C. in a nitrogen atmosphere for one hour. The heat treatment can reduce the moisture concentration and the hydrogen concentration of the insulator 250 and the insulator 280. After the heat treatment, the insulator 282 may be formed successively without exposure to the air.

Next, the insulator 282 is formed over the insulator 250, the conductor 260, and the insulator 280 (see FIG. 12A to FIG. 12D). The insulator 282 can be formed by a sputtering method, a CVD method, an MBE method, a PLD method, an ALD method, or the like. The insulator 282 is preferably formed by a sputtering method. Since hydrogen is not used as a deposition gas in the sputtering method, the concentration of hydrogen in the insulator 282 can be reduced. The insulator 282 is formed by a sputtering method in an atmosphere containing oxygen, whereby oxygen can be added to the insulator 280 during the deposition. Accordingly, excess oxygen can be contained in the insulator 280. At this time, the insulator 282 is preferably formed while the substrate is being heated.

In this embodiment, as the insulator 282, aluminum oxide is deposited by a pulsed DC sputtering method using an aluminum target in an atmosphere containing an oxygen gas. The use of the pulsed DC sputtering can achieve more uniform film thickness and improve the sputtering rate and film quality.

Next, the insulator 283 is formed over the insulator 282 (see FIG. 12A to FIG. 12D). The insulator 283 can be formed by a sputtering method, a CVD method, an MBE method, a PLD method, an ALD method, or the like. The insulator 283 is preferably formed by a sputtering method. Since hydrogen is not used as a deposition gas in the sputtering method, the concentration of hydrogen in the insulator 283 can be reduced. The insulator 283 may have a multilayer structure. For example, silicon nitride may be deposited by a sputtering method and silicon nitride may be deposited by a CVD method over the silicon nitride. Surrounding the transistor 200 with the insulator 283 and the insulator 212 having high barrier properties can prevent the entry of moisture and hydrogen from the outside.

Subsequently, heat treatment may be performed. In this embodiment, treatment is performed at 400° C. in a nitrogen atmosphere for one hour. By the heat treatment, oxygen added at the time of the deposition of the insulator 282 can diffuse into the insulator 280 and the insulator 250 and then can be supplied selectively to the channel formation region of the oxide 230. Note that the heat treatment is not necessarily performed after the formation of the insulator 283 and may be performed after the deposition of the insulator 282, for example.

Figure 13A:
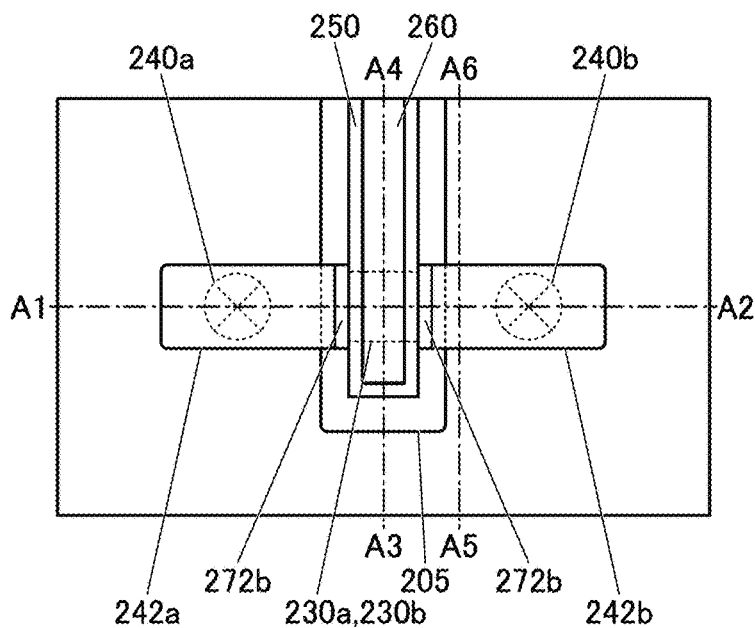
FIG. 13A is a top view illustrating a method for manufacturing a semiconductor device of one embodiment of the present invention.
Figure 13C:
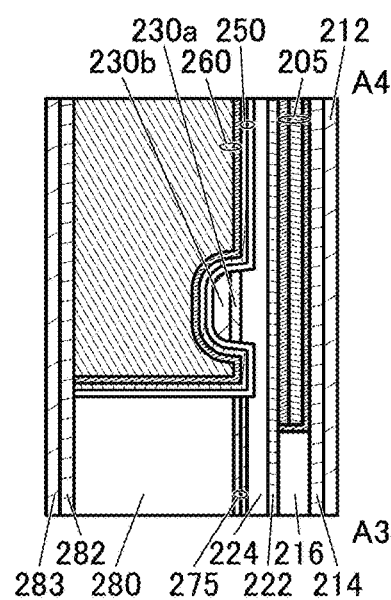
FIG. 13B to FIG. 13D are cross-sectional views illustrating a method for manufacturing a semiconductor device of one embodiment of the present invention.
Figure 13B:
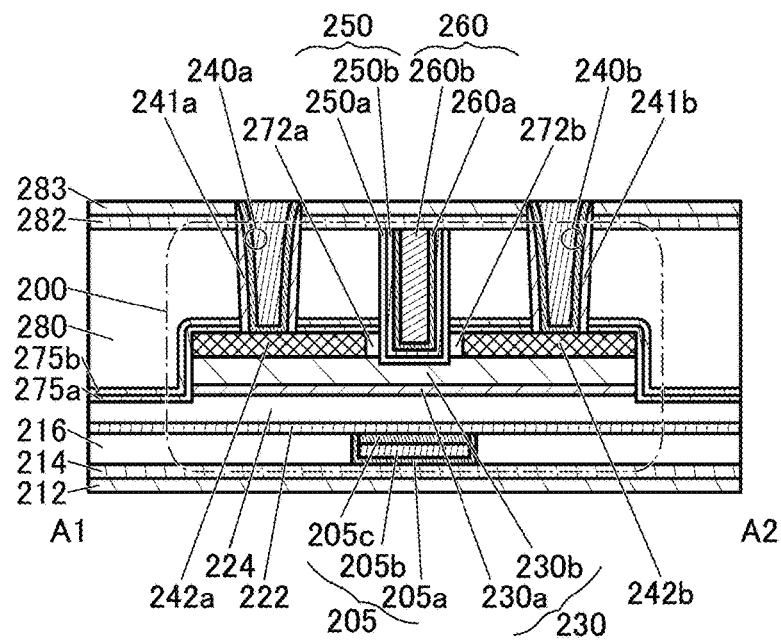
Figure 13D:
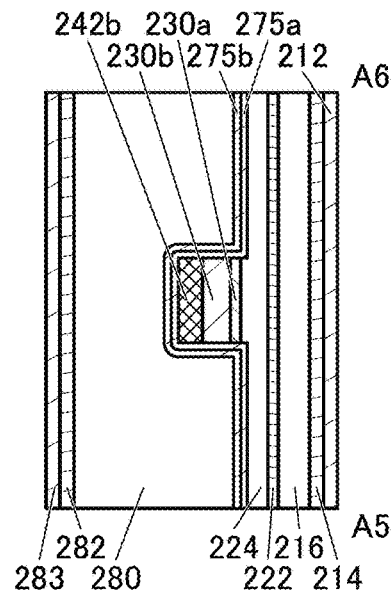

Then, an opening reaching the conductor 242a and an opening reaching the conductor 242b are formed in the insulator 275, the insulator 280, the insulator 282, and the insulator 283 (see FIG. 13A and FIG. 13D). The openings are formed by a lithography method. Note that the openings in the top view of FIG. 13A each have a circular shape; however, the shapes of the openings are not limited thereto. For example, the openings in the top view may have an almost circular shape such as an elliptical shape, a polygonal shape such as a quadrangular shape, or a polygonal shape such as a quadrangular shape with rounded corners.

Next, an insulating film to be the insulator 241a and the insulator 241b is formed and the insulating film is subjected to anisotropic etching, so that the insulator 241a and the insulator 241b are formed. (See FIG. 13A to FIG. 13D). The insulating film can be formed by a sputtering method, a CVD method, an MBE method, a PLD method, an ALD method, or the like. As the insulating film, an insulating film having a function of inhibiting the passage of oxygen is preferably used. For example, an aluminum oxide film is preferably formed by an ALD method. Alternatively, a silicon nitride film is preferably formed by a PEALD method. Silicon nitride is preferable because of its high blocking property against hydrogen.

For the anisotropic etching of the insulating film to be the insulator 241a and the insulator 241b, a dry etching method is employed, for example. Providing the insulator 241a and the insulator 241b on the side wall portions of the openings can inhibit passage of oxygen from the outside and can prevent oxidation of the conductor 240a and the conductor 240b to be formed next. Furthermore, impurities such as water and hydrogen can be prevented from diffusing from the conductor 240a and the conductor 240b to the outside.

Next, a conductive film to be the conductor 240a and the conductor 240b is formed. The conductive film preferably has a stacked-layer structure including a conductor having a function of inhibiting the passage of impurities such as water and hydrogen. For example, a stack of tantalum nitride, titanium nitride, or the like and tungsten, molybdenum, copper, or the like can be employed. The conductive film can be formed by a sputtering method, a CVD method, an MBE method, a PLD method, an ALD method, or the like.

Then, part of the conductive film to be the conductor 240a and the conductor 240b is removed by CMP treatment to expose the top surface of the insulator 283. As a result, the conductive film remains only in the openings, so that the conductor 240a and the conductor 240b having flat top surfaces can be formed (see FIG. 13A to FIG. 13D. See). Note that the top surface of the insulator 283 is partly removed by the CMP treatment in some cases.

Next, a conductive film to be the conductor 246a and the conductor 246b is formed. The conductive film can be formed by a sputtering method, a CVD method, an MBE method, a PLD method, an ALD method, or the like.

Next, the conductive film to be the conductor 246a and the conductor 246b is processed by a lithography method to form the conductor 246a in contact with the top surface of the conductor 240a and the conductor 246b in contact with the top surface of the conductor 240b. At this time, part of the insulator 283 in a region where the conductor 246a and the conductor 246b do not overlap the insulator 283 is removed in some cases.

Next, the insulator 286 is formed over the conductor 246a, the conductor 246b, and the insulator 283. The insulator 286 can be formed by a sputtering method, a CVD method, an MBE method, a PLD method, an ALD method, or the like. In addition, the insulator 286 may have a multilayer structure. For example, silicon nitride may be deposited by a sputtering method and silicon nitride may be deposited by a CVD method over the silicon nitride.

Through the above steps, the semiconductor device including the transistor 200 illustrated in FIG. 1A to FIG. 1D can be manufactured. As illustrated in FIG. 5A to FIG. 13D, the transistor 200 can be manufactured with the use of the method for manufacturing the semiconductor device described in this embodiment.

<Modification Examples of Semiconductor Device>

Examples of the semiconductor device of one embodiment of the present invention will be described below with reference to FIG. 14A to FIG. 16D.

Figure 14A:
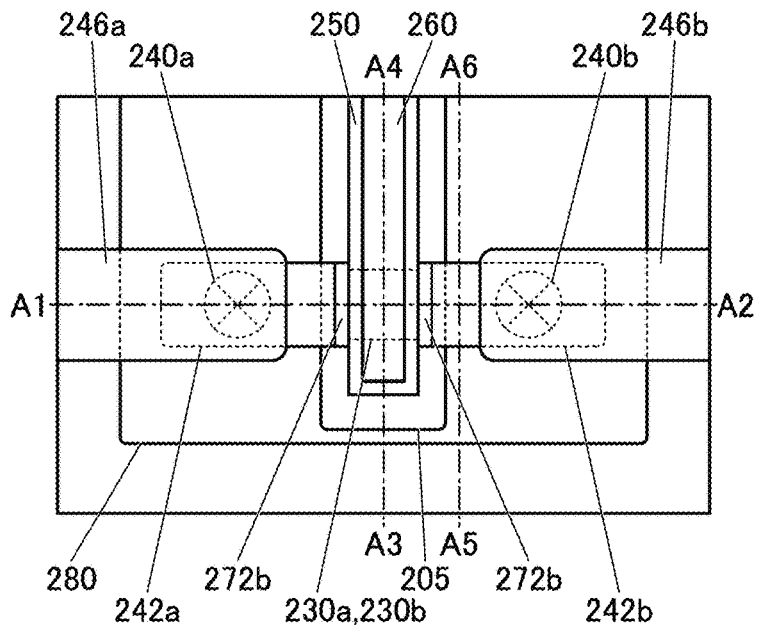
FIG. 14A is a top view of a semiconductor device of one embodiment of the present invention.
Figure 14C:
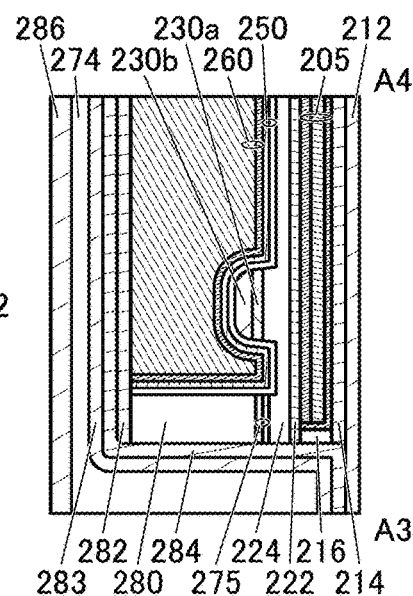
FIG. 14B to FIG. 14D are cross-sectional views of the semiconductor device of one embodiment of the present invention.
Figure 14B:
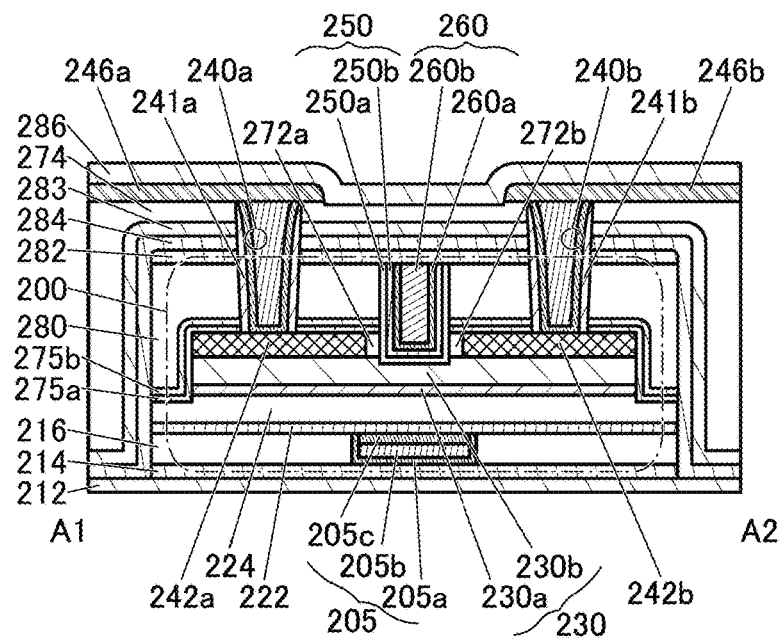
Figure 14D:
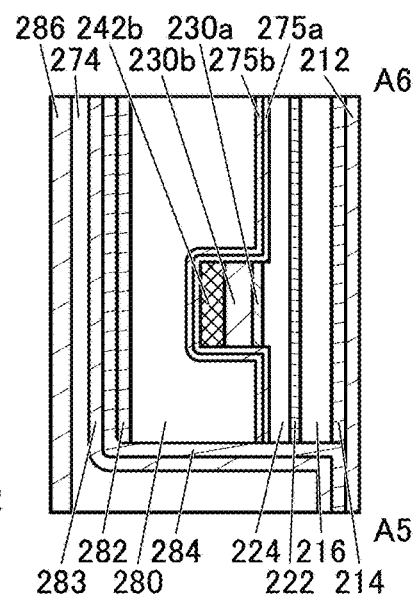
Figure 15A:
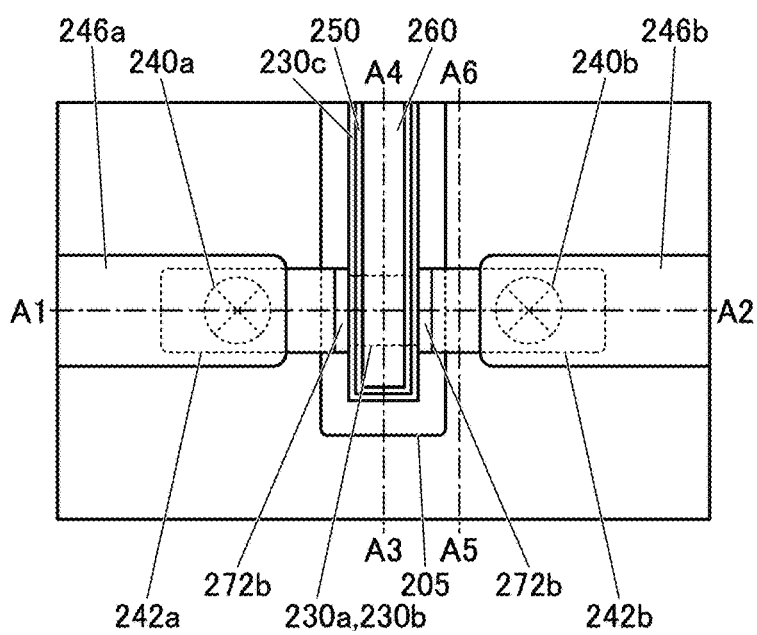
FIG. 15A is a top view of a semiconductor device of one embodiment of the present invention.
Figure 15C:
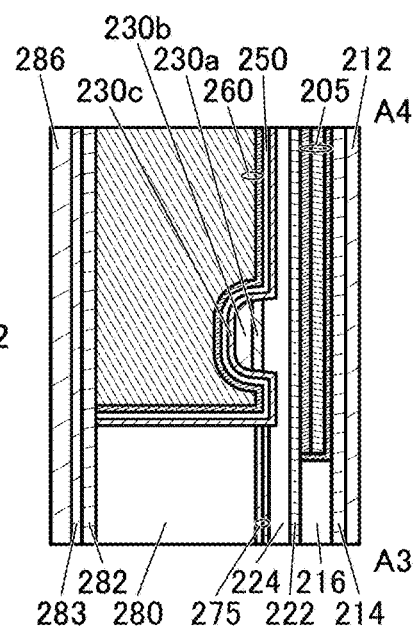
FIG. 15B to FIG. 15D are cross-sectional views of the semiconductor device of one embodiment of the present invention.
Figure 15B:
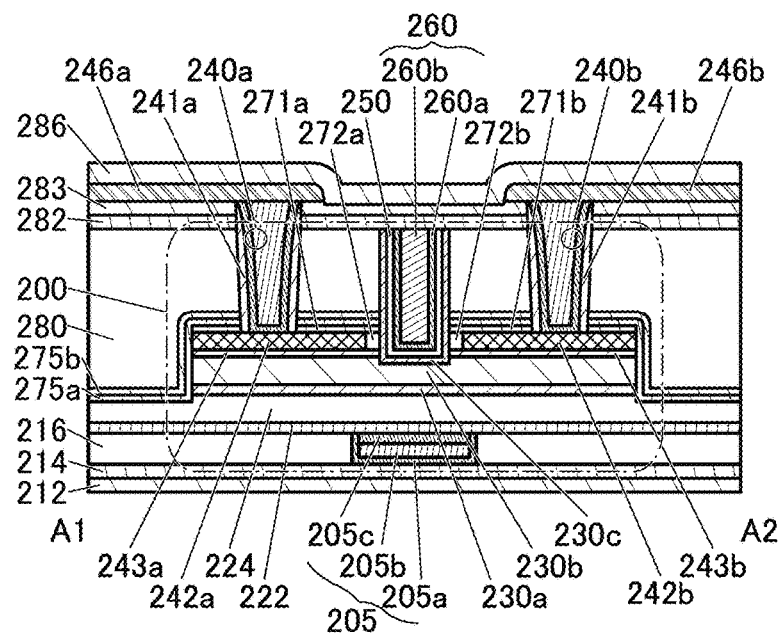
Figure 15D:
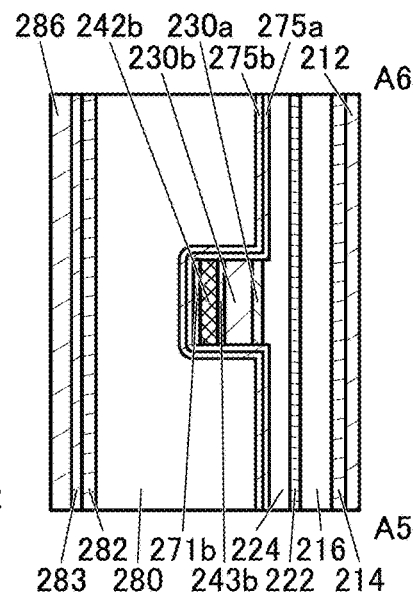
Figure 16A:
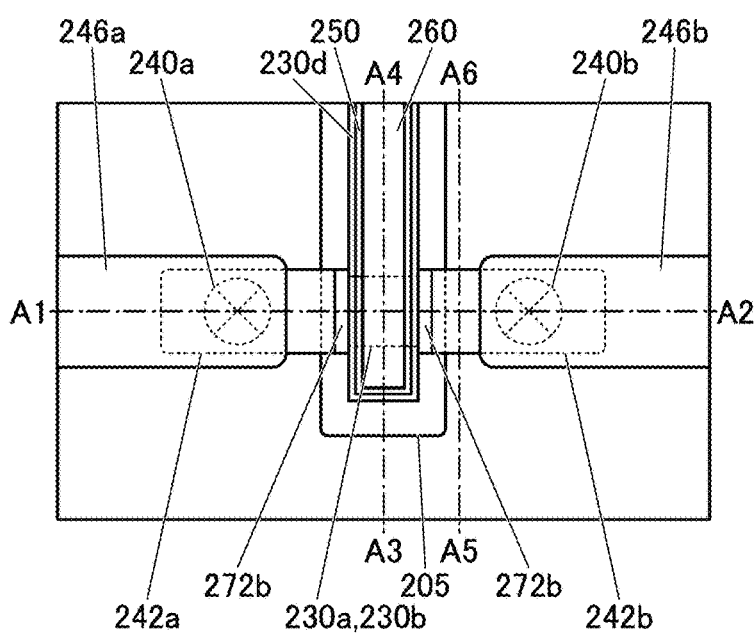
FIG. 16A is a top view of a semiconductor device of one embodiment of the present invention.
Figure 16C:
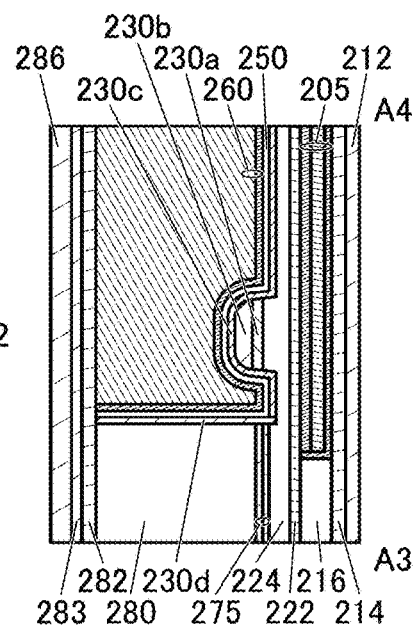
FIG. 16B to FIG. 16D are cross-sectional views of the semiconductor device of one embodiment of the present invention.
Figure 16B:
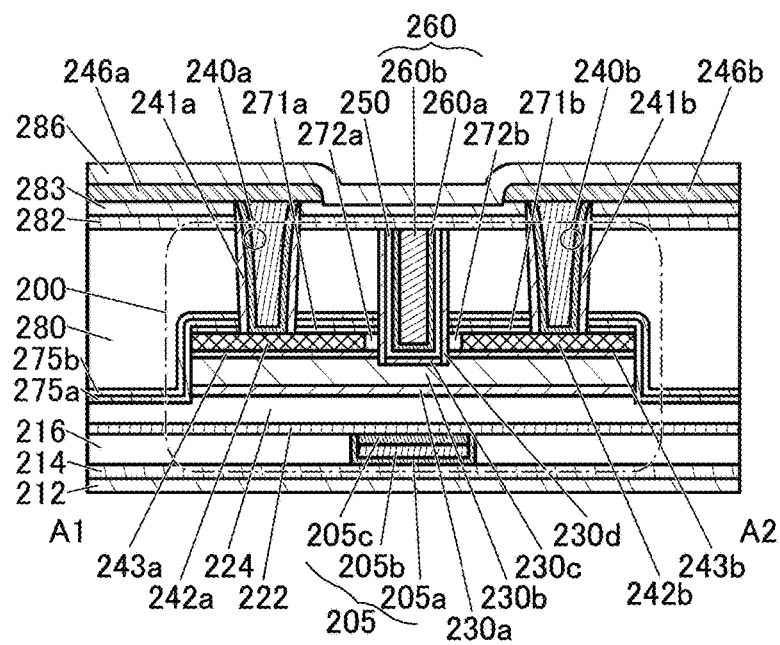
Figure 16D:
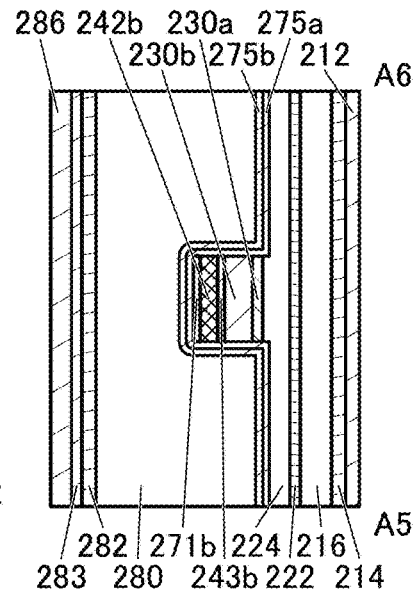

FIG. 14A, FIG. 15A, and FIG. 16A are top views of semiconductor devices. FIG. 14B, FIG. 15B, and FIG. 16B are cross-sectional views of portions indicated by the dashed-dotted line A1-A2 in FIG. 14A, FIG. 15A, and FIG. 16A, respectively. FIG. 14C, FIG. 15C, and FIG. 16C are cross-sectional views of portions indicated by the dashed-dotted line A3-A4 in FIG. 14A, FIG. 15A, and FIG. 16A, respectively. FIG. 14D, FIG. 15D, and FIG. 16D are cross-sectional views of portions indicated by the dashed-dotted line A5-A6 in FIG. 14A, FIG. 15A, and FIG. 16A, respectively. For clarity of the drawings, some components are not illustrated in the top views of FIG. 14A, FIG. 15A, and FIG. 16A.

In the semiconductor devices illustrated in FIG. 14A to FIG. 16D, components having the same functions as the components included in the semiconductor device described in <Structure example of semiconductor device> are denoted by the same reference numerals. Note that the materials described in detail in <Structure example of semiconductor device> and the like can also be used as constituent materials of the semiconductor devices in this section.

Modification Example 1 of Semiconductor Device

The semiconductor device illustrated in FIG. 14A to FIG. 14D is a modification example of the semiconductor device illustrated in FIG. 1A to FIG. 1D. The semiconductor device illustrated in FIG. 14A to FIG. 14D is different from the semiconductor device illustrated in FIG. 1A to FIG. 1D in the shape of the insulator 283. Another difference is that an insulator 284 and an insulator 274 are included.

In the semiconductor device illustrated in FIG. 14A to FIG. 14D, the insulator 214, the insulator 216, the insulator 222, the insulator 224, the insulator 275, the insulator 280, and the insulator 282 are patterned. The insulator 284 covers the insulator 214, the insulator 216, the insulator 222, the insulator 224, the insulator 275, the insulator 280, and the insulator 282. That is, the insulator 284 is in contact with a top surface of the insulator 282, side surfaces of the insulator 214, the insulator 216, the insulator 222, the insulator 224, the insulator 275, the insulator 280, and the insulator 282, and a top surface of the insulator 212. In addition, the insulator 283 is provided to cover the insulator 284. Accordingly, the oxide 230, the insulator 214, the insulator 216, the insulator 222, the insulator 224, the insulator 275, the insulator 280, and the insulator 282 are isolated from the outside by the insulator 283, the insulator 284, and the insulator 212. In other words, the transistor 200 is located in a region sealed by the insulator 283, the insulator 284, and the insulator 212.

For example, the insulator 214, the insulator 275, the insulator 282, and the insulator 284 are formed using a material having a function of trapping and fixing hydrogen. As the insulator 284, an insulator similar to the insulator 282 can be used. The insulator 212 and the insulator 283 are formed using a material having a function of inhibiting the diffusion of hydrogen and oxygen. A metal oxide, such as aluminum oxide, having an amorphous structure, can be used as the insulator 214, the insulator 275, the insulator 282, and the insulator 284. Typically, silicon nitride can be used for the insulator 212 and the insulator 283. In particular, aluminum oxide having an amorphous structure or aluminum oxide with an amorphous structure is preferably used as the insulator 284, in which case hydrogen can be trapped or fixed more effectively. Accordingly, the transistor 200 and the semiconductor device with favorable characteristics and high reliability can be manufactured.

The above structure makes it possible to inhibit the entry of hydrogen contained in a region outside the sealed region into the sealed region.

The transistor 200 illustrated in FIG. 14A to FIG. 14D has a structure in which the insulator 212 and the insulator 283 are each provided as a single layer; however, the present invention is not limited thereto. For example, each of the insulator 212 and the insulator 283 may have a stacked-layer structure of two or more layers.

The insulator 274 is provided to cover the insulator 283 and functions as an interlayer film. The permittivity of the insulator 274 is preferably lower than that of the insulator 214. When a material with a low permittivity is used for an interlayer film, parasitic capacitance generated between wirings can be reduced. The insulator 274 can be provided using a material similar to that for the insulator 280, for example.

Modification Example 2 of Semiconductor Device

The semiconductor device illustrated in FIG. 15A to FIG. 15D is a modification example of the semiconductor device illustrated in FIG. 1A to FIG. 1D. The semiconductor device illustrated in FIG. 15A to FIG. 15D is different from the semiconductor device illustrated in FIG. 1A to FIG. 1D in that an oxide 230c, an insulator 271a, an insulator 271b, an oxide 243a, and an oxide 243b are included.

The oxide 243a and the oxide 243b are provided over the oxide 230b. The oxide 243a and the oxide 243b are provided to be apart from each other with the conductor 260 therebetween.

The oxide 243a and the oxide 243b preferably have a function of inhibiting the passage of oxygen. The oxide 243a (the oxide 243b) having a function of inhibiting the passage of oxygen is preferably provided between the oxide 230b and the conductor 242a (the conductor 242b) functioning as the source electrode or the drain electrode, in which case the electric resistance between the conductor 242a (the conductor 242b) and the oxide 230b can be reduced. Such a structure makes it possible to improve the electrical characteristics of the transistor 200 and the reliability of the transistor 200. In the case where the electric resistance between the oxide 230b and the conductor 242a or the conductor 242b can be sufficiently reduced, the oxide 243a or the oxide 243b is not necessarily provided.

A metal oxide containing the element M may be used as the oxide 243a and the oxide 243b. In particular, aluminum, gallium, yttrium, or tin is preferably used as the element M. The concentration of the element M in the oxide 243a and the oxide 243b is preferably higher than that in the oxide 230b. Gallium oxide may be used as the oxide 243a and the oxide 243b. A metal oxide such as an In-M-Zn oxide may be used as the oxide 243a and the oxide 243b. Specifically, the atomic ratio of the element M to In in the metal oxide used as the oxide 243a and the oxide 243b is preferably greater than the atomic ratio of the element M to In in the metal oxide used as the oxide 230b. The thicknesses of the oxide 243a and the oxide 243b are preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243a and the oxide 243b preferably have crystallinity. With the oxide 243a and the oxide 243b having crystallinity, release of oxygen in the oxide 230 can be suitably inhibited. When the oxide 243a and the oxide 243b have a hexagonal crystal structure, for example, release of oxygen in the oxide 230 can sometimes be inhibited.

The insulator 271a is provided in contact with the top surface of the conductor 242a, and the insulator 271b is provided in contact with the top surface of the conductor 242b. The insulator 271a and the insulator 271b preferably function as at least a barrier insulating film against oxygen. Thus, the insulator 271a and the insulator 271b preferably have a function of inhibiting the diffusion of oxygen. For example, the insulator 271a and the insulator 271b preferably have a function of further inhibiting the diffusion of oxygen as compared to the insulator 280. For example, a nitride containing silicon such as silicon nitride is used as the insulator 271a and the insulator 271b. The insulator 271a and the insulator 271b preferably have a function of trapping impurities such as hydrogen. In that case, as the insulator 271a and the insulator 271b, an insulator such as a metal oxide having an amorphous structure, e.g., aluminum oxide or magnesium oxide, is used. In particular, aluminum oxide having an amorphous structure or aluminum oxide with an amorphous structure is preferably used as the insulator 271a and the insulator 271b, in which case hydrogen can be trapped or fixed more effectively. Accordingly, the transistor 200 and the semiconductor device with favorable characteristics and high reliability can be manufactured.

When the above insulator 271a and the insulator 271b are provided, the conductor 242a and the conductor 242b can be surrounded by the insulators having a barrier property against oxygen. That is, oxygen added during the deposition of the insulator 275 can be inhibited from diffusing into the conductor 242a and the conductor 242b. This makes it possible to inhibit an increase in the resistivity of the conductor 242a and the conductor 242b due to oxidation with oxygen added during the deposition of the insulator 275 and a reduction of on-state current.

When the insulator 275 has a sufficient barrier property against oxygen and the like, the insulator 271a and the insulator 271b are not necessarily provided.

The oxide 230c is provided in the opening formed in the insulator 280 and the insulator 275. The oxide 230c is in contact with a side surface of the oxide 243a, a side surface of the oxide 243b, a side surface of the oxide 272a, a side surface of the oxide 272b, a side surface of the insulator 271a, a side surface of the insulator 271b, and a side surface of the insulator 275. A top surface of the oxide 230c is in contact with the insulator 282. The oxide 230c has a region overlapping the oxide 230b.

In a cross-sectional view of the transistor in the channel length direction, it is preferable that a groove portion be provided in the oxide 230b and the oxide 230c be embedded in the groove portion. At this time, the oxide 230c is provided to cover an inner wall (a side wall and a bottom surface) of the groove portion. It is preferable that the thickness of the oxide 230c be approximately the same as the depth of the groove portion. With such a structure, even when the opening in which the conductor 260 and the like are embedded is formed and a damaged region is formed on the surface of the oxide 230b at the bottom portion of the opening, the damaged region can be removed. Accordingly, poor electrical characteristics of the transistor 200 due to the damaged region can be reduced.

In order to make the oxide 230c serve as a main carrier path, the atomic ratio of indium to a metal element that is a main component in the oxide 230c is preferably higher than the atomic ratio of indium to a metal element that is a main component in the oxide 230b. Furthermore, the atomic ratio of In to the element M in the oxide 230c is preferably greater than the atomic ratio of In to the element M in the oxide 230b. When a metal oxide having a high content of indium is used for a channel formation region, the on-state current of the transistor can be increased. Accordingly, when the atomic ratio of indium to a metal element that is a main component of the oxide 230c is higher than the atomic ratio of indium to a metal element that is a main component in the oxide 230b, the oxide 230c can serve as a main carrier path. The conduction band minimum of the oxide 230c is preferably farther from the vacuum level than the conduction band minimum of the oxide 230a and the oxide 230b. In other words, the electron affinity of the oxide 230c is preferably larger than that of the oxide 230a and the oxide 230b. At this time, the oxide 230c serves as a main carrier path.

As the oxide 230c, specifically, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, indium oxide, or the like may be used. Note that a composition in the neighborhood includes ±30% of an intended atomic ratio. Gallium is preferably used as the element M.

In addition, a CAAC-OS is preferably used for the oxide 230c; the c-axis of a crystal included in the oxide 230c is preferably aligned in a direction substantially perpendicular to the formation surface or top surface of the oxide 230c. The CAAC-OS has a property of making oxygen move easily in the direction perpendicular to the c-axis. Thus, oxygen contained in the oxide 230c can be efficiently supplied to the oxide 230b.

Note that the oxide 230c may be provided for each of the transistors 200. That is, the oxide 230c of the transistor 200 is not necessarily in contact with the oxide 230c of the adjacent transistor 200. The oxide 230c of the transistor 200 may be apart from the oxide 230c of the adjacent transistor 200. In other words, a structure in which the oxide 230c is not provided between the transistor 200 and the adjacent transistor 200 may be employed.

When the above structure is employed for the semiconductor device in which a plurality of transistors 200 are arranged in the channel width direction, the oxide 230c is independently provided in each transistor 200. Accordingly, generation of a parasitic transistor between the transistor 200 and another transistor 200 adjacent to the transistor 200 and generation of the leakage path can be prevented. Thus, a semiconductor device that has favorable electrical characteristics and can be miniaturized or highly integrated can be provided.

Modification Example 3 of Semiconductor Device

The semiconductor device illustrated in FIG. 16A to FIG. 16D is a modification example of the semiconductor device illustrated in FIG. 15A to FIG. 15D. The semiconductor device illustrated in FIG. 16A to FIG. 16D is different from the semiconductor device illustrated in FIG. 15A to FIG. 15D in the shape of the oxide 230c. Another difference is that an oxide 230d is included.

The oxide 230d is provided in contact with a side surface of an opening formed in the insulator 280 and the insulator 275. The oxide 230d is in contact with a side surface of the oxide 243a, a side surface of the oxide 243b, a side surface of the oxide 272a, a side surface of the oxide 272b, a side surface of the insulator 271a, a side surface of the insulator 271b, and a side surface of the insulator 275. A top surface of the oxide 230d is in contact with the insulator 282.

The oxide 230c is provided in contact with a bottom surface of the opening formed in the insulator 280 and the insulator 275. The oxide 230c is in contact with a top surface of the oxide 230b and a side surface of the oxide 230d.

The oxide 230d is preferably a metal oxide that inhibits the diffusion or passage of oxygen more readily than the oxide 230c. Providing the oxide 230d between the insulator 250 and the conductor 242a and between the insulator 250 and the conductor 242b can prevent oxygen contained in the insulator 280 from being absorbed by the conductor 242a and the conductor 242b. Accordingly, the oxygen can be efficiently supplied to the oxide 230b through the oxide 230c.

The oxide 230d preferably contains at least one of the metal elements contained in the metal oxide used as the oxide 230c, and further preferably contains all of these metal elements. For example, it is preferable that an In-M-Zn oxide, an In—Zn oxide, or an indium oxide be used as the oxide 230c and an In-M-Zn oxide, an M-Zn oxide, or an oxide of the element M be used as the oxide 230d.

Specifically, as the oxide 230c, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, or indium oxide may be used. As the oxide 230d, a metal oxide with In:M:Zn=1:3:4 [atomic ratio] or a composition in the neighborhood thereof, M:Zn=2:1 [atomic ratio] or a composition in the neighborhood thereof, M:Zn=2:5 [atomic ratio] or a composition in the neighborhood thereof, or an oxide of the element M may be used. Note that a composition in the neighborhood includes the range of ±30% of an intended atomic ratio. Gallium is preferably used as the element M.

In the above structure, the oxide 230d is presumed to have lower conductivity than the oxide 230b and the oxide 230c. Thus, the oxide 272a and the oxide 230d can be collectively referred to as semi-insulator (SI) in some cases. In addition, the oxide 272b and the oxide 230d can be collectively referred to semi-insulator (SI) in some cases. In other words, a film that is positioned over the region 237a and on a side edge of the conductor 242a can be referred to as a composite film or a multilayer film of the oxide 272a and the oxide 230d in some cases. In addition, a film that is positioned over the region 237b and on a side edge of the conductor 242b can be referred to as a composition film or a multilayer film of the oxide 272b and the oxide 230d.

<Application Example of Semiconductor Device>

Examples of a semiconductor device including the transistor 200 of one embodiment of the present invention which is different from the semiconductor device described in the above <Structure example of semiconductor device> and the above <Modification example of semiconductor device> will be described below with reference to FIG. 17A and FIG. 17B. Note that in the semiconductor devices illustrated in FIG. 17A and FIG. 17B, structures having the same functions as the structures in the semiconductor device described in <Modification example 1 of semiconductor device> (see FIG. 14A to FIG. 14D) are denoted by the same reference numerals. Note that in this section, the materials described in detail in <Structure example of semiconductor device> and <Modification example of semiconductor device> can be used as the materials for the transistor 200.

Figure 17A:
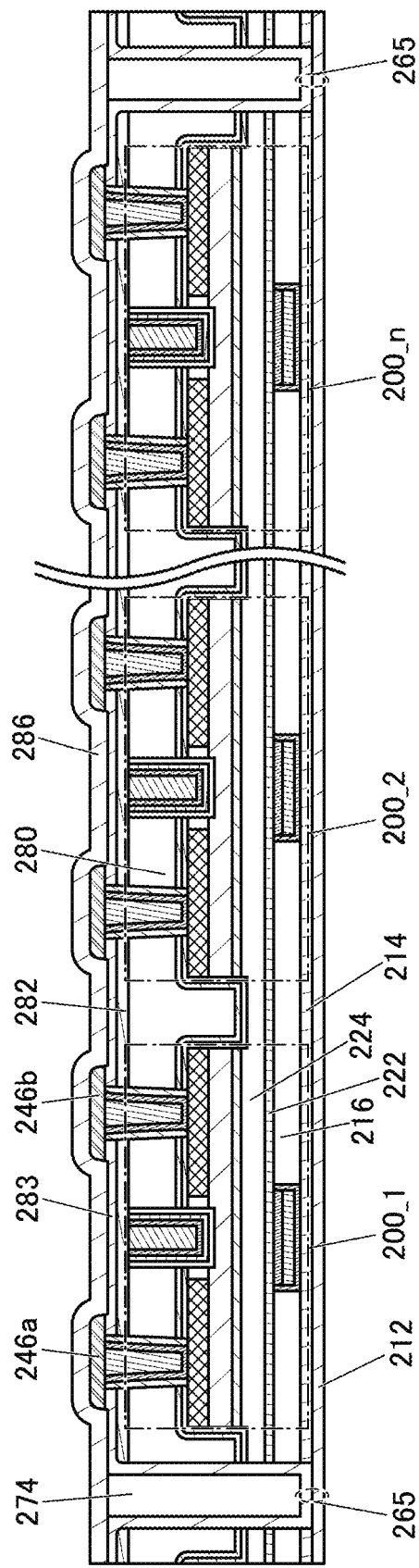
FIG. 17A and FIG. 17B are cross-sectional views of semiconductor devices of one embodiment of the present invention.
Figure 17B:
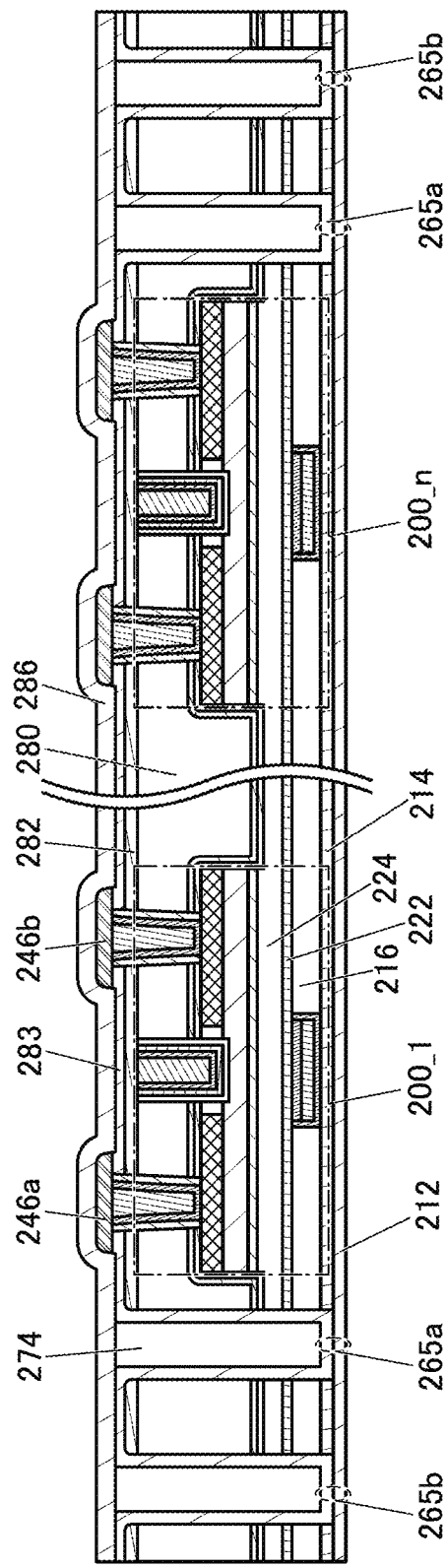

FIG. 17A and FIG. 17B each illustrate a structure in which a plurality of transistors (a transistor 200_1 to a transistor 200_n) are collectively sealed with the insulator 283 and the insulator 212. Note that although the transistor 200_1 to the transistor 200_n appear to be arranged in the channel length direction in FIG. 17A and FIG. 17B, the present invention is not limited thereto. The transistor 200_1 to the transistor 200_n may be arranged in the channel width direction or may be arranged in a matrix. Depending on the design, the transistors may be arranged without regularity.

As illustrated in FIG. 17A, a portion where the insulator 283 is in contact with the insulator 212 (hereinafter, sometimes referred to as a sealing portion 265) is formed outside the plurality of transistors (the transistor 200_1 to the transistor 200_n). The sealing portion 265 is formed to surround the plurality of transistors (also referred to as a transistor group). With such a structure, the plurality of transistors can be surrounded by the insulator 283 and the insulator 212. Thus, a plurality of transistor groups surrounded by the sealing portions 265 are provided over a substrate.

A dicing line (sometimes referred to as a scribe line, a dividing line, or a cutting line) may be provided to overlap the sealing portion 265. The above substrate is divided at the dicing line, so that the transistor group surrounded by the sealing portion 265 is taken out as one chip.

Although FIG. 17A illustrates an example in which the plurality of transistors (the transistor 200_1 to the transistor 200_n) are surrounded by one sealing portion 265, the present invention is not limited thereto. As illustrated in FIG. 17B, the plurality of transistors 200_1 to 200_n may be surrounded by a plurality of sealing portions. In FIG. 17B, the transistor 200_1 to the transistor 200_n are surrounded by a sealing portion 265a and are further surrounded by an outer sealing portion 265b.

When the plurality of transistors (the transistor 200_1 to the transistor 200_n) are surrounded by a plurality of sealing portions in this manner, the area of a portion where the insulator 283 is in contact with the insulator 212 increases, improving the adhesion between the insulator 283 and the insulator 212. Accordingly, the plurality of transistors can be more reliably sealed.

In that case, a dicing line may be provided to overlap the sealing portion 265a or the sealing portion 265b or may be provided between the sealing portion 265a and the sealing portion 265b.

Unlike the transistor 200 illustrated in FIG. 14A to FIG. 14D, each of the transistors illustrated in FIG. 17A and FIG. 17B has a structure in which a top surface of the insulator 274 is substantially level with a top surface of the insulator 283. In addition, the insulator 284 is not provided. The present invention is not limited thereto; for example, the insulator 274 may cover the insulator 283 or the insulator 284 may be provided.

According to one embodiment of the present invention, a semiconductor device with a small variation in transistor characteristics can be provided. According to another embodiment of the present invention, a highly reliable semiconductor device can be provided. According to another embodiment of the present invention, a semiconductor device with favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

The structure, method, and the like described in this embodiment can be used in an appropriate combination with other structures, methods, and the like described in this embodiment or the other embodiments.

Embodiment 2

Figure 18:
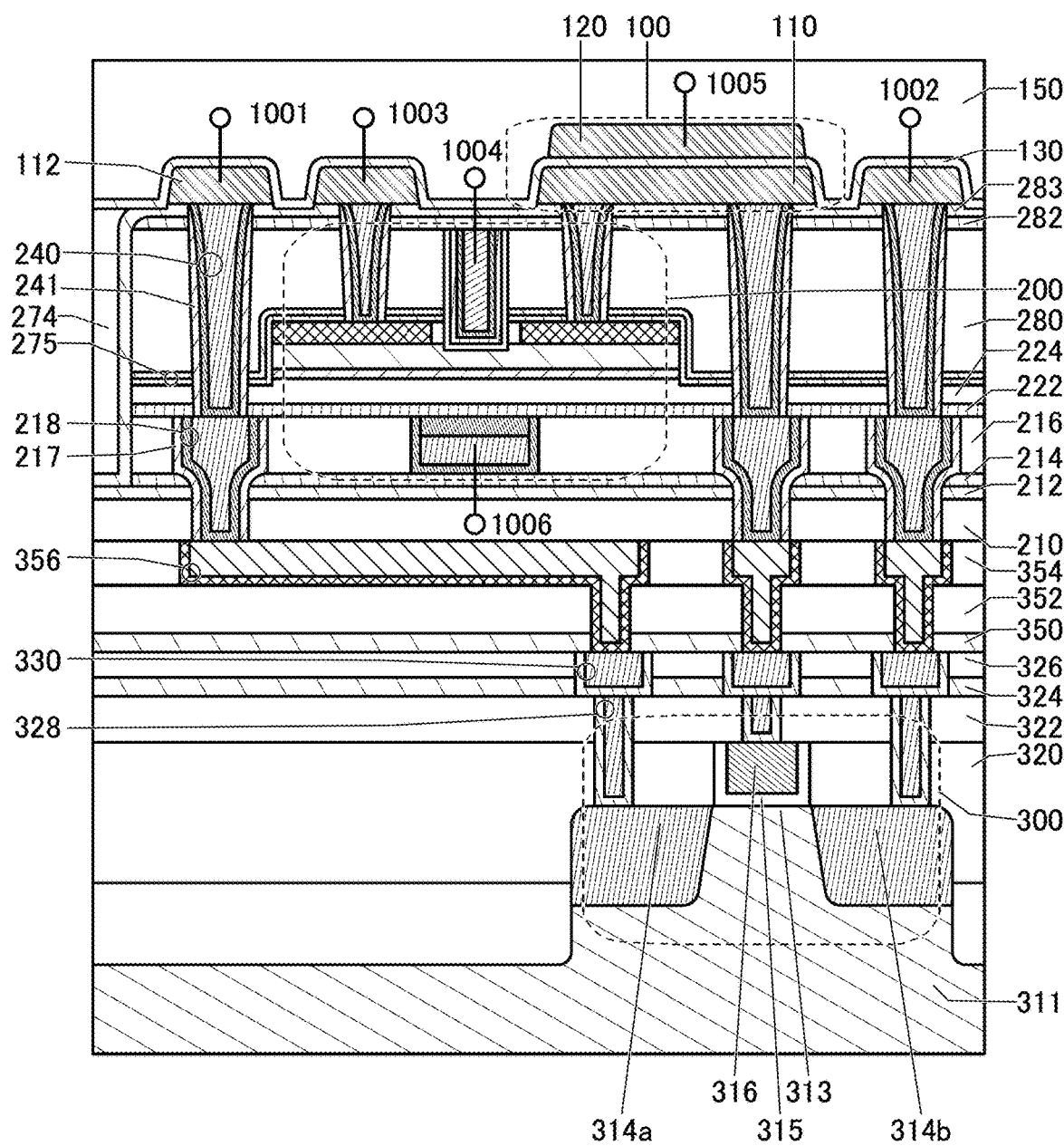
FIG. 18 is a cross-sectional view illustrating a structure of a storage device of one embodiment of the present invention.

In this embodiment, one embodiment of a semiconductor device is described with reference to FIG. 18 to FIG. 23.
[Storage Device 1]
FIG. 18 illustrates an example of the semiconductor device (storage device) of one embodiment of the present invention. In the storage device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. Since the transistor 200 has a low off-state current, a storage device including the transistor 200 can retain stored data for a long time. In other words, such a storage device does not require refresh operation or has extremely low frequency of the refresh operation, which leads to a sufficient reduction in power consumption of the storage device.

In the semiconductor device illustrated in FIG. 18, a wiring 1001 is electrically connected to a source of the transistor 300, and a wiring 1002 is electrically connected to a drain of the transistor 300. A wiring 1003 is electrically connected to one of a source and a drain of the transistor 200, a wiring 1004 is electrically connected to a first gate of the transistor 200, and a wiring 1006 is electrically connected to a second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage devices illustrated in FIG. 18 can form a memory cell array when arranged in a matrix.
<Transistor 300>
The transistor 300 is provided on a substrate 311 and includes a conductor 316 functioning as a gate, an insulator 315 functioning as a gate insulator, a semiconductor region 313 that is part of the substrate 311, and a low-resistance region 314a and a low-resistance region 314b functioning as a source region and a drain region. The transistor 300 can be a p-channel transistor or an n-channel transistor.

Here, in the transistor 300 illustrated in FIG. 18, the semiconductor region 313 (part of the substrate 311) in which a channel is formed has a protruding shape. The conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be provided in contact with an upper portion of the protruding portion. Furthermore, although the protruding portion is formed by processing part of the semiconductor substrate is described here, a semiconductor film having a protruding shape may be formed by processing an SOI substrate.

Note that the transistor 300 illustrated in FIG. 18 is an example and the structure is not limited thereto; an appropriate transistor is used in accordance with a circuit structure or a driving method.
<Capacitor 100>
The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

The conductor 112 and the conductor 110 illustrated in FIG. 18 each have a single-layer structure; however, one embodiment of the present invention is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 130 can be formed to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high permittivity (high-k) material. In the capacitor 100 having such a structure, sufficient capacitance can be ensured owing to the high permittivity (high-k) material, and the dielectric strength can be increased owing to the insulator with high dielectric strength; thus, the electrostatic breakdown of the capacitor 100 can be inhibited.

Examples of the high permittivity (high-k) material (material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material having high dielectric strength (material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.
<Wiring Layer>
Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. In this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked in this order as interlayer films over the transistor 300. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, an insulator 350, an insulator 352, and an insulator 354 are stacked in this order in FIG. 18. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241a described in the above embodiment, an insulator 217 is provided in contact with a side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with a side surface of the conductor 205.

As the insulator 217, an insulator such as silicon nitride, aluminum oxide, or silicon nitride oxide is used. Since the insulator 217 is provided in contact with the insulator 210, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241a. For example, silicon nitride is deposited by a PEALD method and an opening reaching the conductor 356 is formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low relative permittivity is used for the insulator functioning as an interlayer film, the parasitic capacitance between wirings can be reduced. Thus, a material is preferably selected depending on the function of an insulator.

For example, for the insulator 150, the insulator 210, the insulator 352, the insulator 354, and the like, an insulator having a low relative permittivity is preferably used. For example, the insulators preferably contain silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting the passage of oxygen and impurities such as hydrogen, the electrical characteristics of the transistor can be stable. Thus, the insulator having a function of inhibiting the transmission of oxygen and impurities such as hydrogen can be used as the insulator 214, the insulator 212, the insulator 350, and the like.

As the insulator having a function of inhibiting the passage of oxygen and impurities such as hydrogen, a single layer or stacked layers of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for example, are used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor. In that case, an insulator having a barrier property is preferably provided between the insulator including the excess-oxygen region and a conductor provided in the insulator including the excess-oxygen region.

For example, in FIG. 18, the insulator 241 is preferably provided between the conductor 240 and the insulator 224 and the insulator 280 that contain excess oxygen. Since the insulator 241 is provided in contact with the insulator 222, the insulator 275, the insulator 282, and the insulator 283, the insulator 224 and the transistor 200 can be sealed with the insulators having a barrier property.

That is, providing the insulator 241 can inhibit excess oxygen contained in the insulator 224 and the insulator 280 from being absorbed by the conductor 240. In addition, providing the insulator 241 can inhibit the diffusion of hydrogen, which is an impurity, into the transistor 200 through the conductor 240.

The insulator 241 is preferably formed using an insulating material having a function of inhibiting the diffusion of impurities such as water or hydrogen and oxygen. For example, silicon nitride, silicon nitride oxide, aluminum oxide, hafnium oxide, or the like is preferably used. In particular, silicon nitride is preferable because of its high blocking property against hydrogen. Alternatively, for example, a metal oxide such as magnesium oxide, gallium oxide, germanium oxide, yttrium oxide, zirconium oxide, lanthanum oxide, neodymium oxide, or tantalum oxide can be used.

As described in the above embodiment, the transistor 200 may be sealed with the insulator 212, the insulator 214, the insulator 282, and the insulator 283. Such a structure can inhibit the entry of hydrogen contained in the insulator 274, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each formed in a chip form will be described below. Examples of a dividing method include the case where a groove (dicing line) for dividing semiconductor elements is formed on a substrate, and then the substrate is cut along the dicing line to divide (split) it into a plurality of semiconductor devices.

Here, for example, as illustrated in FIG. 18, a region in which the insulator 283 and the insulator 212 are in contact with each other is preferably designed to overlap the dicing line. That is, an opening is provided in the insulator 282, the insulator 280, the insulator 275, the insulator 224, the insulator 222, the insulator 216, and the insulator 214 in the vicinity of a region to be the dicing line that is provided on an outer edge of the memory cell including the plurality of transistors 200.

That is, in the opening provided in the insulator 282, the insulator 280, the insulator 275, the insulator 224, the insulator 222, the insulator 216, and the insulator 214, the insulator 212 is in contact with the insulator 283. Here, the insulator 212 and the insulator 283 may be formed using the same material and the same method, for example. When the insulator 212 and the insulator 283 are formed using the same material and the same method, the adhesion therebetween can be increased. For example, silicon nitride is preferably used.

With such a structure, the transistors 200 can be surrounded by the insulator 212, the insulator 214, the insulator 282, and the insulator 283. At least one of the insulator 212, the insulator 214, the insulator 282, and the insulator 283 has a function of inhibiting the diffusion of oxygen, hydrogen, and water; thus, even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and improved reliability.

Figure 19:
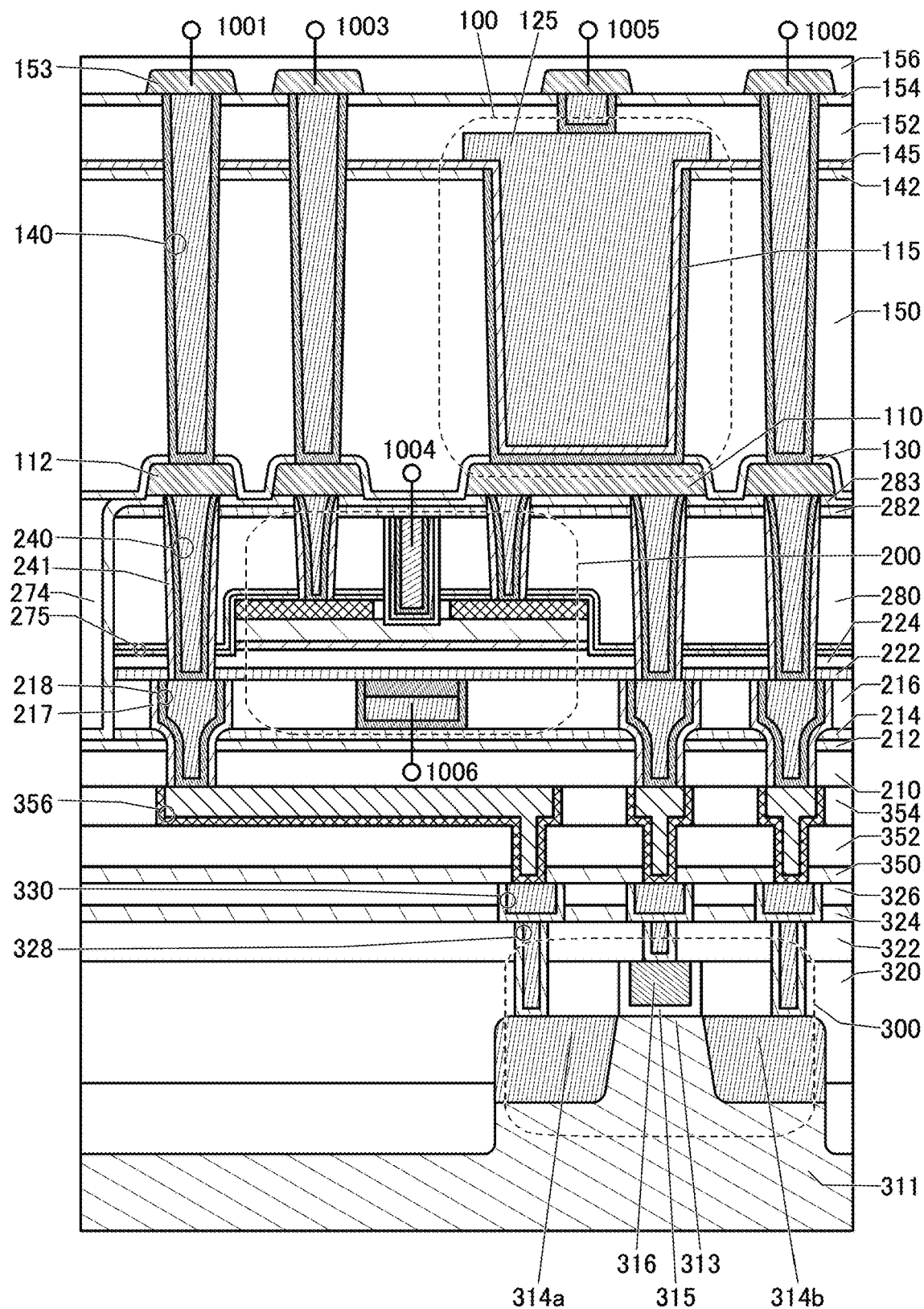
FIG. 19 is a cross-sectional view illustrating a structure of a storage device of one embodiment of the present invention.

Note that although the capacitor 100 of the storage device illustrated in FIG. 18 has a planar shape, the storage device described in this embodiment is not limited thereto. For example, the capacitor 100 may be a cylindrical capacitor as illustrated in FIG. 19. Note that the structure below and including the insulator 150 of a storage device illustrated in FIG. 19 is similar to that of the semiconductor device illustrated in FIG. 18.

The capacitor 100 illustrated in FIG. 19 includes the insulator 150 over the insulator 130, an insulator 142 over the insulator 150, a conductor 115 positioned in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are positioned in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on a side surface as well as a bottom surface of the opening in the insulator 150 and the insulator 142; thus, the capacitance per unit area can be increased. Hence, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap each other is preferably large in the top view. Such a structure can reduce the area occupied by the semiconductor device including the capacitor 100 and the transistor 200.

The conductor 115 is provided in contact with the opening formed in the insulator 142 and the insulator 150. A top surface of the conductor 115 is preferably substantially level with a top surface of the insulator 142. A bottom surface of the conductor 115 is in contact with the conductor 110 through an opening in the insulator 130. The conductor 115 is preferably formed by an ALD method, a CVD method, or the like; for example, a conductor that can be used as the conductor 205 is used.

The insulator 145 is provided to cover the conductor 115 and the insulator 142. The insulator 145 is preferably formed by, for example, an ALD method or a CVD method. The insulator 145 can be provided as stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure using a material with high dielectric strength and a high permittivity (high-k) material may be employed.

Examples of the high permittivity (high-k) material (material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of the material having high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator with high dielectric strength can increase the dielectric strength and inhibit electrostatic breakdown of the capacitor 100.

The conductor 125 is provided to fill the opening formed in the insulator 142 and the insulator 150. The conductor 125 is electrically connected to the wiring 1005 through a conductor 140 and a conductor 153. The conductor 125 is preferably formed by an ALD method, a CVD method, or the like; for example, a conductor that can be used as the conductor 205 is used.

The conductor 153 is provided over an insulator 154 and is covered with an insulator 156. The conductor 153 is formed using a conductor that can be used as the conductor 112, and the insulator 156 is formed using an insulator that can be used as the insulator 152. Here, the conductor 153 is in contact with a top surface of the conductor 140 and functions as a terminal of the capacitor 100, the transistor 200, or the transistor 300.

[Storage Device 2]

Figure 20A:
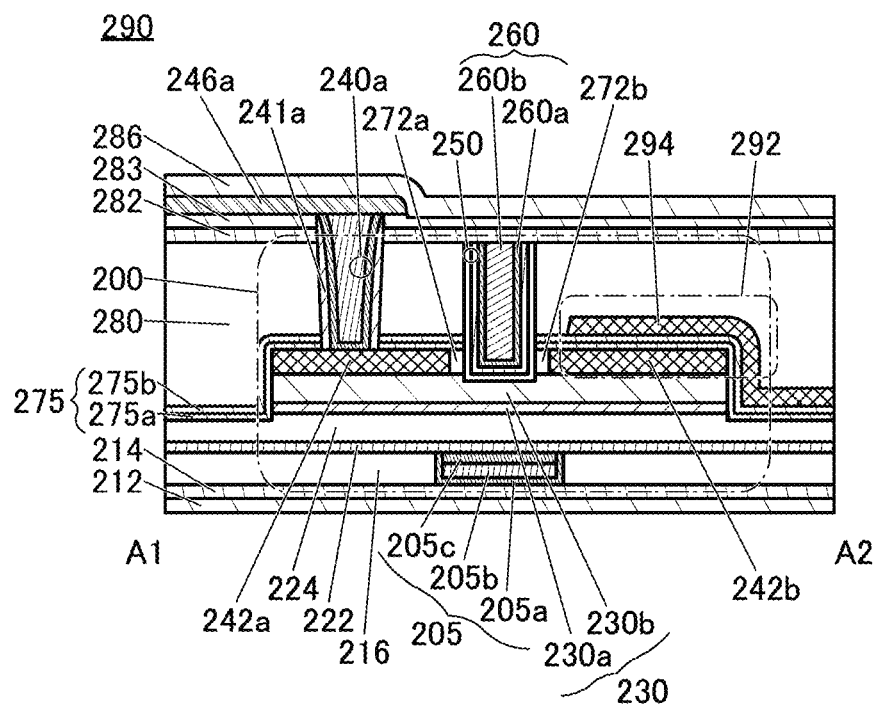
FIG. 20A and FIG. 20B are cross-sectional views of semiconductor devices of one embodiment of the present invention.
Figure 20B:
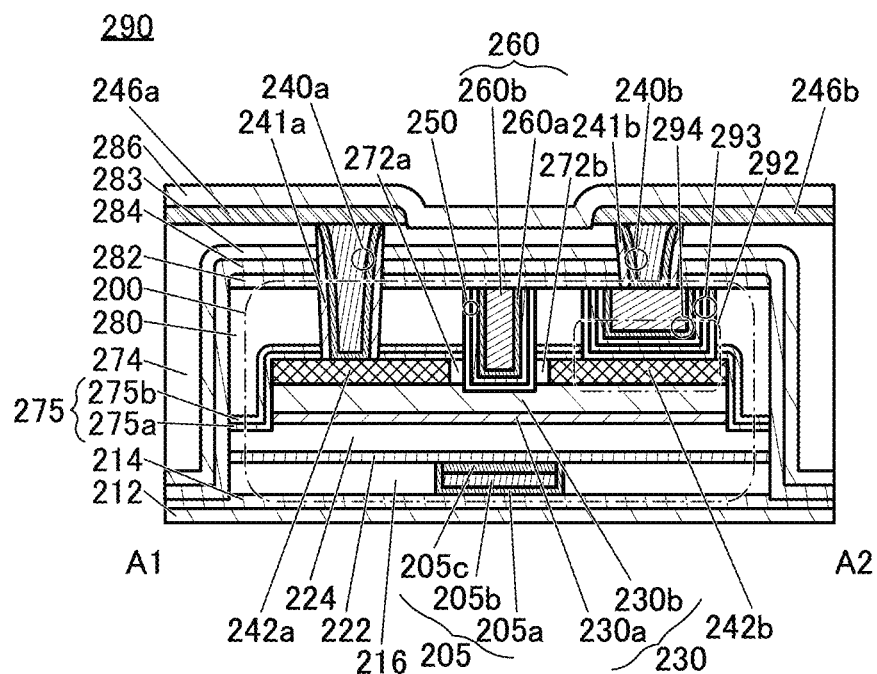

FIG. 20A and FIG. 20B each illustrate an example of the semiconductor device (storage device) of one embodiment of the present invention.

<Structure Example 1 of Memory Device>

FIG. 20A is a cross-sectional view of a semiconductor device including a memory device 290. The memory device 290 illustrated in FIG. 20A includes a capacitor device 292 besides the transistor 200 illustrated in FIG. 1A to FIG. 1D. FIG. 20A corresponds to a cross-sectional view of the transistor 200 in the channel length direction.

The capacitor device 292 includes the conductor 242*b*, the insulator 275 (the insulator 275*a* and the insulator 275*b*) provided in contact with a top surface and a side surface of the conductor 242*b*, and a conductor 294 over the insulator 275. In other words, the capacitor device 292 forms a MIM (Metal-Insulator-Metal) capacitor. Note that one of a pair of electrodes of the capacitor device 292, i.e., the conductor 242*b* can also serve as the source electrode or the drain electrode of the transistor. The dielectric layer of the capacitor device 292 can also serve as a protective layer provided in the transistor, i.e., the insulator 275. Thus, the manufacturing process of the capacitor device 292 can also serve as part of the manufacturing process of the transistor, improving the productivity of the semiconductor device. Since the one of the pair of electrodes of the capacitor device 292, i.e., the conductor 242*b* also serves as the source electrode or the drain electrode of the transistor, the area in which the transistor and the capacitor device are provided can be reduced.

The conductor 294 can be formed using, for example, a material that can be used for the conductor 242*a* and the conductor 242*b*.

<Structure Example 2 of Memory Device>

FIG. 20B is a cross-sectional view of a semiconductor device including the memory device 290, which has a structure different from the structure illustrated in FIG. 20A. The memory device 290 illustrated in FIG. 20B includes the capacitor device 292 besides the transistor 200 illustrated in FIG. 14A to FIG. 14D. Here, unlike the capacitor device 292 illustrated in FIG. 20A, part of the capacitor device 292 illustrated in FIG. 20B is provided in an opening formed in the insulator 280 and the insulator 275 (the insulator 275*a* and the insulator 275*b*). FIG. 20B corresponds to a cross-sectional view of the transistor 200 in the channel length direction.

The capacitor device 292 includes the conductor 242*b*, an insulator 293 provided over the conductor 242*b*, and the conductor 294 provided over the insulator 293. Here, the insulator 293 and the conductor 294 are provided in the opening formed in the insulator 280 and the insulator 275. The insulator 293 is provided in contact with a bottom surface and a side wall of the opening. That is, the insulator 293 is in contact with a top surface of the conductor 242b, a side surface of the insulator 275, a side surface of the insulator 280. The insulator 293 is provided to form a depressed portion along the shape of the opening. The conductor 294 is provided in contact with a side surface of the insulator 293 so as to fill the depressed portion. Note that top surfaces of the insulator 293 and the conductor 294 are substantially level with top surfaces of the insulator 280, the insulator 250, and the conductor 260 in some cases.

Here, the conductor 242b functions as a lower electrode of the capacitor device 292, the conductor 294 functions as an upper electrode of the capacitor device 292, and the insulator 293 functions as a dielectric of the capacitor device 292. Thus, the capacitor device 292 forms an MIM capacitor. Note that one of a pair of electrodes of the capacitor device 292, i.e., the conductor 242b can also serve as the source electrode or the drain electrode of the transistor. Thus, the manufacturing process of the capacitor device 292 can also serve as part of the manufacturing process of the transistor, improving the productivity of the semiconductor device. Since the insulator 293 can be provided independently of the structure of the transistor 200, a structure and a material of the insulator 293 can be selected as appropriate in accordance with performance required for the capacitor device 292. Since the one of the pair of electrodes of the capacitor device 292, i.e., the conductor 242b also serves as the source electrode or the drain electrode of the transistor, the area in which the transistor and the capacitor device are provided can be reduced.

The insulator 293 is preferably formed using a high permittivity (high-k) material. Examples of the high permittivity (high-k) material (material having a high relative permittivity) include gallium oxide, hafnium oxide, zirconium oxide, aluminum oxide, aluminum oxynitride, aluminum nitride oxide, aluminum nitride, hafnium oxide, hafnium oxynitride, hafnium nitride oxide, hafnium nitride, an oxide containing aluminum and hafnium, an oxynitride containing aluminum and hafnium, an oxide containing silicon and hafnium, an oxynitride containing silicon and hafnium, and a nitride containing silicon and hafnium. The insulator 293 may be a stack of films of these high permittivity materials. As the insulator 293, an insulating film in which zirconium oxide, aluminum oxide, and zirconium oxide are stacked in this order can be used, for example.

The conductor 294 can be formed using, for example, a material that can be used for the conductor 260. Like the conductor 260, the conductor 294 may have a stacked-layer structure.

Note that the insulator 293 and the conductor 294 are formed before the formation of the insulator 282, that is, after the step illustrated in FIG. 11A to FIG. 11D. The insulator 293 and the conductor 294 can be formed by a method similar to the method for forming the insulator 250 and the conductor 260. That is, the insulator 293 and the conductor 294 may be formed in such a manner that an opening is formed in the insulator 280 and the insulator 275, a stacked film to be the insulator 293 and the conductor 294 is formed to fill the opening, and the stacked film is partly removed by CMP treatment.

<Modification Example of Memory Device>

Examples of semiconductor devices including the transistor 200 and the capacitor device 292 of one embodiment of the present invention, which are different from the semiconductor device described in <Structure example 1 of memory device>, will be described below with reference to FIG. 21A, FIG. 21B, FIG. 22, and FIG. 23. Note that in the semiconductor devices illustrated in FIG. 21A, FIG. 21B, FIG. 22, and FIG. 23, structures having the same function as those included in the semiconductor devices described in the above embodiment and <Structure example 1 of memory device> (see FIG. 20A) are denoted by the same reference numerals. Note that the materials described in detail in the above embodiment and <Structure example 1 of memory device> can be used as constituent materials of the transistor 200 and the capacitor device 292 in this section. The memory device illustrated in FIG. 20A is used as the memory device in FIG. 21A, FIG. 21B, FIG. 22, FIG. 23, and the like; however, the present invention is not limited thereto. For example, the memory device illustrated in FIG. 20B or the like may be used.

Modification Example 1 of Memory Device

An example of a semiconductor device 600 of one embodiment of the present invention including a transistor 200a, a transistor 200b, a capacitor device 292a, and a capacitor device 292b will be described below with reference to FIG. 21A.

Figure 21A:
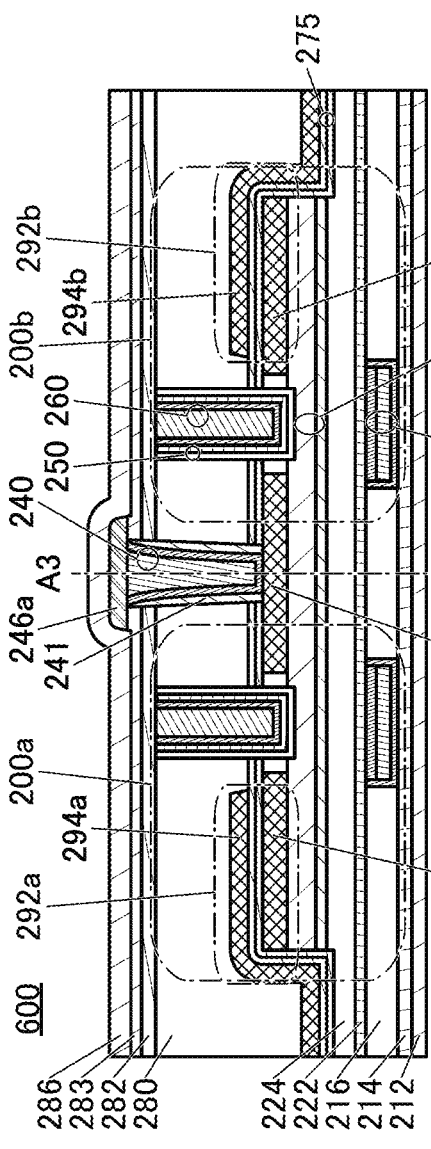
FIG. 21A and FIG. 21B are cross-sectional views of semiconductor devices of one embodiment of the present invention.

FIG. 21A is a cross-sectional view in the channel length direction of the semiconductor device 600 including the transistor 200a, the transistor 200b, the capacitor device 292a, and the capacitor device 292b. Here, the capacitor device 292a includes the conductor 242a, the insulator 275 provided in contact with a top surface and a side surface of the conductor 242a, and a conductor 294a provided to cover the insulator 275. The capacitor device 292b includes the conductor 242b, the insulator 275 provided in contact with a top surface and a side surface of the conductor 242b, and a conductor 294b provided to cover the insulator 275. The description of the conductor 294 in <Structure example 1 of memory device> or the like can be referred to for the conductor 294a and the conductor 294b.

The semiconductor device 600 has a line-symmetric structure with respect to dashed-dotted line A3-A4 as illustrated in FIG. 21A. A conductor 242c serves as one of a source electrode and a drain electrode of the transistor 200a and one of a source electrode and a drain electrode of the transistor 200b. Note that the insulator 275 is provided over the conductor 242c. The conductor 240 functioning as a plug connects the conductor 246a functioning as a wiring to the transistor 200a and the transistor 200b. With the above connection structure between the two transistors, the two capacitor devices, the wiring, and the plug, a semiconductor device that can be miniaturized or highly integrated can be provided.

The structure examples of the semiconductor device illustrated in FIG. 1A to FIG. 1D and FIG. 20A can be referred to for the structures and the effects of the transistor 200a, the transistor 200b, the capacitor device 292a, and the capacitor device 292b.

Modification Example 2 of Memory Device

Figure 21B:
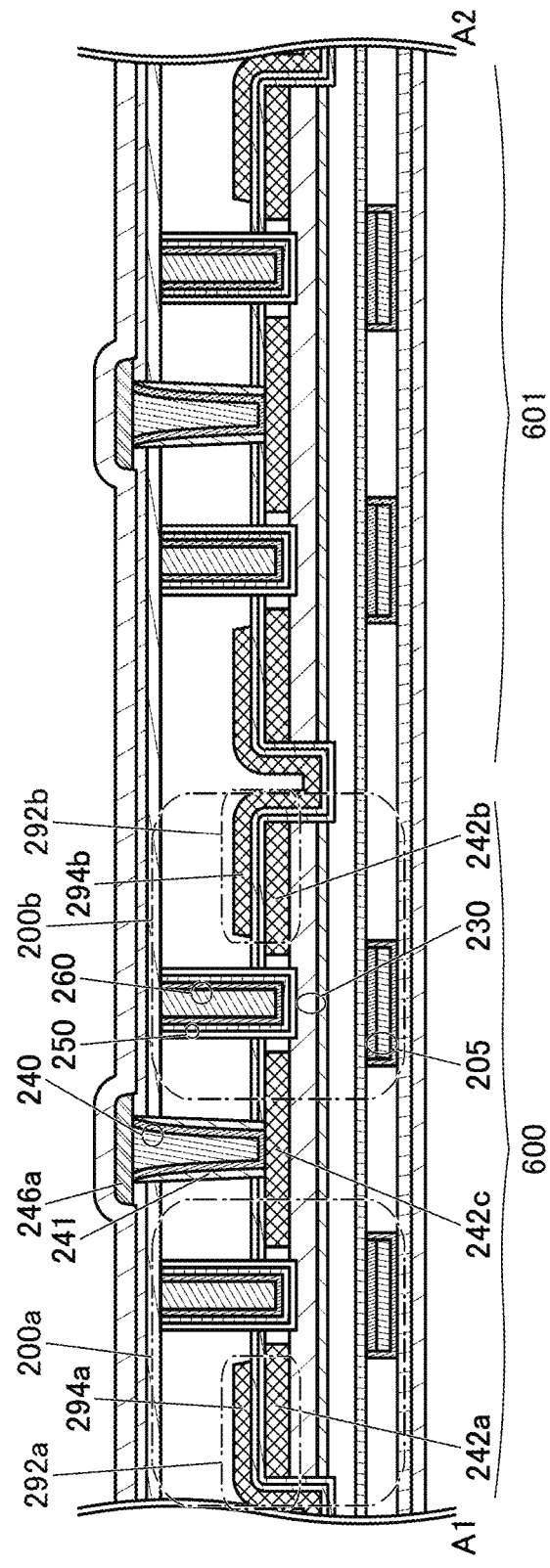

In the above description, the semiconductor device including the transistor 200a, the transistor 200b, the capacitor device 292a, and the capacitor device 292b is given as a structural example; however, the semiconductor device of this embodiment is not limited thereto. For example, as illustrated in FIG. 21B, a structure in which the semiconductor device 600 and a semiconductor device having a structure similar to that of the semiconductor device 600 are connected through a capacitor portion may be employed. In this specification, the semiconductor device including the transistor 200a, the transistor 200b, the capacitor device 292a, and the capacitor device 292b is referred to as a cell. The above descriptions of the transistor 200a, the transistor 200b, the capacitor device 292a, and the capacitor device 292b can be referred to for the structures of the transistor 200a, the transistor 200b, the capacitor device 292a, and the capacitor device 292b.

FIG. 21B is a cross-sectional view in which the semiconductor device 600 including the transistor 200a, the transistor 200b, the capacitor device 292a, and the capacitor device 292b is connected to a cell having a structure similar to that of the semiconductor device 600 through a capacitor portion.

As illustrated in FIG. 21B, the conductor 294b functioning as one electrode of the capacitor device 292b included in the semiconductor device 600 also serves as one electrode of a capacitor device included in a semiconductor device 601 having a structure similar to that of the semiconductor device 600. Although not illustrated, the conductor 294a functioning as one electrode of the capacitor device 292a included in the semiconductor device 600 also serves as one electrode of a capacitor device included in a semiconductor device on the left side of the semiconductor device 600, that is, a semiconductor device adjacent to the semiconductor device 600 in the A1 direction in FIG. 21B. The cell on the right side of the semiconductor device 601, that is, the cell in the A2 direction in FIG. 21B has a similar structure. That is, a cell array (also referred to as a memory device layer) can be formed. With this structure of the cell array, the space between the adjacent cells can be reduced; thus, the projected area of the cell array can be reduced and high integration can be achieved. When the cells illustrated in FIG. 21B are arranged in a matrix, a matrix-shape cell array can be formed.

When the transistor 200a, the transistor 200b, the capacitor device 292a, and the capacitor device 292b are formed to have the structures described in this embodiment as described above, the area of the cell can be reduced and the semiconductor device including a cell array can be miniaturized or highly integrated.

Figure 22:
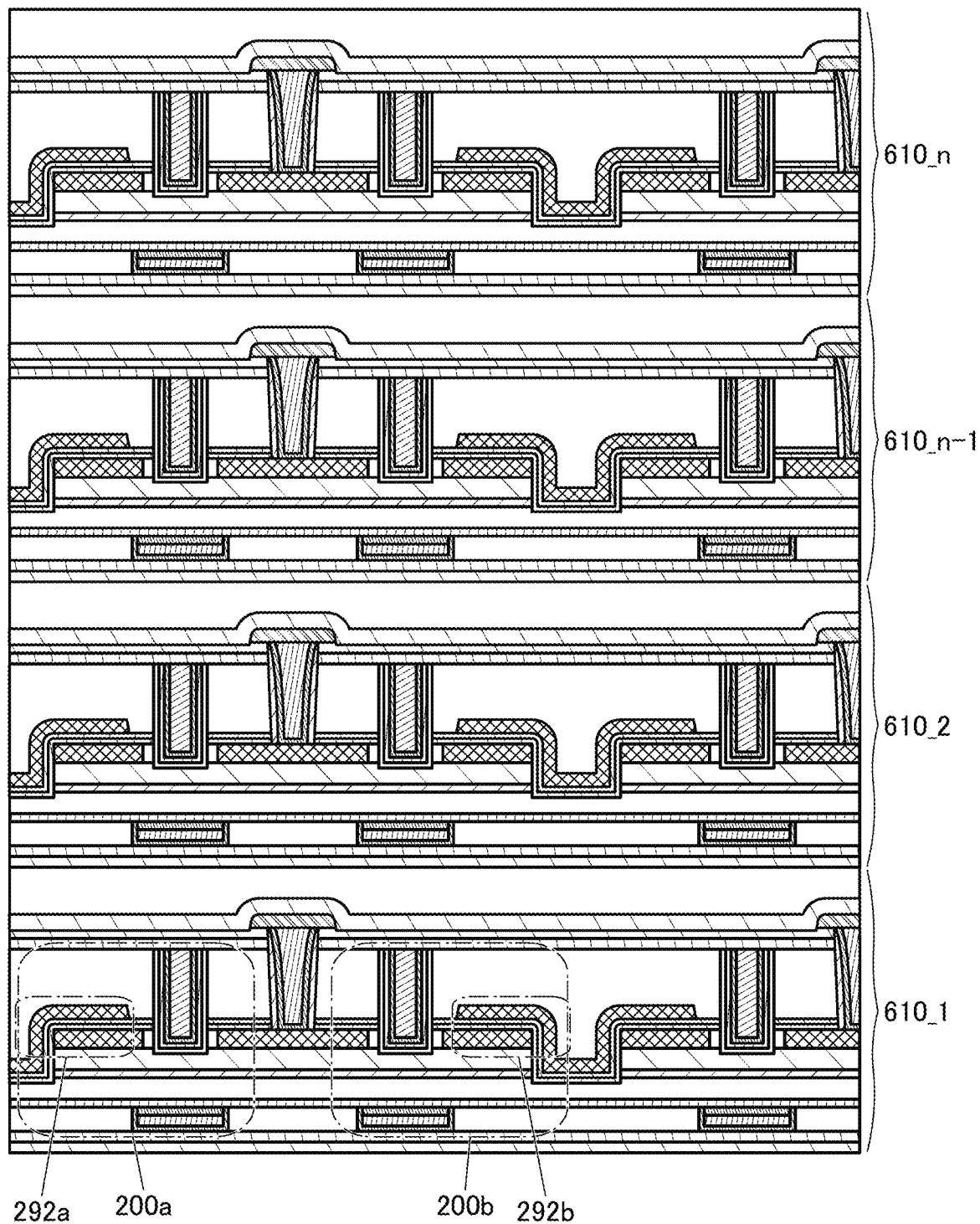
FIG. 22 is a cross-sectional view of a semiconductor device of one embodiment of the present invention.

Furthermore, the cell array may have a stacked-layer structure instead of a single-layer structure. FIG. 22 is a cross-sectional view of n layers of cell arrays that are stacked. When a plurality of cell arrays (a cell array 610_1 to a cell array 610_n) are stacked as illustrated in FIG. 22, cells can be integrally provided without increasing the area occupied by the cell arrays. In other words, a 3D cell array can be formed.

Modification Example 3 of Memory Device

Figure 23:
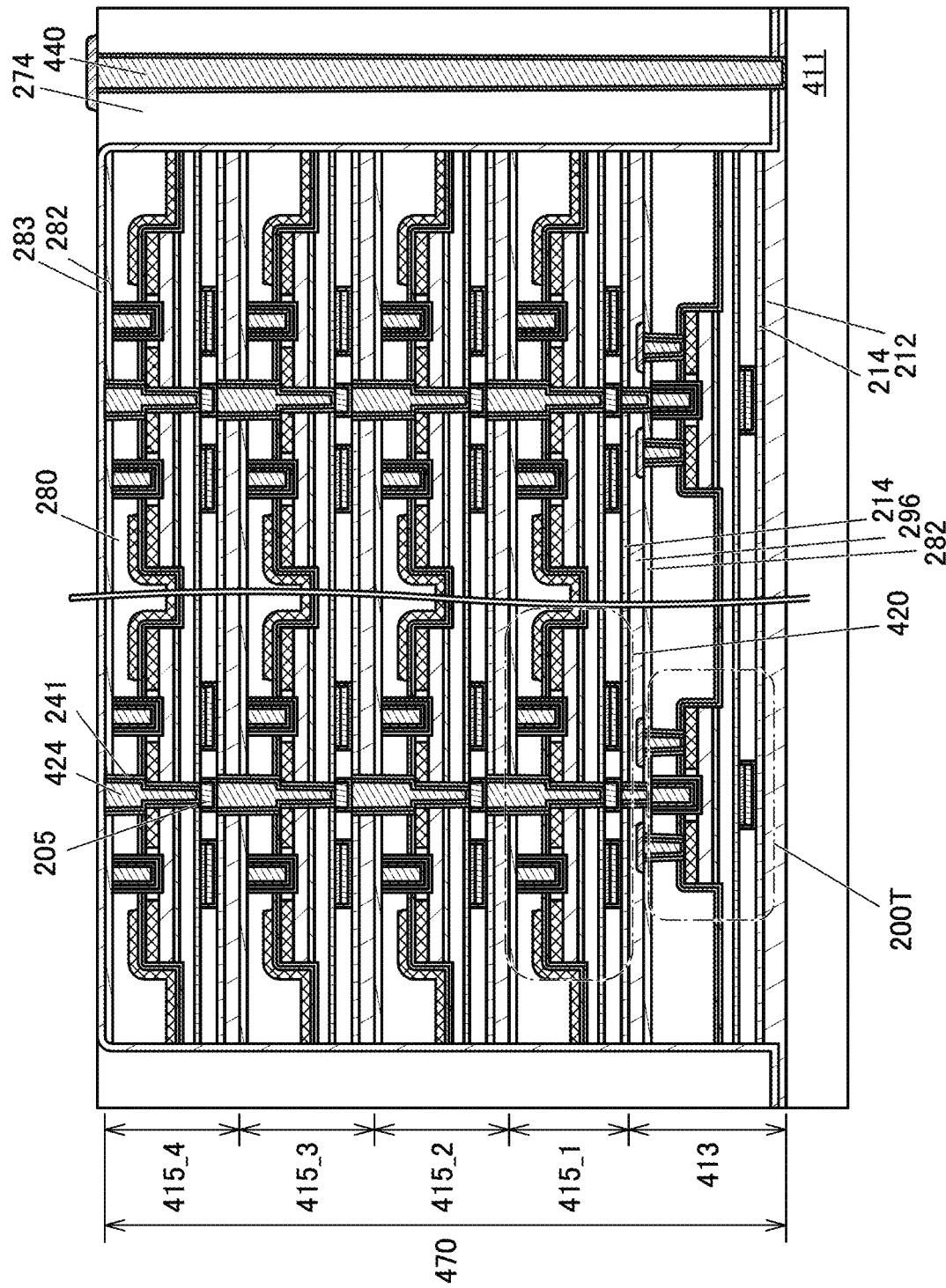
FIG. 23 is a cross-sectional view of a semiconductor device of one embodiment of the present invention.

FIG. 23 illustrates an example in which a memory unit 470 includes a transistor layer 413 including a transistor 200T and four memory device layers (a memory device layer 415_1 to a memory device layer 415_4).

The memory device layer 415_1 to the memory device layer 415_4 each include a plurality of memory devices 420.

The memory device 420 is electrically connected to the memory device 420 included in a different memory device layer and the transistor 200T included in the transistor layer 413 through a conductor 424 and the conductor 205.

The memory unit 470 is sealed with the insulator 212, the insulator 214, the insulator 282, and the insulator 283 (such a structure is referred to as a sealing structure below for convenience). The insulator 274 is provided in the periphery of the insulator 283. A conductor 440 is provided in the insulator 274, the insulator 283, and the insulator 212, and is electrically connected to an element layer 411.

The insulator 280 is provided inside the sealing structure. The insulator 280 has a function of releasing oxygen by heating. Alternatively, the insulator 280 includes an excess-oxygen region.

The insulator 212 and the insulator 283 are suitably formed using a material that has a high blocking property against hydrogen. The insulator 214 and the insulator 282 are preferably a material that has a function of trapping or fixing hydrogen.

Examples of the material that has a high blocking property against hydrogen include silicon nitride and silicon nitride oxide. Examples of the material that has a function of trapping or fixing hydrogen include aluminum oxide, hafnium oxide, and an oxide containing aluminum and hafnium (hafnium aluminate).

There is no particular limitation on the crystal structure of materials used for the insulator 212, the insulator 214, the insulator 282, and the insulator 283; the materials can have an amorphous or crystalline structure. For example, it is preferable to use an amorphous aluminum oxide film as the material that has a function of trapping or fixing hydrogen. Amorphous aluminum oxide may trap or fix hydrogen more than aluminum oxide with high crystallinity.

The insulator 282 and the insulator 214 are preferably provided between the transistor layer 413 and the memory device layer 415_1 or between the memory device layers. An insulator 296 is preferably provided between the insulator 282 and the insulator 214. A material similar to that for the insulator 283 can be used for the insulator 296. Alternatively, silicon oxide or silicon oxynitride can be used. Alternatively, a known insulating material may be used.

Here, the following model can be given as the model of excess oxygen in the insulator 280 with respect to the diffusion of hydrogen from an oxide semiconductor in contact with the insulator 280.

Hydrogen in the oxide semiconductor diffuses into other components through the insulator 280 in contact with the oxide semiconductor. The hydrogen forms an OH bond with excess oxygen in the insulator 280 and diffuses in the insulator 280 as OH. When reaching a material having a function of trapping or fixing hydrogen (typically, the insulator 282), the hydrogen atom having the OH bond reacts with an oxygen atom bonded to an atom (e.g., a metal atom) in the insulator 282 and is trapped or fixed in the insulator 282. Meanwhile, the excess oxygen having the OH bond probably remains as excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher in an atmosphere containing oxygen, an atmosphere containing nitrogen, or a mixed atmosphere of oxygen and nitrogen. The heat treatment is performed for one hour or longer, preferably four hours or longer, further preferably eight hours or longer.

The heat treatment enables hydrogen in the oxide semiconductor to diffuse to the outside through the insulator 280 and the insulator 282. That is, the absolute amount of hydrogen in and near the oxide semiconductor can be reduced.

The insulator 283 is formed after the heat treatment. The insulator 283 is formed using a material having a high blocking property against hydrogen, and thus can inhibit the entry of hydrogen that has been diffused outward or external hydrogen into the inside, specifically, to the oxide semiconductor side or the insulator 280 side.

An example where the heat treatment is performed after the insulator 282 is formed is described; however, one embodiment of the present invention is not limited thereto. For example, the heat treatment may be performed after the formation of the transistor layer 413 or after the formation of the memory device layer 415_1 to the memory device layer 415_3. When hydrogen is diffused outward by the heat treatment, hydrogen is diffused in the upward direction or the lateral direction of the transistor layer 413. Similarly, in the case where heat treatment is performed after the formation of the memory device layer 415_1 to the memory device layer 415_3, hydrogen is diffused upward or in the lateral direction.

With the above manufacturing process, the sealing structure mentioned above can be formed by bonding the insulator 212 and the insulator 283.

The above-described structure and the above-described manufacturing process enable a semiconductor device using an oxide semiconductor with reduced hydrogen concentration to be provided. Accordingly, a semiconductor device with high reliability can be provided. According to another embodiment of the present invention, a semiconductor device with favorable electrical characteristics can be provided.

The structure, method, and the like described in this embodiment can be used in an appropriate combination with other structures, methods, and the like described in this embodiment or the other embodiments.

Embodiment 3

In this embodiment, a storage device of one embodiment of the present invention including a transistor in which an oxide is used for a semiconductor (hereinafter sometimes referred to as an OS transistor) and a capacitor (hereinafter sometimes referred to as an OS memory device) will be described with reference to FIG. 24A, FIG. 24B and FIG. 25A to FIG. 25H. The OS memory device is a storage device including at least a capacitor and an OS transistor that controls the charging and discharging of the capacitor. Since the OS transistor has an extremely low off-state current, the OS memory device has excellent retention characteristics and can function as a nonvolatile memory.

<Structure Example of Storage Device>

Figure 24A:
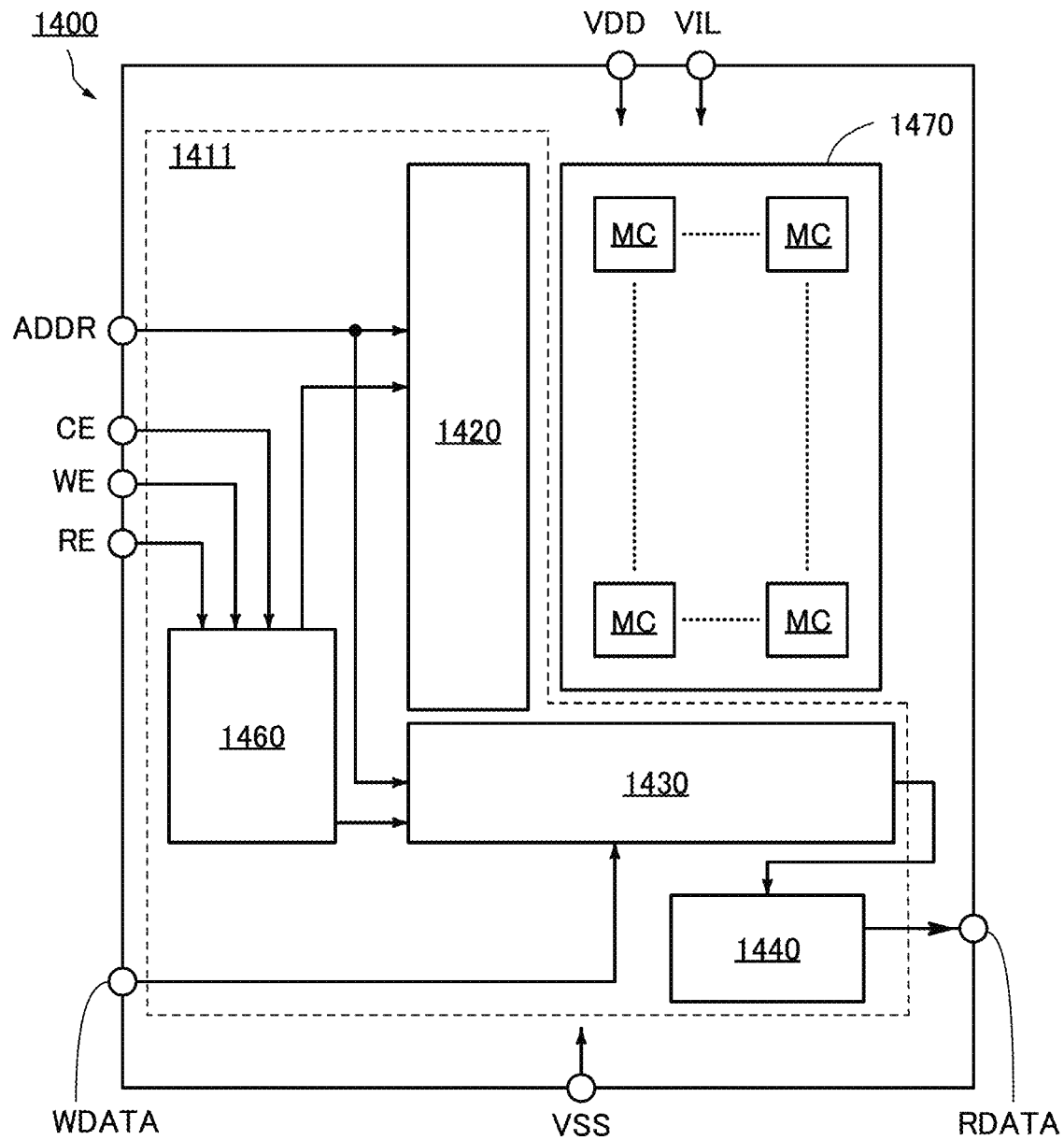
FIG. 24A is a block diagram illustrating a structure example of a storage device of one embodiment of the present invention.

FIG. 24A illustrates a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, and a write circuit. The precharge circuit has a function of precharging wirings. The sense amplifier has a function of amplifying a data signal read from a memory cell. Note that the wirings are connected to memory cells included in the memory cell array 1470 and will be described later in detail. The amplified data signal is output as a data signal RDATA to the outside of the storage device 1400 through the output circuit 1440. The row circuit 1420 includes, for example, a row decoder and a word line driver circuit and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in one column, and the like. The number of wirings that connect the memory cell array 1470 to the column circuit 1430 depends on the structure of the memory cell MC, the number of memory cells MC in one row, and the like.

Figure 24B:
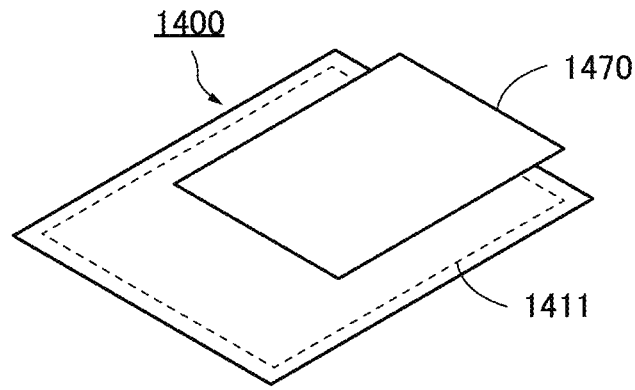
FIG. 24B is a schematic diagram illustrating a structure example of the storage device of one embodiment of the present invention.

Note that FIG. 24A illustrates an example in which the peripheral circuit 1411 and the memory cell array 1470 are formed on the same plane; however, this embodiment is not limited thereto. For example, as illustrated in FIG. 24B, the memory cell array 1470 may be provided to overlap part of the peripheral circuit 1411. For example, the sense amplifier may be provided below the memory cell array 1470 so that they overlap each other.

FIG. 25A to FIG. 25H illustrate structure examples of memory cells that can be applied to the memory cell MC.

[DOSRAM]

Figure 25A:
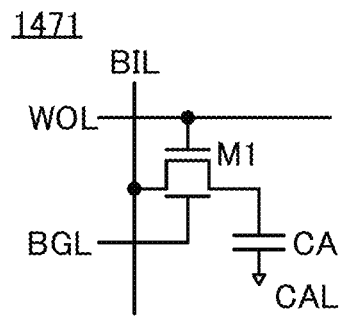
FIG. 25A to FIG. 25H are circuit diagrams illustrating structure examples of storage devices of one embodiment of the present invention.
Figure 25B:
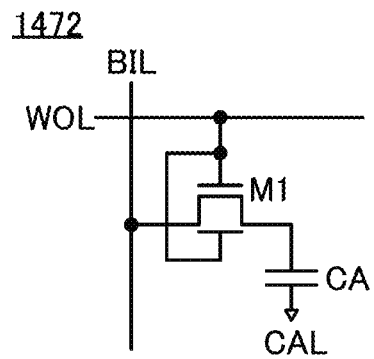
Figure 25C:
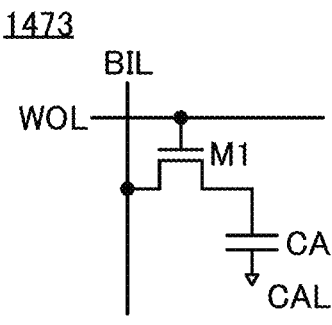

FIG. 25A to FIG. 25C each illustrate a circuit structure example of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 25A includes a transistor M1 and a capacitor CA. Note that the transistor M1 includes a gate (also sometimes referred to as a top gate) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 25A corresponds to the storage device illustrated in FIG. 20. That is, the transistor M1 and the capacitor CA correspond to the transistor 200 and the capacitor device 292, respectively.

The memory cell MC is not limited to the memory cell 1471, and the circuit structure can be changed. For example, as in a memory cell 1472 illustrated in FIG. 25B, the back gate of the transistor M1 may be connected not to the wiring BGL but to the wiring WOL in the memory cell MC. As another example of the memory cell MC, the transistor M1 may be a single-gate transistor, that is, a transistor without a back gate, as in a memory cell 1473 illustrated in FIG. 25C.

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be reduced. Alternatively, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap each other as described above, the bit line can be shortened. This reduces bit line capacitance, which can reduce the storage capacitance of the memory cell.

[NOSRAM]

FIG. 25D to FIG. 25G illustrate circuit structure examples of gain-cell memory cells each including two transistors and one capacitor. A memory cell 1474 illustrated in FIG. 25D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 25D:
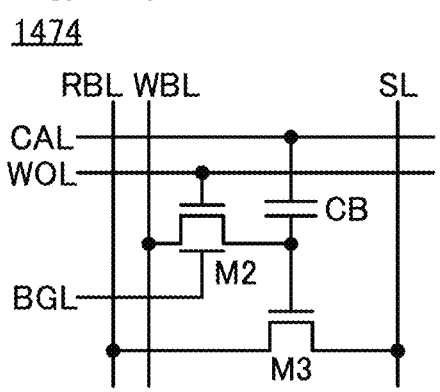
Figure 25E:
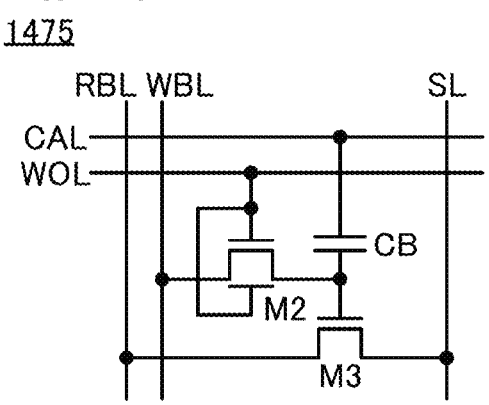
Figure 25F:
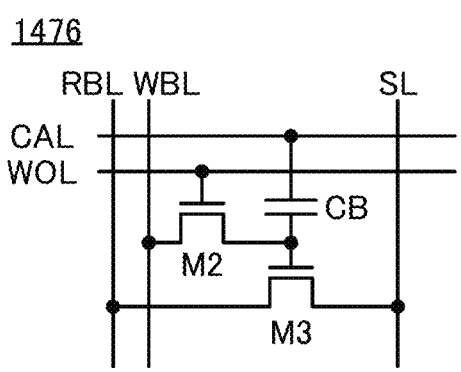
Figure 25G:
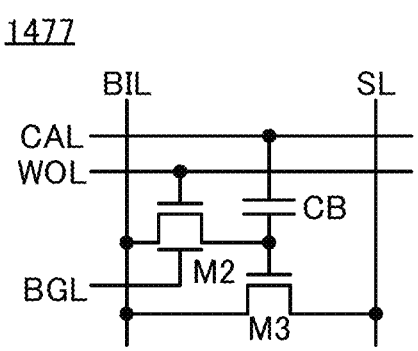

Here, the memory cell 1474 illustrated in FIG. 25D corresponds to the storage device illustrated in FIG. 18. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The memory cell MC is not limited to the memory cell 1474, and the circuit structure can be changed as appropriate. For example, as in a memory cell 1475 illustrated in FIG. 25E, the back gate of the transistor M2 may be connected not to the wiring BGL but to the wiring WOL in the memory cell MC. As another example of the memory cell MC, the transistor M2 may be a single-gate transistor, that is, a transistor without a back gate, as in a memory cell 1476 illustrated in FIG. 25F. As another example of the memory cell MC, the wiring WBL and the wiring RBL may be combined into one wiring BIL, as in a memory cell 1477 illustrated in FIG. 25G.

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the use of the transistor M2; thus, the frequency of refresh of the memory cell can be reduced. Alternatively, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced, leading to high integration of the storage device.

Alternatively, the transistor M3 may be an OS transistor. When OS transistors are used as the transistor M2 and the transistor M3, the circuit of the memory cell array 1470 can be formed using only n-channel transistors.

Figure 25H:
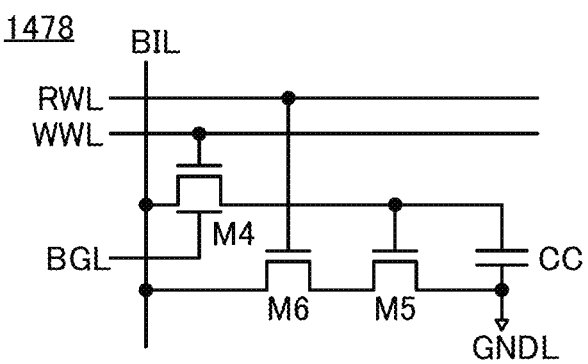

FIG. 25H illustrates an example of a gain-cell memory cell including three transistors and one capacitor. A memory cell 1478 illustrated in FIG. 25H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

Figure 26:
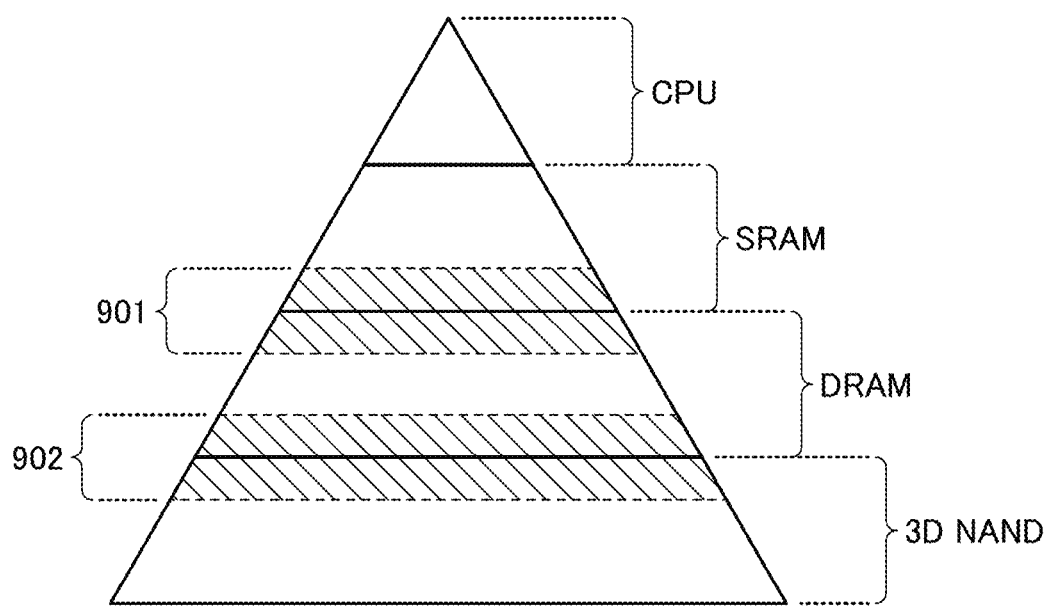
FIG. 26 is a diagram illustrating a hierarchy of a variety of storage devices.

In general, a variety of storage devices (memories) are used in semiconductor devices such as computers in accordance with the intended use. FIG. 26 shows a hierarchy of a variety of storage devices. The storage devices at the upper levels require a higher access speed, and the storage devices at the lower levels require a larger memory capacity and a higher memory density. In FIG. 26, sequentially from the top level, a memory included as a register in an arithmetic processing device such as a CPU, an SRAM (Static Random Access Memory), a DRAM (Dynamic Random Access Memory), and a 3D NAND memory are illustrated.

A memory included as a register in an arithmetic processing device such as a CPU is used for temporary storage of arithmetic operation results, for example, and thus is very frequently accessed by the arithmetic processing device. Accordingly, a high operating speed is required rather than memory capacity. The register also has a function of retaining setting information of the arithmetic processing device, for example.

An SRAM is used for a cache, for example. The cache has a function of retaining a copy of part of data retained in a main memory. By copying data that is frequently used and holding the copy of the data in the cache, the access speed to the data can be increased.

A DRAM is used for the main memory, for example. The main memory has a function of retaining a program or data that is read from a storage. The memory density of a DRAM is approximately 0.1 to 0.3 Gbit/mm$^2$.

A 3D NAND memory is used for a storage, for example. The storage has a function of retaining data that needs to be retained for a long time and various programs used in an arithmetic processing device, for example. Therefore, the storage needs to have a large memory capacity and a high memory density rather than operating speed. The memory density of a storage device used for a storage is approximately 0.6 to 6.0 Gbit/mm$^2$.

The storage device of one embodiment of the present invention operates fast and can retain data for a long time. The storage device of one embodiment of the present invention can be favorably used as a storage device in a boundary region 901 including both the level in which a cache is placed and the level in which a main memory is placed. Moreover, the storage device of one embodiment of the present invention can be favorably used as a storage device in a boundary region 902 including both the level in which a main memory is placed and the level in which a storage is placed.

The structure described in this embodiment can be used in an appropriate combination with the structures described in the other embodiments and the like.

Embodiment 4

In this embodiment, an example of a chip 1200 on which the semiconductor device of the present invention is mounted will be described with reference to FIG. 27A and FIG. 27B. A plurality of circuits (systems) are mounted on the chip 1200. A technique for integrating a plurality of circuits (systems) into one chip is referred to as system on chip (SoC) in some cases.

Figure 27A:
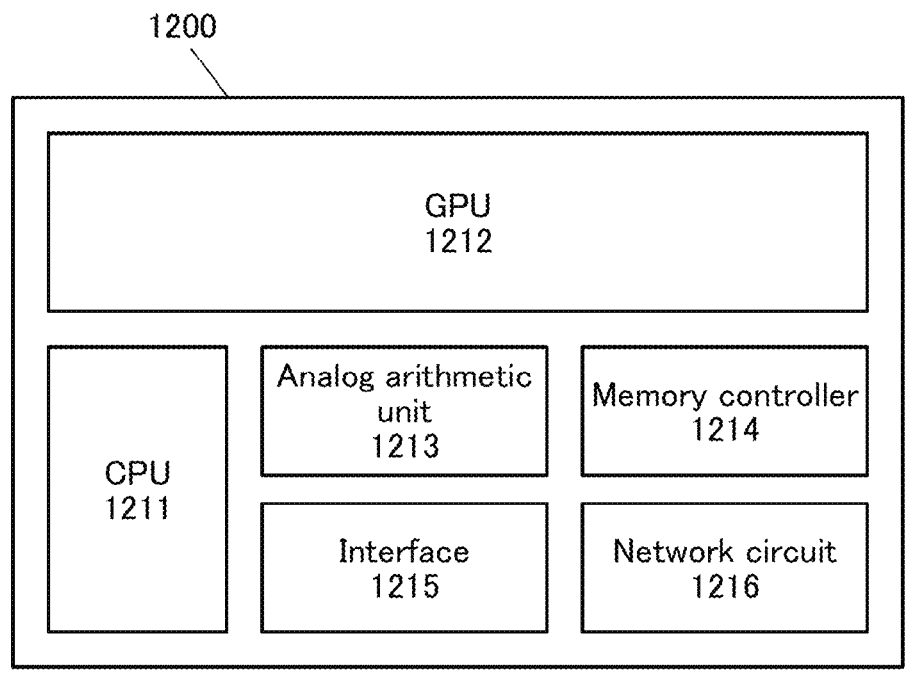
FIG. 27A is a block diagram of a semiconductor device of one embodiment of the present invention.

As illustrated in FIG. 27A, the chip 1200 includes a CPU 1211, a GPU 1212, one or more of analog arithmetic units 1213, one or more of memory controllers 1214, one or more of interfaces 1215, one or more of network circuits 1216, and the like.

Figure 27B:
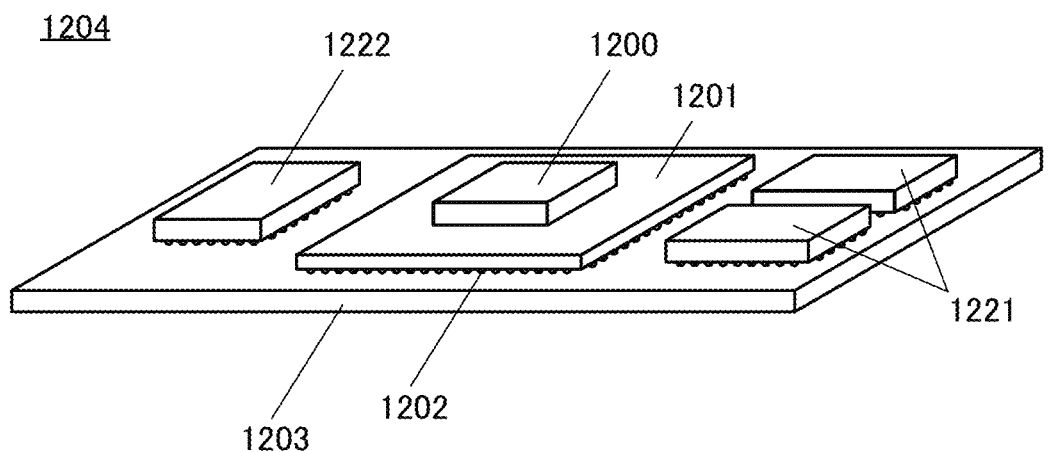
FIG. 27B is a schematic diagram of the semiconductor device of one embodiment of the present invention.

A bump (not illustrated) is provided on the chip 1200 and is connected to a first surface of a printed circuit board (PCB) 1201 as illustrated in FIG. 27B. A plurality of bumps 1202 are provided on a rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing and product-sum operation. When an image processing circuit and a product-sum operation circuit that use an oxide semiconductor of the present invention are provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a gaming controller. As such an interface, a USB (Universal Serial Bus), an HDMI (registered trademark) (High-Definition Multimedia Interface), or the like can be used.

The network circuit 1216 includes a circuit for a network such as a LAN (Local Area Network). The network circuit 1216 may also include a circuit for network security.

The circuits (systems) can be formed in the chip 1200 through the same manufacturing process. Therefore, even when the number of circuits needed for the chip 1200 is increased, there is no need to increase the number of steps in the manufacturing process; thus, the chip 1200 can be manufactured at low costs.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using SoC technology and thus can be small in size. In addition, the GPU module 1204 is excellent in image processing and thus is suitably used in a portable electronic appliance such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 5

In this embodiment, examples of electronic components and an electronic appliance that include the storage device or the like described in the above embodiment will be described.

<Electronic Component>

First, examples of electronic components in which a storage device 720 is incorporated will be described with reference to FIG. 28A and FIG. 28B.

Figure 28A:
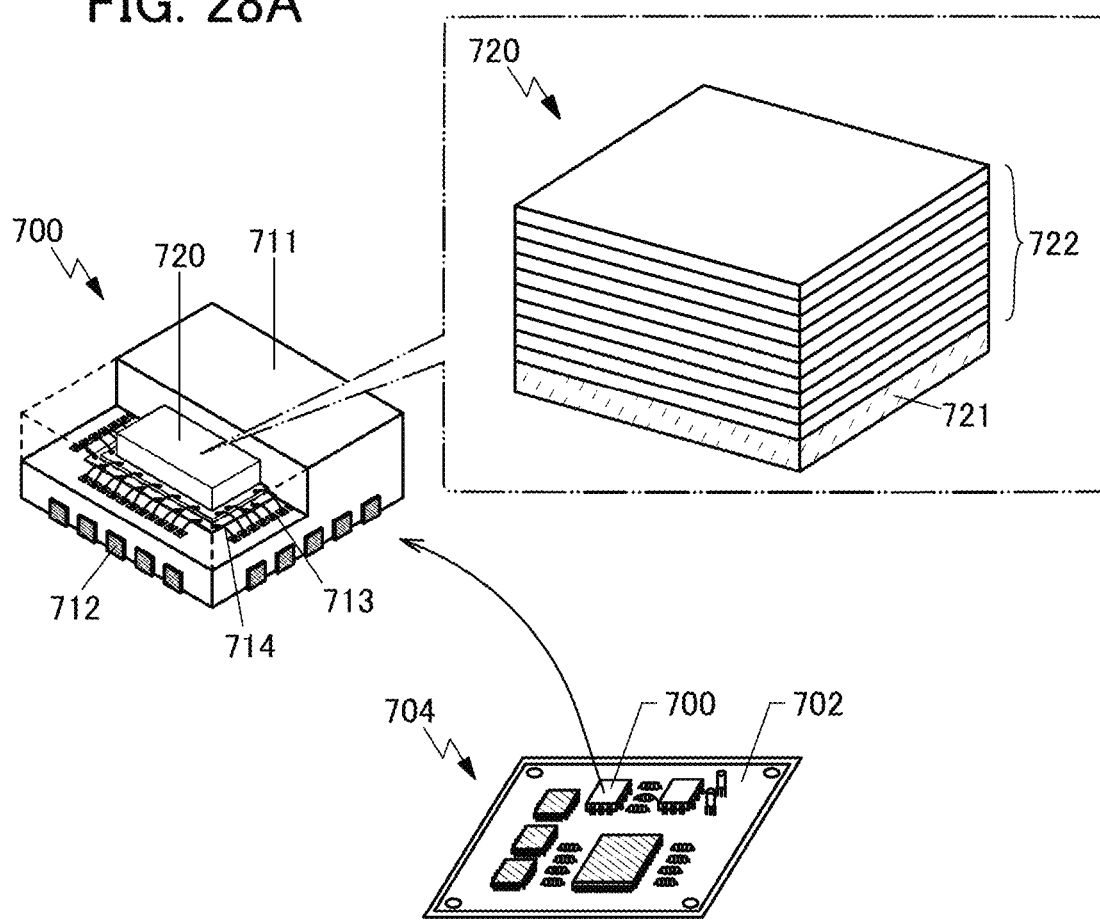
FIG. 28A and FIG. 28B are diagrams illustrating examples of electronic components.

FIG. 28A is a perspective view of an electronic component 700 and a substrate (a circuit board 704) on which the electronic component 700 is mounted. The electronic component 700 illustrated in FIG. 28A includes the storage device 720 in a mold 711. To illustrate the inside of the electronic component 700, some portions are omitted in FIG. 28A. The electronic component 700 includes a land 712 outside the mold 711. The land 712 is electrically connected to an electrode pad 713, and the electrode pad 713 is electrically connected to the storage device 720 with a wire 714. The electronic component 700 is mounted on a printed circuit board 702, for example. A plurality of such electronic components are combined and electrically connected to each other on the printed circuit board 702, whereby the circuit board 704 is completed.

The storage device 720 includes a driver circuit layer 721 and a storage circuit layer 722.

Figure 28B:
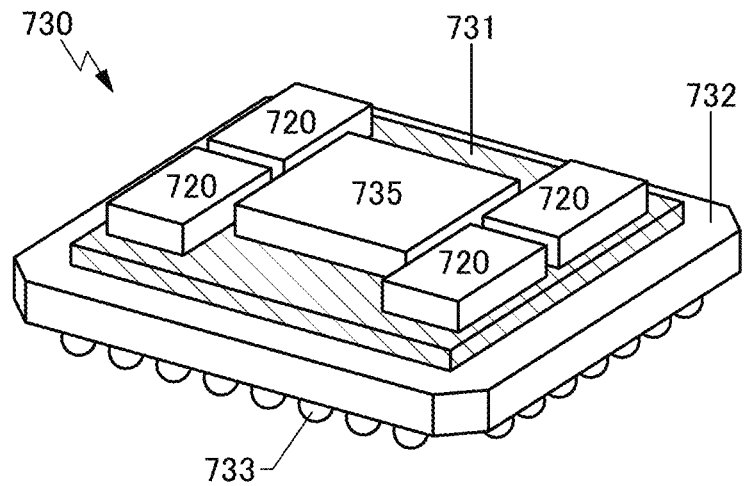

FIG. 28B is a perspective view of an electronic component 730. The electronic component 730 is an example of a SiP (System in package) or an MCM (Multi Chip Module). In the electronic component 730, an interposer 731 is provided over a package substrate 732 (printed circuit board), and a semiconductor device 735 and a plurality of storage devices 720 are provided over the interposer 731.

The electronic component 730 using the storage device 720 as a high bandwidth memory (HBM) is illustrated as an example. An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided over the interposer 731 to an electrode provided over the package substrate 732. Accordingly, the interposer is referred to as a "redistribution substrate" or an "intermediate substrate" in some cases. A through electrode may be provided in the interposer 731 to be used for electrically connecting the integrated circuit and the package substrate 732. In the case of using a silicon interposer, a TSV (Through Silicon Via) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in the coefficient of expansion between an integrated circuit and the interposer is less likely to occur. Furthermore, a surface of a silicon interposer has high planarity; hence, a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (radiator plate) may be provided to overlap the electronic component 730. In the case of providing a heat sink, the heights of integrated circuits provided on the interposer 731 are preferably equal to each other. For example, in the electronic component 730 of this embodiment, the heights of the storage devices 720 and the semiconductor device 735 are preferably equal to each other.

An electrode 733 may be provided on the bottom portion of the package substrate 732 to mount the electronic component 730 on another substrate. FIG. 28B illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate in various mounting methods, not limited to the BGA and the PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in an appropriate combination with the structures described in the other embodiments and the like.

Embodiment 6

In this embodiment, application examples of storage devices using the semiconductor device described in the above embodiment will be described. The semiconductor device described in the above embodiment can be applied to, for example, storage devices of a variety of electronic appliances (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 29A to FIG. 29E schematically illustrate some structure examples of removable storage devices. The semiconductor device described in the above embodiment is processed into a packaged memory chip and used in a variety of storage devices and removable memories, for example.

FIG. 29A is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 29B is a schematic external diagram of an SD card, and FIG. 29C is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on a back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The semiconductor device described in the above embodiment can be incorporated in the memory chip 1114 or the like.

FIG. 29D is a schematic external diagram of an SSD, and FIG. 29E is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments and the like.

Embodiment 7

The semiconductor device of one embodiment of the present invention can be used in a processor such as a CPU and a GPU or a chip. FIG. 30A to FIG. 30H illustrate specific examples of electronic appliances including a chip or a processor such as a CPU or a GPU of one embodiment of the present invention.

<Electronic Appliance and System>

The GPU or the chip of one embodiment of the present invention can be mounted on a variety of electronic appliances. Examples of electronic appliances include a digital camera, a digital video camera, a digital photo frame, an e-book reader, a mobile phone, a portable game machine, a portable information terminal, and an audio reproducing device in addition to electronic appliances provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic appliance, the electronic appliance can include artificial intelligence.

The electronic appliance of one embodiment of the present invention may include an antenna. When a signal is received by the antenna, a video, data, or the like can be displayed on a display portion. When the electronic appliance includes the antenna and a secondary battery, the antenna may be used for contactless power transmission.

The electronic appliance of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic appliance of one embodiment of the present invention can have a variety of functions. For example, the electronic appliance can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIG. 30A to FIG. 30H illustrate examples of electronic appliances.

[Information Terminal]

Figure 30A:
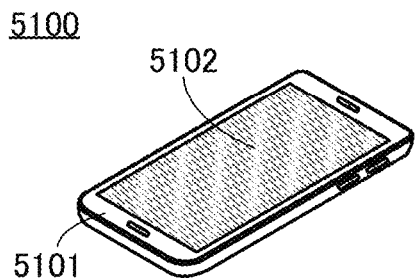
FIG. 30A to FIG. 30H are diagrams illustrating electronic appliances of one embodiment of the present invention.

FIG. 30A illustrates a mobile phone (smartphone) which is a type of an information terminal. An information terminal 5100 includes a housing 5101 and a display portion 5102. As input interfaces, a touch panel is provided in the display portion 5102, and a button is provided in the housing 5101.

When the chip of one embodiment of the present invention is used in the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 30B:
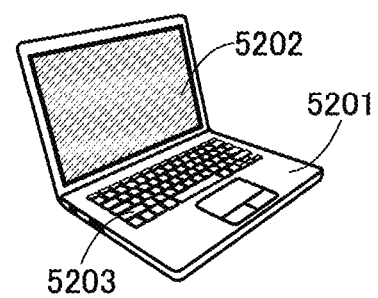

FIG. 30B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is used in the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 30A and FIG. 30B as examples of the electronic appliance, an information terminal other than the smartphone and the notebook information terminal can be used. Examples of information terminals other than a smartphone and a notebook information terminal include a PDA (Personal Digital Assistant), a desktop information terminal, and a workstation.

[Game Machines]

Figure 30C:
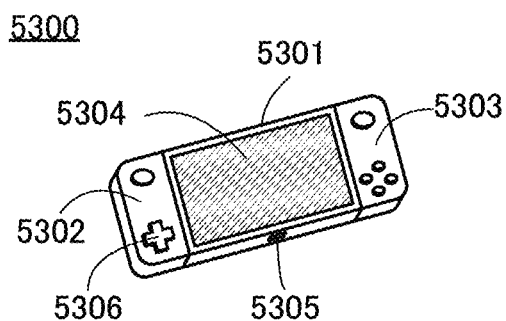

FIG. 30C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302 and the housing 5303, for example.

Figure 30D:
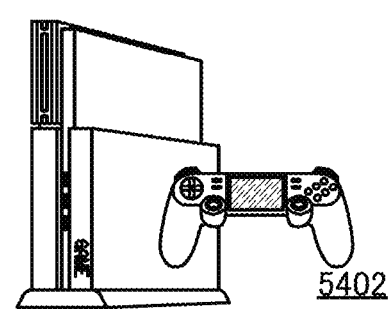

FIG. 30D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is used in the portable game machine 5300, the portable game machine 5300 including artificial intelligence can be achieved.

In general, the progress of a game, the actions and words of game characters, and expressions of a phenomenon in the game are programed in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 30C and FIG. 30D, the game machine using the GPU or the chip of one embodiment of the present invention is not limited thereto. Examples of the game machine to which the GPU or the chip of one embodiment of the present invention is applied include arcade game machines installed in entertainment facilities (e.g., a game center and an amusement park) and throwing machines for batting practice installed in sports facilities.

[Large Computer]

The GPU or the chip of one embodiment of the present invention can be used in a large computer.

Figure 30E:
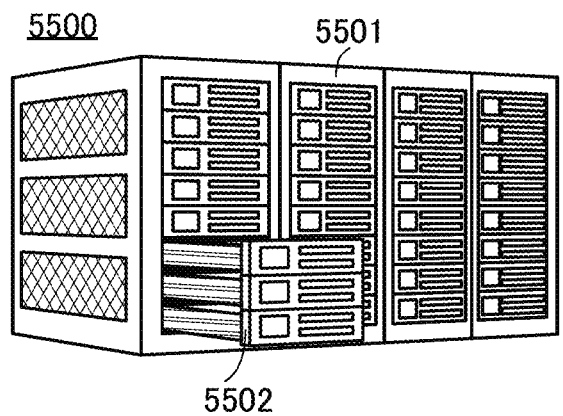
Figure 30F:
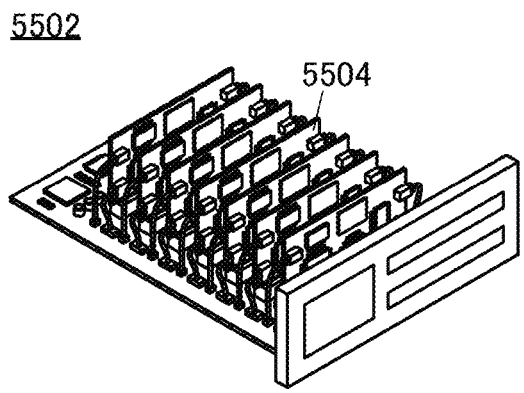

FIG. 30E illustrates a supercomputer 5500 as an example of a large computer. FIG. 30F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 30E and FIG. 30F, a large computer using the GPU or the chip of one embodiment of the present invention is not limited thereto. Examples of a large computer using the GPU or the chip of one embodiment of the present invention include a computer that provides service (server) and a large general-purpose computer (mainframe).

[Moving Vehicle]

The GPU or the chip of one embodiment of the present invention can be used in an automobile, which is a moving vehicle, and around a driver's seat in the automobile.

Figure 30G:
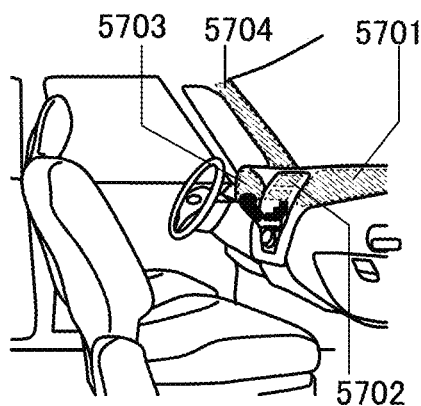

FIG. 30G illustrates an area around a windshield inside an automobile, which is an example of a moving vehicle. FIG. 30G illustrates a display panel 5701, a display panel 5702, and a display panel 5703 that are attached to a dashboard and a display panel 5704 that is attached to a pillar.

The display panel 5701 to the display panel 5703 can provide a variety of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used in these moving vehicles.

[Household Appliance]

Figure 30H:
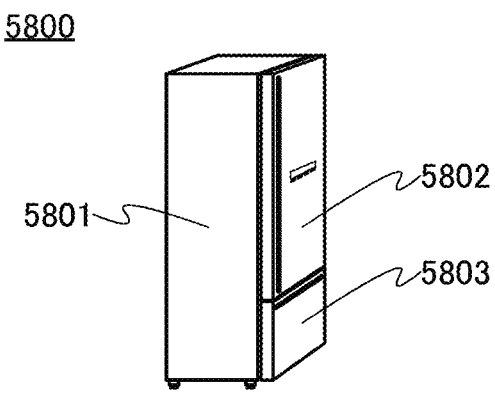

FIG. 30H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, examples of other household appliances include a vacuum cleaner, a microwave oven, an electronic oven, a rice cooker, a water heater, an IH cooker, a water server, a heating-cooling combination appliance such as an air conditioner, a washing machine, a drying machine, and an audio visual appliance.

The electronic appliances, the functions of the electronic appliances, the application examples of artificial intelligence, their effects, and the like described in this embodiment can be combined as appropriate with the description of another electronic appliance.

This embodiment can be implemented in an appropriate combination with the structures described in the other embodiments and the like.

REFERENCE NUMERALS

100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200_n: transistor, 200_1: transistor, 200a: transistor, 200b: transistor, 200T: transistor, 205: conductor, 205a: conductor, 205b: conductor, 205c: conductor, 210: insulator, 212: insulator, 214: insulator, 216: insulator, 217: insulator, 218: conductor, 222: insulator, 224: insulator, 230: oxide, 230a: oxide, 230A: oxide film, 230b: oxide, 230B: oxide film, 230c: oxide, 230d: oxide, 236: region, 237a: region, 237b: region, 238a: region, 238b: region, 240: conductor, 240a: conductor, 240b: conductor, 241: insulator, 241a: insulator, 241b: insulator, 242a: conductor, 242A: conductive film, 242b: conductor, 242B: conductive layer, 242c: conductor, 243a: oxide, 243b: oxide, 245A: insulating film, 245B: insulating layer, 246a: conductor, 246b: conductor, 250: insulator, 250a: insulator, 250A: insulating film, 250b: insulator, 250B: insulating film, 260: conductor, 260a: conductor, 260A: conductive film, 260b: conductor, 260B: conductive film, 265: sealing portion, 265a: sealing portion, 265b: sealing portion, 271a: insulator, 271b: insulator, 272a: oxide, 272b: oxide, 274: insulator, 275: insulator, 275a: insulator, 275b: insulator, 280: insulator, 282: insulator, 283: insulator, 284: insulator, 286: insulator, 290: memory device, 290A: conductive film, 290B: conductive layer, 292: capacitor device, 292a: capacitor device, 292b: capacitor device, 293: insulator, 294: conductor, 294a: conductor, 294b: conductor, 296: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 415_1: memory device layer, 415_3: memory device layer, 415_4: memory device layer, 420: memory device, 424: conductor, 440: conductor, 470: memory unit, 600: semiconductor device, 601: semiconductor device, 610_n: cell array, 610_1: cell array, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door This application is based on Japanese Patent Application Serial No. 2019-171946 filed on Sep. 20, 2019, the entire contents of which are hereby incorporated herein by reference.

The invention claimed is:

1. A semiconductor device comprising:
   a first insulator;
   a first oxide over the first insulator;
   a second oxide over the first oxide;
   a first conductor functioning as one of a source electrode and a drain electrode, a second conductor functioning as the other of the source electrode and the drain electrode, a third oxide, a fourth oxide, and a second insulator over the second oxide;
   a third insulator over the first conductor, the second conductor, the third oxide, and the fourth oxide;
   a fourth insulator over the second insulator; and
   a third conductor over the fourth insulator, the third conductor functioning as a gate electrode,
   wherein the second insulator is positioned between the first conductor and the second conductor,
   wherein the third oxide is positioned between the first conductor and the second insulator,
   wherein the fourth oxide is positioned between the second conductor and the second insulator,
   wherein the second oxide comprises a first region, a second region, a third region, a fourth region, and a fifth region,
   wherein the first region comprises a region in contact with the first conductor,
   wherein the second region comprises a region in contact with the third oxide,
   wherein the third region comprises a region overlapping the third conductor,
   wherein the fourth region comprises a region in contact with the fourth oxide,
   wherein the fifth region comprises a region in contact with the second conductor,
   wherein a length of the second region between the first region and the third region is greater than or equal to 3 nm and less than or equal to 8 nm,
   wherein a length of the fourth region between the third region and the fifth region is greater than or equal to 3 nm and less than or equal to 8 nm, and
   wherein a length of the third region between the second region and the fourth region is greater than or equal to 5 nm and less than or equal to 40 nm.

2. The semiconductor device according to claim 1,
   wherein the first conductor and the second conductor each comprise tantalum, and
   wherein the third oxide and the fourth oxide each comprise tantalum and oxygen.

3. The semiconductor device according to claim 1,
   wherein the second insulator comprises silicon and oxygen, and
   wherein the fourth insulator comprises hafnium and oxygen.

4. The semiconductor device according to claim 1,
   wherein the second oxide comprises indium, gallium, and zinc.

5. The semiconductor device according to claim 1,
   wherein the first oxide and the second oxide are patterned into an island shape.

6. The semiconductor device according to claim 1,
   wherein a carrier concentration of each of the second region and the fourth region is higher than a carrier concentration of the third region, and
   wherein carrier concentrations of the first region and the fifth region are respectively higher than carrier concentrations of the second region and the fourth region.

7. A semiconductor device comprising:
   a first insulator;
   a first oxide over the first insulator;
   a second oxide over the first oxide;
   a first conductor functioning as one of a source electrode and a drain electrode, a second conductor functioning as the other of the source electrode and the drain electrode, a third oxide, a fourth oxide, and a second insulator over the second oxide;
   a third insulator over the first conductor, the second conductor, the third oxide, and the fourth oxide;
   a fourth insulator over the second insulator; and
   a third conductor over the fourth insulator, the third conductor functioning as a gate electrode,
   wherein the second insulator is positioned between the first conductor and the second conductor,
   wherein the third oxide is positioned between the first conductor and the second insulator,
   wherein the fourth oxide is positioned between the second conductor and the second insulator,
   wherein a length of the third oxide between the first conductor and the second insulator is greater than or equal to 3 nm and less than or equal to 8 nm,
   wherein a length of the fourth oxide between the second conductor and the second insulator is greater than or equal to 3 nm and less than or equal to 8 nm, and
   wherein a length of a bottom surface of the third conductor in a region overlapping the second oxide is greater than or equal to 5 nm and less than or equal to 40 nm.

8. The semiconductor device according to claim 7,
   wherein the first conductor and the second conductor each comprise tantalum, and
   wherein the third oxide and the fourth oxide each comprise tantalum and oxygen.

9. The semiconductor device according to claim 7,
   wherein the second insulator comprises silicon and oxygen, and
   wherein the fourth insulator comprises hafnium and oxygen.

10. The semiconductor device according to claim 7,
    wherein the second oxide comprises indium, gallium, and zinc.

11. The semiconductor device according to claim 7,
    wherein the first oxide and the second oxide are patterned into an island shape.

* * * * *